(12) United States Patent
Chen et al.

(10) Patent No.: US 11,594,410 B2
(45) Date of Patent: Feb. 28, 2023

(54) TREATMENT FOR ADHESION IMPROVEMENT

(71) Applicant: Taiwan Semiconductor Manufacturing Co., Ltd., Hsinchu (TW)

(72) Inventors: Ching-Yi Chen, Hsinchu (TW); Wei-Yip Loh, Hsinchu (TW); Hung-Hsu Chen, Tainan (TW); Chih-Wei Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 103 days.

(21) Appl. No.: 17/001,179

(22) Filed: Aug. 24, 2020

(65) Prior Publication Data
US 2020/0388485 A1 Dec. 10, 2020

Related U.S. Application Data

(62) Division of application No. 16/178,244, filed on Nov. 1, 2018, now Pat. No. 10,755,917.

(Continued)

(51) Int. Cl.
*H01L 29/76* (2006.01)
*H01L 29/94* (2006.01)
(Continued)

(52) U.S. Cl.
CPC .. *H01L 21/02172* (2013.01); *H01L 21/02164* (2013.01); *H01L 21/02252* (2013.01);
(Continued)

(58) Field of Classification Search
CPC ......... H01L 21/02172; H01L 21/02164; H01L 21/02252; H01L 27/0886; H01L 29/41791; H01L 29/66795; H01L 29/7831; H01L 29/7848; H01L 29/7851; H01L 21/28518; H01L 21/02329; H01L 21/0234;
(Continued)

(56) References Cited

U.S. PATENT DOCUMENTS 8,772,109 B2   7/2014   Colinge
8,785,285 B2   7/2014   Tsai et al.
(Continued)

FOREIGN PATENT DOCUMENTS

KR   20090066935 A   6/2009
KR   20120050827 A   5/2012
(Continued)

*Primary Examiner* — Theresa T Doan
(74) *Attorney, Agent, or Firm* — Slater Matsil, LLP

(57) ABSTRACT

A nitrogen plasma treatment is used on an adhesion layer of a contact plug. As a result of the nitrogen plasma treatment, nitrogen is incorporated into the adhesion layer. When a contact plug is deposited in the opening, an interlayer of a metal nitride is formed between the contact plug and the adhesion layer. A nitrogen plasma treatment is used on an opening in an insulating layer. As a result of the nitrogen plasma treatment, nitrogen is incorporated into the insulating layer at the opening. When a contact plug is deposited in the opening, an interlayer of a metal nitride is formed between the contact plug and the insulating layer.

20 Claims, 57 Drawing Sheets

Related U.S. Application Data

(60) Provisional application No. 62/692,499, filed on Jun. 29, 2018.

(51) Int. Cl.
　　*H01L 21/02* (2006.01)
　　*H01L 27/088* (2006.01)
　　*H01L 29/78* (2006.01)
　　*H01L 29/417* (2006.01)
　　*H01L 29/66* (2006.01)

(52) U.S. Cl.
　　CPC .... *H01L 27/0886* (2013.01); *H01L 29/41791* (2013.01); *H01L 29/66795* (2013.01); *H01L 29/7831* (2013.01); *H01L 29/7848* (2013.01); *H01L 29/7851* (2013.01)

(58) Field of Classification Search
　　CPC ......... H01L 21/76814; H01L 21/76826; H01L 21/76846; H01L 21/76856; H01L 21/76858; H01L 21/76867; H01L 21/76897; H01L 2029/7858; H01L 21/823431; H01L 23/53209; H01L 29/66545
　　USPC .......................................................... 257/401
　　See application file for complete search history.

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2003/0186532 A1 | 10/2003 | Chen et al. |
| 2005/0110147 A1 | 5/2005 | Wu et al. |
| 2010/0151676 A1 | 6/2010 | Ritchie et al. |
| 2013/0153093 A1 | 6/2013 | Vandroux et al. |
| 2013/0189839 A1* | 7/2013 | Guillorn ........... H01L 29/66772 257/E21.586 |
| 2014/0011354 A1 | 1/2014 | Lei et al. |
| 2018/0315652 A1* | 11/2018 | Tsai .................... H01L 29/6656 |

FOREIGN PATENT DOCUMENTS

| | | |
|---|---|---|
| TW | 200425325 A | 11/2004 |
| TW | 201030173 A | 8/2010 |
| TW | 201227872 A | 7/2012 |

\* cited by examiner

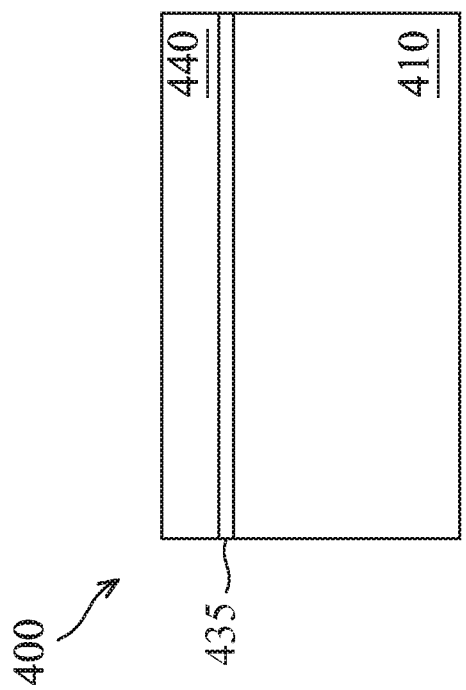
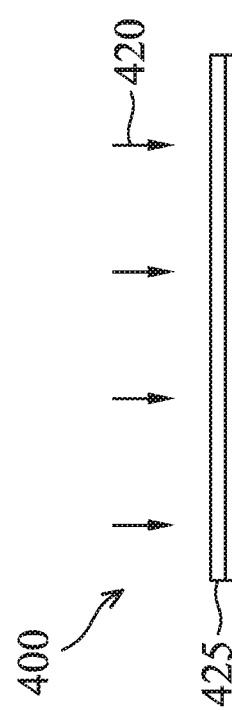
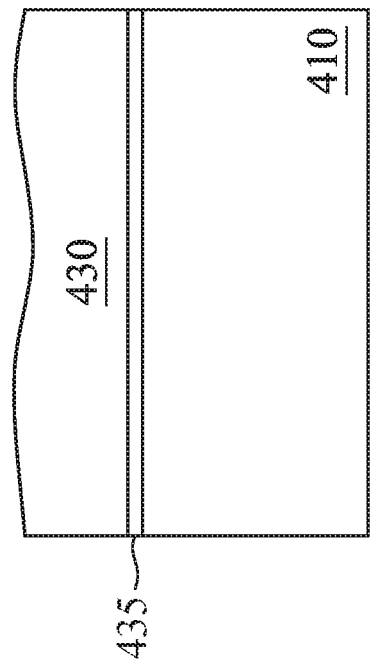

TREATMENT FOR ADHESION IMPROVEMENT

PRIORITY CLAIM AND CROSS-REFERENCE

This application is a division of U.S. patent application Ser. No. 16/178,244, filed on Nov. 1, 2018, and entitled "Treatment for Adhesion Improvement," which claims the benefit of U.S. Provisional Application No. 62/692,499, filed on Jun. 29, 2018, and entitled "Plasma Treatment for Adhesion Improvement," which application is incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-23C illustrate of the formation of a FinFET at various intermediate stages of development, in accordance with some embodiments.

FIGS. 30 through 32 illustrate various intermediate stages of the formation of a metal on an insulating layer, in accordance with some embodiments.

DETAILED DESCRIPTION OF ILLUSTRATIVE EMBODIMENTS

Figure 1:
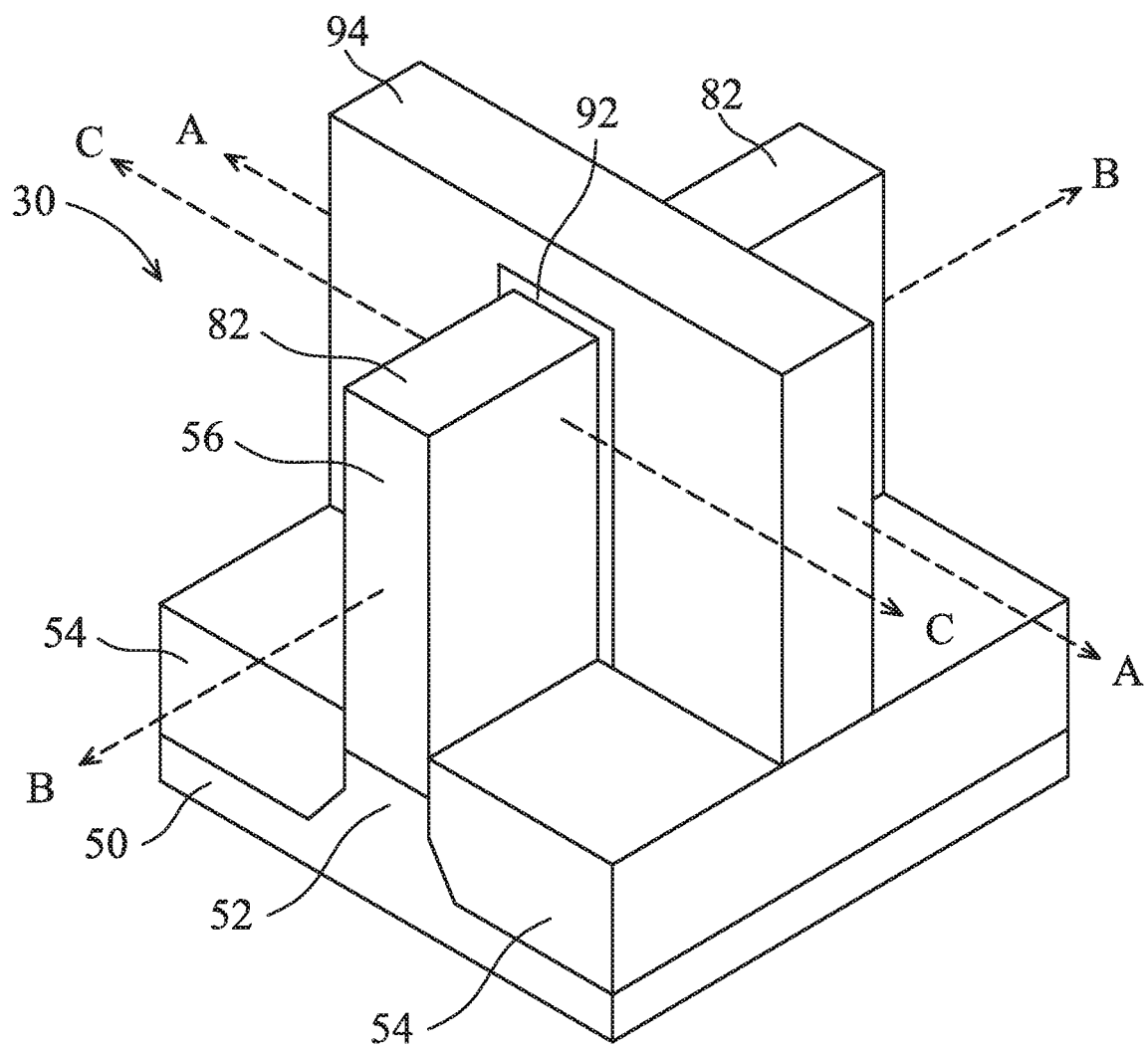
FIG. 1 is an example of a Fin Field-Effect Transistor (FinFET) in a three-dimensional view.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments are described in detail with respect to a specific context, namely, a FinFET device and a method of forming the same. Embodiments allow for forming conductive plugs such that an adhesion between the conductive plug and the surrounding and underlying material is increased. One of skill will recognize, however, that these techniques which are described in detail with respect to a FinFET device may also be applied to other contexts as also described below.

The discussion of embodiments in the context of FinFETs is not intended to limit the application of these techniques in any way. The discussed formation of the FinFET, including the source/drain regions, gate structure, and channel regions of the FinFET are presented as an example. These processes may be altered while staying within the intended scope of the embodiments discussed herein.

Devices formed on a semiconductor substrate are sometimes provided with electrical connectivity by metal plugs or contacts disposed in a dielectric or semiconductor layer such as an interlayer dielectric (ILD) or the like. As sizes of devices have decreased, sizes allowed for contacts have also decreased. An adhesion layer is sometimes used between a contact plug and contact target area to increase adhesion between the contact plug and the contact target area, resulting in reduced resistance and reduced leakage issues. Interfacial adhesion is important for reliable micro-electronic and nano-electronic devices.

In a typical contact formation process, a TiN adhesion layer may be used in a contact opening. When the deposition technique results in a crystalline film, for example using atomic layer deposition (ALD), a TiN layer used as an adhesion layer (aka glue layer) for a Ti and/or Co contact plug shows good adhesion performance due to its high crystalline TiN (111) orientation. The subsequently formed Ti and/or Co contact plug may be deposited, for example, by physical vapor deposition (PVD).

With dimension shrinkage and other deposition processes, a TiN or Ti layer can suffer from poor adhesion. For example, some deposition techniques result in a non-crystalline film, such as in a chemical vapor deposition (CVD) type process. A CVD deposition technique may be desirable to provide high selectivity to deposition on underlying materials, however.

Embodiment processes described herein use a plasma treatment on the adhesion layer to provide adhesion improvement of the adhesion layer. A nitrogen ($N_2/H_2$)

plasma treatment performed on the adhesion layer increases the adhesion of the subsequently formed contact plug. As a result of the nitrogen ($N_2/H_2$) plasma treatment, nitrogen is incorporated into the treated adhesion layer. When a metal plug is deposited on the adhesion layer, an ultrathin layer of $M_xN$ (a nitride of the metal M) is formed at the interface of the plug and adhesion layer by the combination of available nitrogen in the treated material and the metal M. The details of this process is described below with respect to the various embodiments.

This metal nitride ($M_xN$) material has strong adhesion to the metal due to the small lattice mismatch between a face centered cubic (fcc) structure of the $M_xN$ (e.g., where M is Co, the crystalline structure of $CO_xN$) and fcc structure of the metal M (e.g., the crystalline structure of a Co plug).

The $N_2/H_2$ plasma treatment may also be used directly on a SiO or SiN substrate, thereby allowing for direct adhesion without the need for an adhesion layer. In other words, the nitrogen plasma treatment may be used in a glue-layer-free process. Also, no extra film deposition is needed for contact gap-fill (for example, of a Co contact).

Figure 23A:
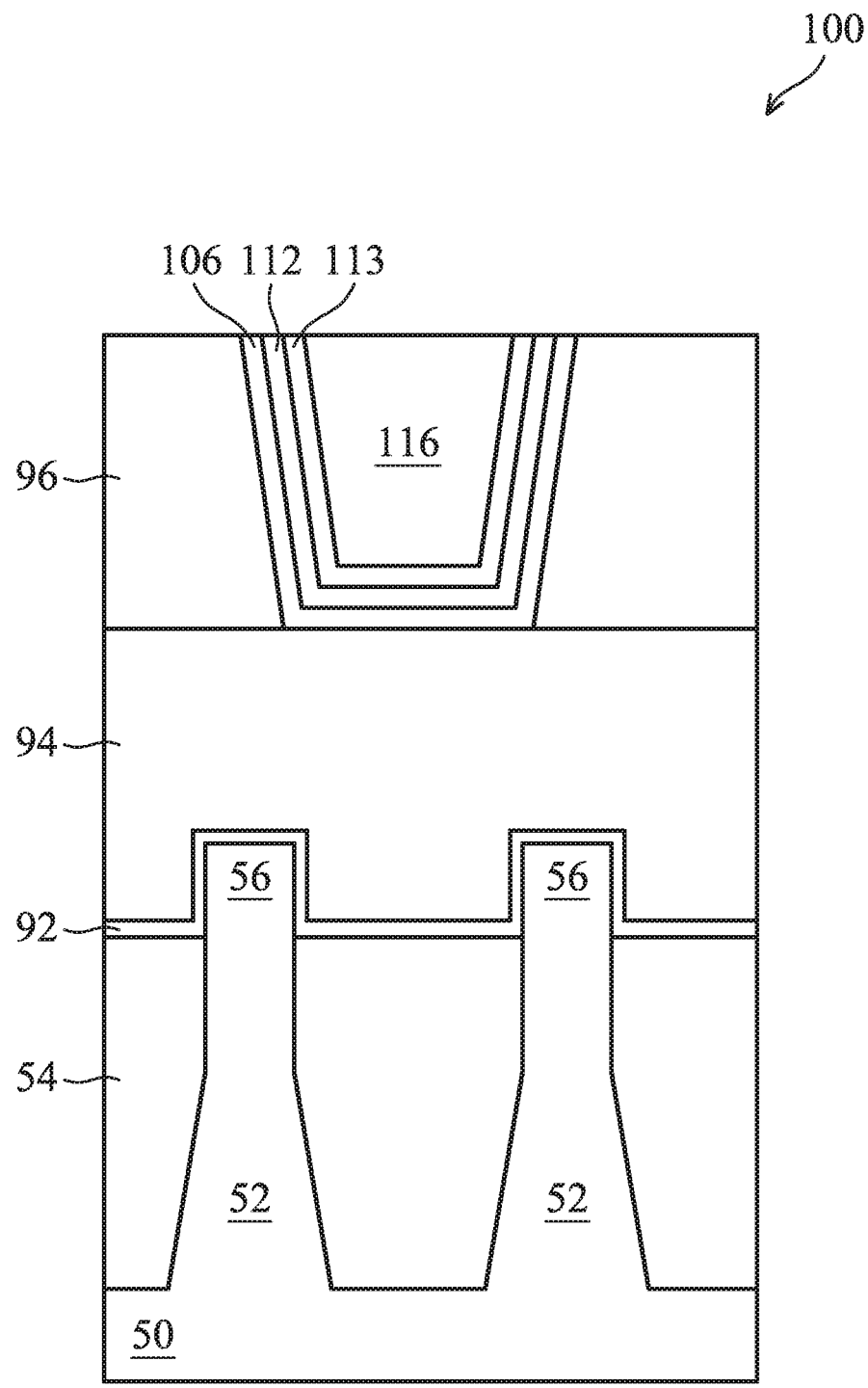
Figure 23B:
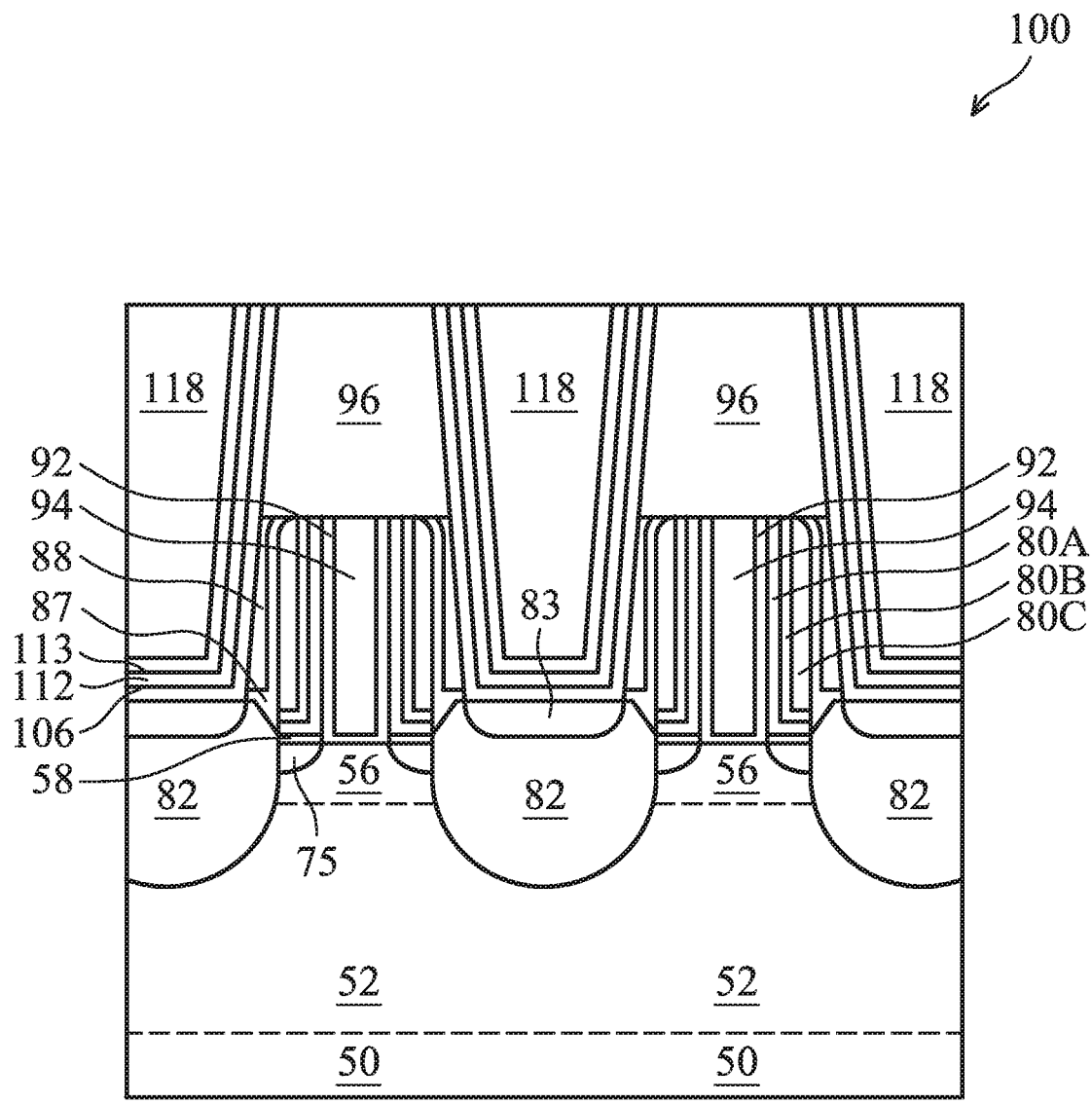
Figure 23C:
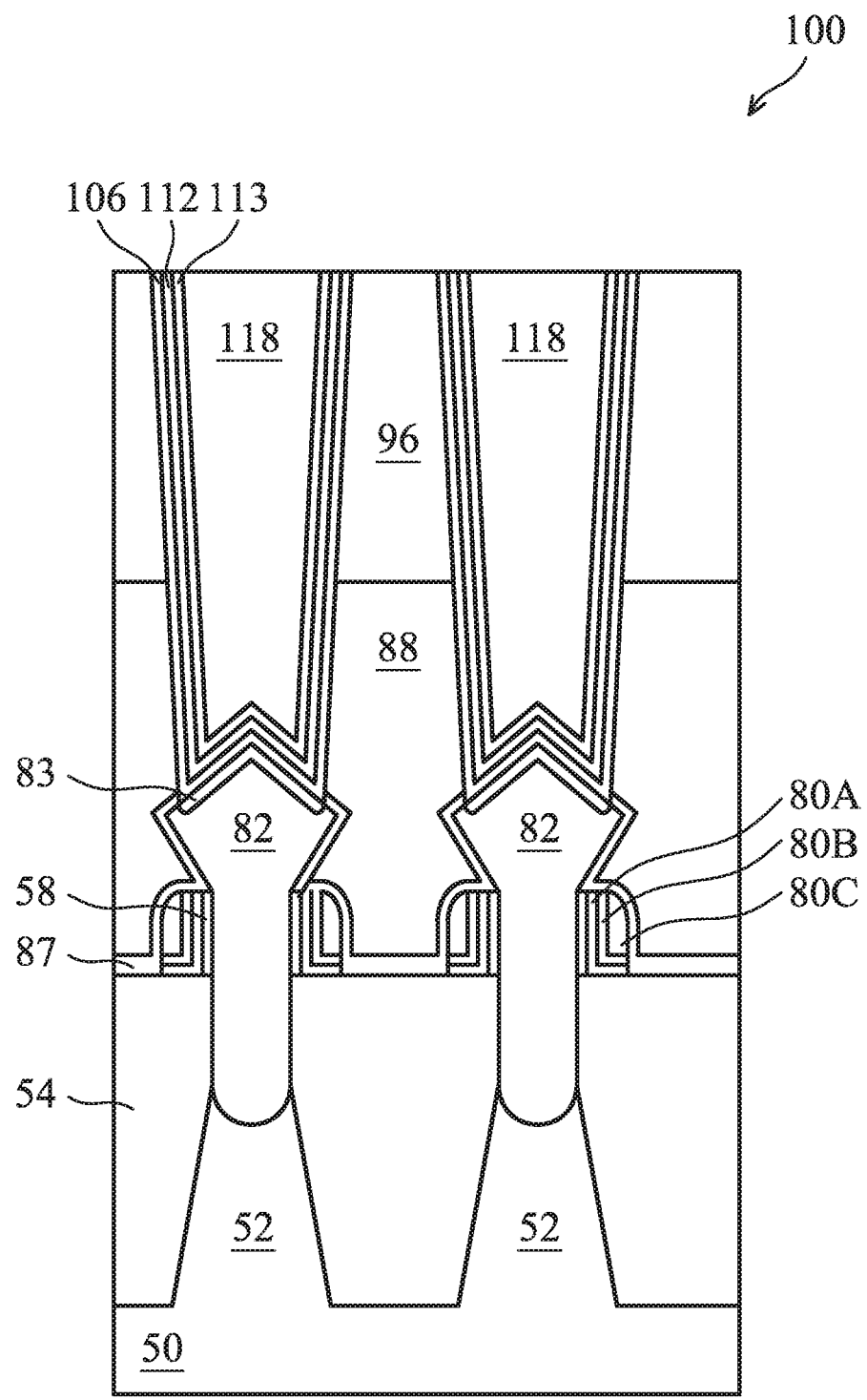

FIG. 1 illustrates an example of a fin field-effect transistor (FinFET) 30 in a three-dimensional view. The FinFET 30 may be similar to a FinFET formed in region 100 as illustrated in FIGS. 23A, 23B, and 23C (with some features omitted). The FinFET 30 comprises a fin 56 on a substrate 50 which extends from a base portion 52 thereof, where the fin 56 or a portion thereof may be formed from the substrate 50. The substrate 50 includes isolation regions 54, and the fin 56 protrudes above and from between neighboring isolation regions 54. A gate dielectric 92 is along sidewalls and over a top surface of the fin 56, and a gate electrode 94 is over the gate dielectric 92. Source/drain regions 82 are disposed in opposite sides of the fin 56 with respect to the gate dielectric 92 and gate electrode 94. FIG. 1 further illustrates reference cross-sections that are used in subsequent figures. Cross-section A-A is across a channel, gate dielectric 92, and gate electrode 94 of the FinFET 30. Cross-section C-C is in a plane that is parallel to cross section A-A and is across fin 56 outside of the channel. Cross-section B-B is perpendicular to cross-section A-A and is along a longitudinal axis of the fin 56 and in a direction of, for example, a current flow between the source/drain regions 82. Subsequent figures refer to these reference cross-sections for clarity.

FIGS. 2A through 23A-C are cross-sectional views of intermediate stages in the manufacturing of a FinFET in accordance with some embodiments. In FIGS. 2A through 23A-C, figures ending with an "A" designation are illustrated along the reference cross-section A-A illustrated in FIG. 1; figures ending with a "B" designation are illustrated along the reference cross-section B-B illustrated in FIG. 1; and figures ending with a "C" designation are illustrated along the cross-section C-C illustrated in FIG. 1. In some instances, cross-section illustrations are omitted at certain steps, for example, if the omitted cross-section is not specifically discussed.

Figure 2A:
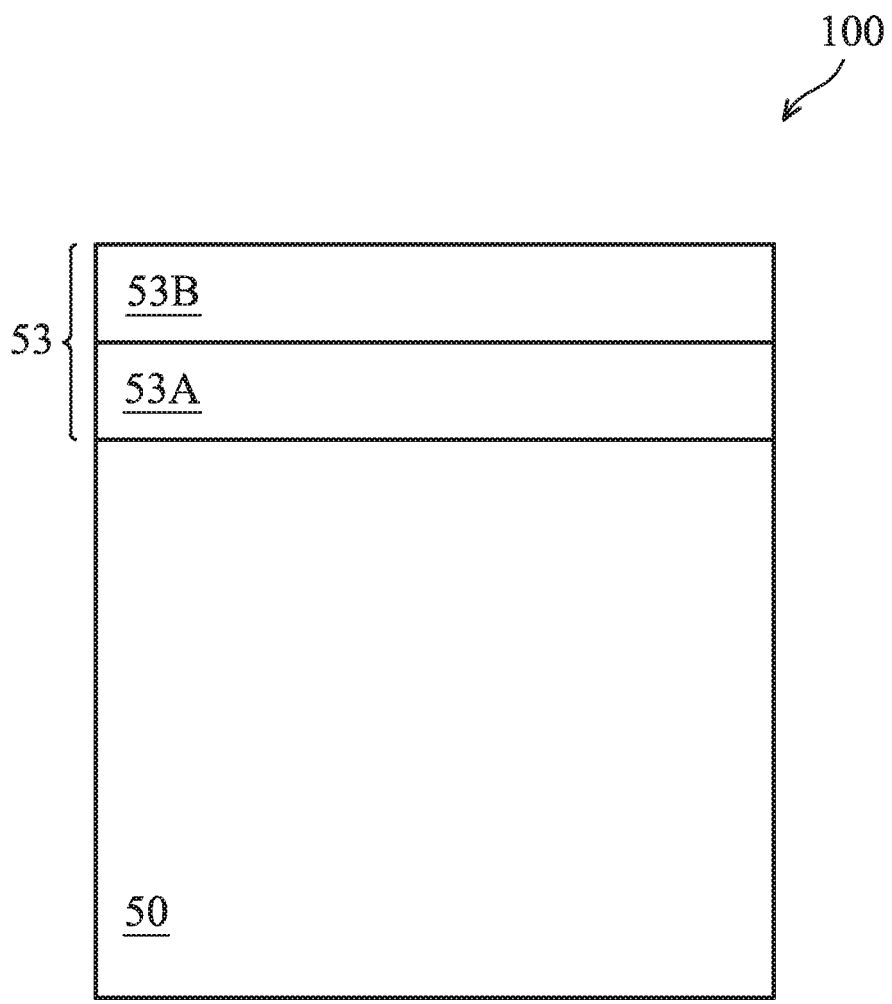

FIG. 2A illustrates the substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 may further include integrated circuit devices (not shown). As one of ordinary skill in the art will recognize, a wide variety of integrated circuit devices such as transistors, diodes, capacitors, resistors, the like, or combinations thereof may be formed in and/or on the substrate 50 to generate the structural and functional requirements of the design for the resulting FinFETs. The integrated circuit devices may be formed using any suitable methods.

In some embodiments, the substrate 50 may comprise multiple regions, such as region 100. Some regions may be for forming n-type devices, such as n-type metal oxide semiconductor (NMOS) transistors, such as n-type FinFETs. Other regions may be for forming p-type devices, such as p-type metal oxide semiconductor (PMOS) transistors, such as p-type FinFETs. Accordingly, region 100 may be an NMOS or PMOS region. The steps described herein may be used for, for example, in forming an NMOS region while the PMOS region is masked, then removing the mask, masking the NMOS region, and then forming the PMOS region. Or the PMOS region may be formed first and the NMOS region formed second. Other types of transistors or other active or passive devices are contemplated.

FIG. 2A illustrates the formation of a mask 53 over the substrate 50. The mask 53 may be used in a subsequent etching step to pattern the substrate 50 (see FIG. 3A). In some embodiments, the mask 53 may include a first mask layer 53A and a second mask layer 53B. The first mask layer 53A may be a hard mask layer. In some embodiments, the first mask layer 53A may comprise silicon nitride, silicon oxynitride, silicon carbide, silicon carbonitride, a combination thereof, or the like, and may be formed using any suitable process, such as atomic layer deposition (ALD), physical vapor deposition (PVD), chemical vapor deposition (CVD), a combination thereof, or the like. The first mask layer 53A may be used to prevent or minimize etching of the substrate 50 underlying the first mask layer 53A in the subsequent etch step (see FIG. 3A). The second mask layer 53B may comprise a photoresist, and in some embodiments, may be used to pattern the first mask layer 53A for use in the subsequent etching step discussed above. The second mask layer 53B may be formed by using a spin-on technique and may be patterned using acceptable photolithography techniques. In some embodiments, the mask 53 may comprise three or more mask layers.

Figure 3A:
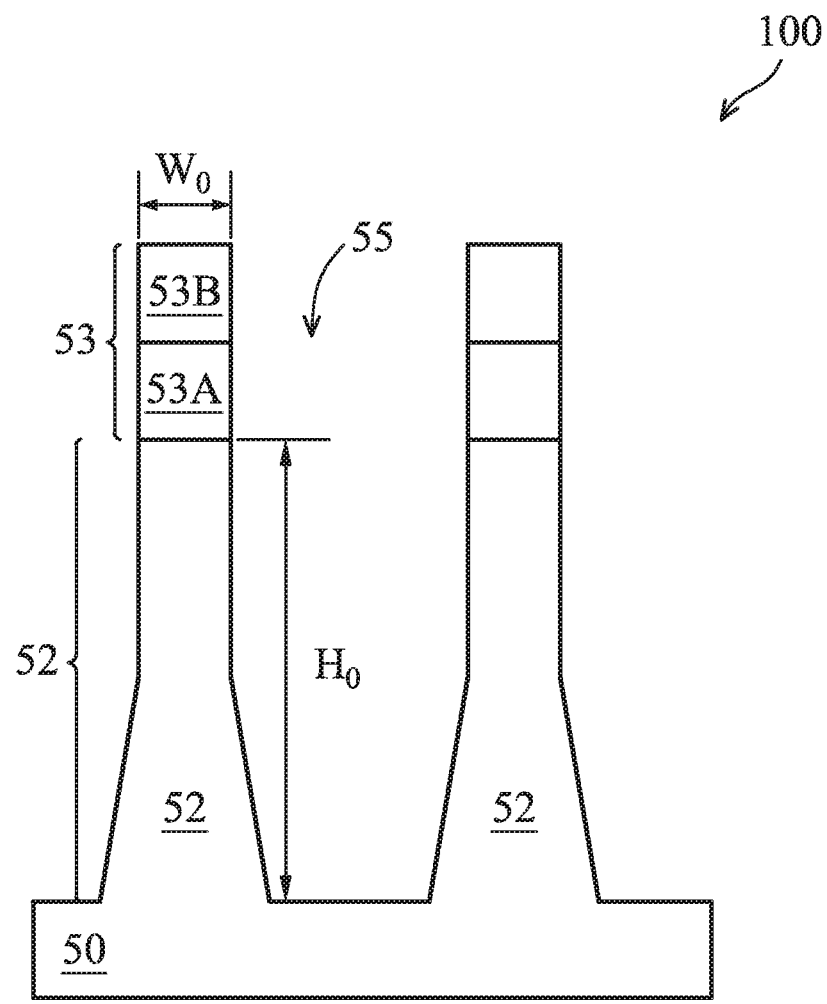

FIG. 3A illustrates the formation of semiconductor strips 52 in the substrate 50. First, the mask layers 53A and 53B may be patterned, where openings in the mask layers 53A and 53B expose areas of the substrate 50 where trenches 55 will be formed. Next, an etching process may be performed, where the etching process creates the trenches 55 in the substrate 50 through the openings in the mask 53. The remaining portions of the substrate 50 underlying a patterned mask 53 form a plurality of semiconductor strips 52. The etching may be by any acceptable etch process, such as a reactive ion etch (RIE), neutral beam etch (NBE), the like, or a combination thereof. The etch process may be anisotropic. In some embodiments, the semiconductor strips 52 may have a height $H_0$ between about 50 nm and about 60 nm, and a width $W_0$ between about 6 nm and about 8 nm.

Figure 4A:
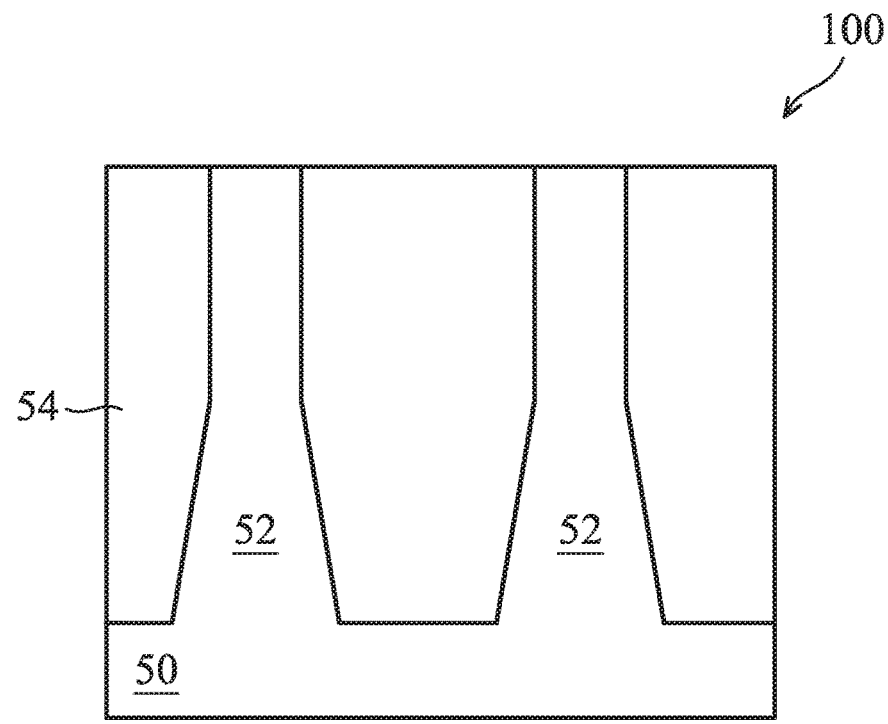

FIG. 4A illustrates the formation of an insulation material in the trenches 55 (see FIG. 3A) between neighboring semiconductor strips 52 to form isolation regions 54. The insulation material may be an oxide, such as silicon oxide, a nitride, such as silicon nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable processes may be also used.

Furthermore, in some embodiments, the isolation regions 54 may include a liner (not illustrated) formed on sidewalls and a bottom surface of the trenches 55 (see FIG. 3A) prior to the filling of the trenches 55 with an insulation material of the isolation regions 54. In some embodiments, the liner may comprise a semiconductor (e.g., silicon) nitride, a semiconductor (e.g., silicon) oxide, a thermal semiconductor (e.g., silicon) oxide, a semiconductor (e.g., silicon) oxynitride, a polymer dielectric, combinations thereof, or the like. The formation of the liner may include any suitable method, such as ALD, CVD, HDP-CVD, PVD, a combination thereof, or the like.

Referring further to FIG. 4A, a planarization process, such as a chemical mechanical polishing (CMP), may remove any excess insulation material of the isolation regions 54, such that top surfaces of the isolation regions 54 and top surfaces of the semiconductor strips 52 are coplanar (within process variations). In some embodiments, the CMP may also remove the mask 53. In other embodiments, the mask 53 may be removed using a wet cleaning process separate from the CMP.

Figure 5A:
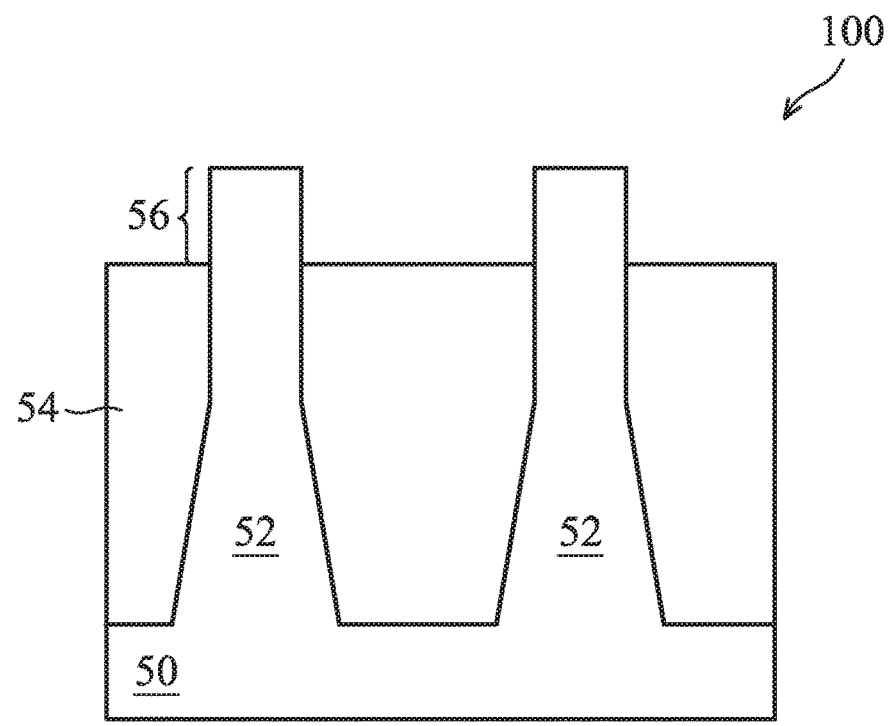

FIG. 5A illustrates the recessing of the isolation regions 54 to form Shallow Trench Isolation (STI) regions. The isolation regions 54 are recessed such that fins 56 protrude from between neighboring isolation regions 54 (which are separated by semiconductor strips 52). Further, the top surfaces of the isolation regions 54 may have a flat surface as illustrated, a convex surface, a concave surface (such as dishing), or a combination thereof. The top surfaces of the isolation regions 54 may be formed flat, convex, and/or concave by an appropriate etch. The isolation regions 54 may be recessed using an acceptable etching process, such as one that is selective to the material of the isolation regions 54.

The process described above with respect to FIGS. 2A through 5A is just one example of how the fins 56 may be formed. Embodiments contemplate other suitable processes to form fins 56, including, for example, epitaxially growing homoepitaxial or heteroepitaxial structures within recesses formed in a mask over the substrate 50.

Figure 6A:
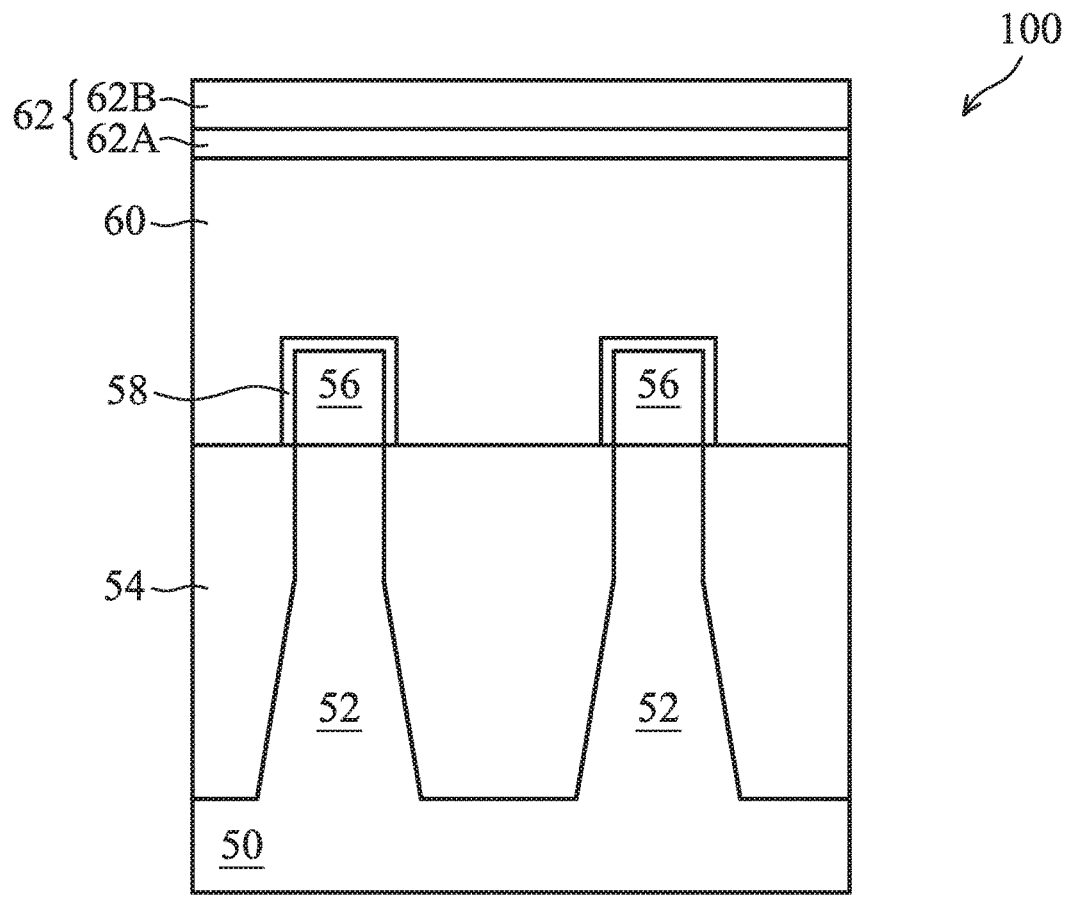
Figure 6B:
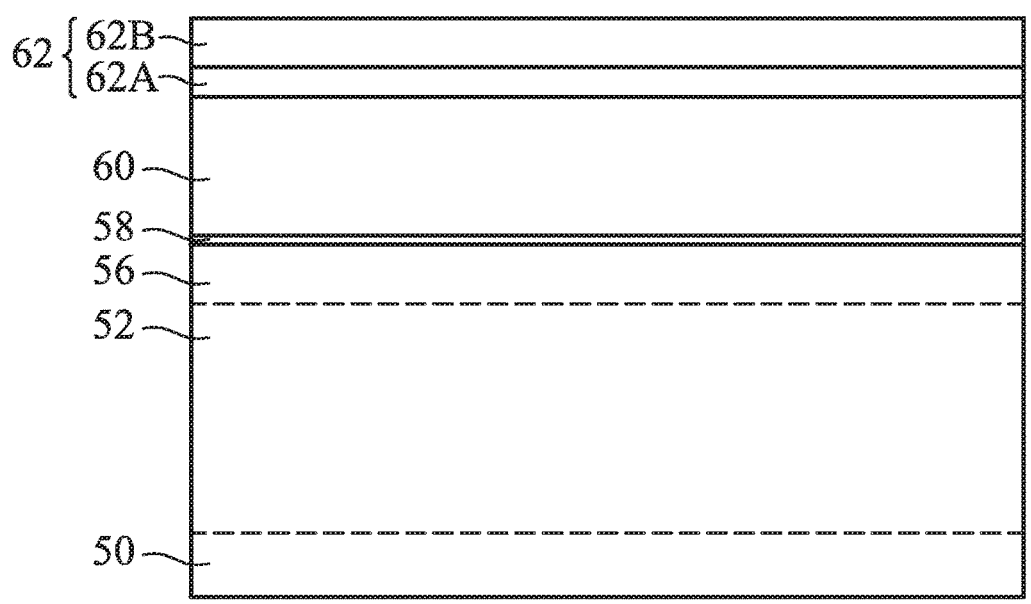

In FIGS. 6A and 6B, a dummy dielectric layer 58 is formed on the fins 56. The dummy dielectric layer 58 may be, for example, silicon oxide, silicon nitride, a combination thereof, or the like, and may be deposited (using, for example, CVD, PVD, a combination thereof, or the like) or thermally grown (for example, using thermal oxidation, or the like) according to acceptable techniques. A dummy gate layer 60 is formed over the dummy dielectric layer 58, and a mask 62 is formed over the dummy gate layer 60. In some embodiments, the dummy gate layer 60 may be deposited over the dummy dielectric layer 58 and then planarized, for example, using a CMP process. The mask 62 may be deposited over the dummy gate layer 60. The dummy gate layer 60 may be made of, for example, polysilicon, although other materials that have a high etching selectivity with respect to the material of the isolation regions 54 may also be used. The mask 62 may include one or more layers of, for example, silicon nitride, silicon oxynitride, silicon carbide, silicon carbonitride, the like, or a combination thereof. In an embodiment, the mask 62 comprises a first mask layer 62A formed of silicon nitride and a second mask layer 62B formed of silicon oxide. In some embodiments, the first mask layer 62A may have a thickness between about 18 nm and about 22 nm, and the second mask layer 62B may have a thickness between about 50 nm and about 90 nm. In some embodiments, the dummy dielectric layer 58 may have a thickness between about 11 nm and about 15 nm, and the dummy gate layer 60 may have a thickness between about 50 nm and about 80 nm. Other dimensions are contemplated and may be used. In some embodiments, the dummy dielectric layer 58 may be omitted.

Referring further to FIGS. 6A and 6B, appropriate doped wells (not shown) may be formed in the fins 56, the semiconductor strips 52, and/or the substrate 50. Wells may be formed before or after the dummy gates 70 (described below with respect to FIGS. 7A, 7B, and 7C) are formed. In embodiments where wells are formed prior to the formation of the dummy gates 70, for example, wells may be formed prior to the formation of the dummy dielectric layer 58. For example, a P-well (for an NMOS device) or an N-well (for a PMOS device) may be formed. The wells (if any) may be formed by a masking and implantation technique using appropriate impurities, e.g., n-type impurities corresponding to phosphorus, arsenic, or the like and p-type impurities corresponding to boron, $BF_2$, or the like. After implanting appropriate impurities an anneal may be performed to activate the p-type and/or n-type impurities that were implanted. In some embodiments, the materials of the fins 56 may be in situ doped during the deposition process.

Figure 7A:
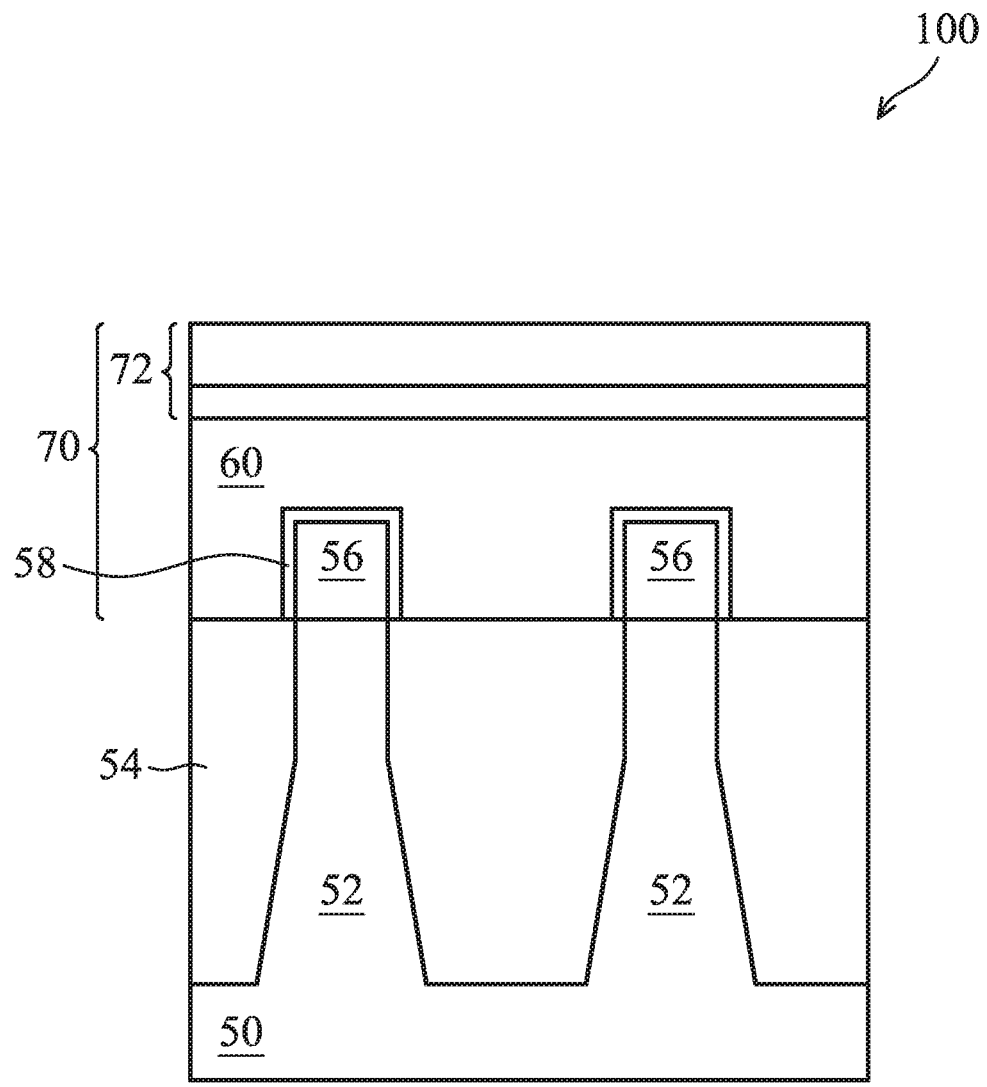
Figure 7B:
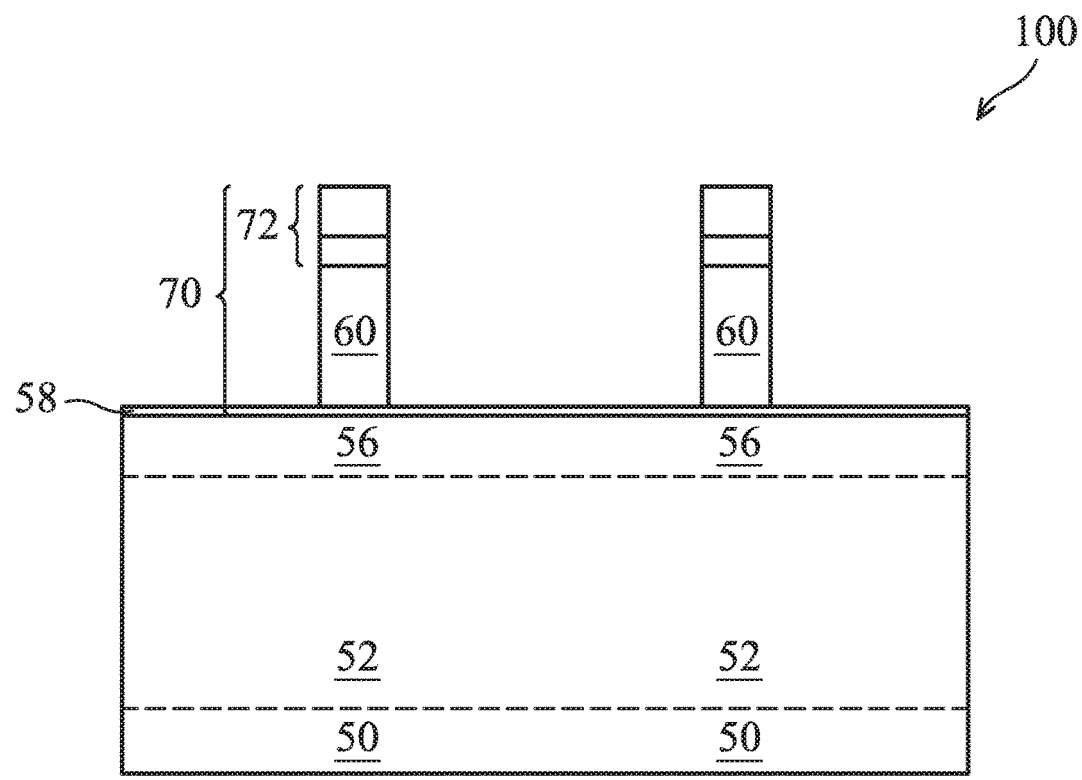
Figure 7C:
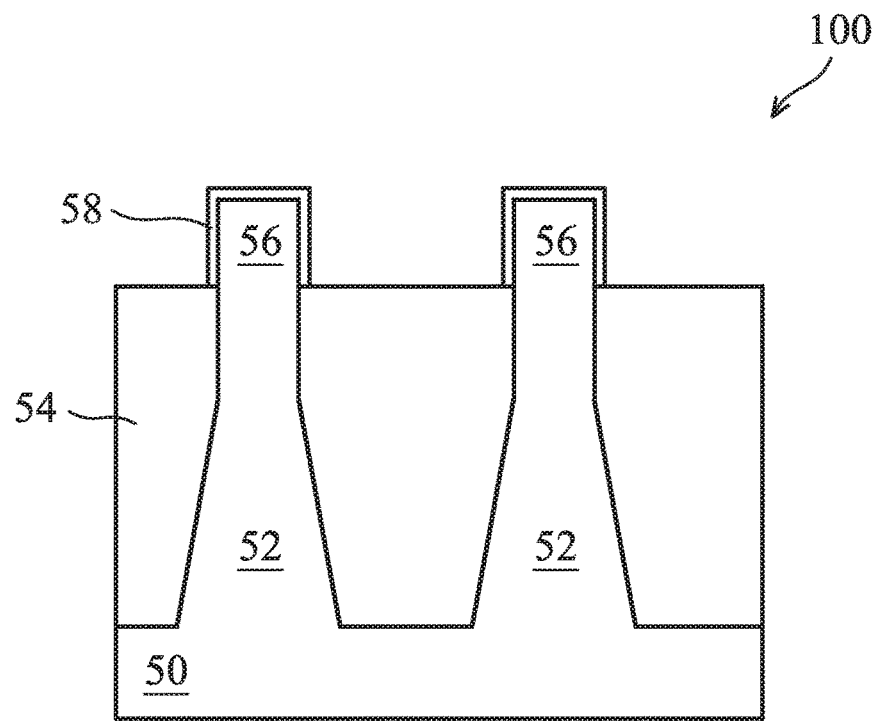

In FIGS. 7A, 7B, and 7C, the mask 62 (see FIGS. 6A and 6B) may be patterned using acceptable photolithography and etching techniques to form masks 72 in region 100. The pattern of the masks 72 may then be transferred to the dummy gate layer 60 by an acceptable etching technique to form dummy gates 70. Optionally, the pattern of the masks 72 may similarly be transferred to dummy dielectric layer 58. The pattern of the dummy gates 70 cover respective channel regions of the fins 56 while exposing source/drain regions of the fins 56. The dummy gates 70 may have a lengthwise direction substantially perpendicular to the lengthwise direction of respective fins 56. A size of the dummy gates 70, and a pitch between dummy gates 70, may depend on a region of a die in which the dummy gates 70 are formed. In some embodiments, dummy gates 70 may have a larger size and a larger pitch when located in an input/output region of a die (e.g., where input/output circuity is disposed) than when located in a logic region of a die (e.g., where logic circuity is disposed). In some embodiments, the dummy gates 70 may have a height between about 135 nm and about 175 nm, and the dummy gates 70 may have a width between about 15 nm and about 27 nm. Other dimensions are contemplated and may be used for dummy gates 70. In addition, although two dummy gates 70 are illustrated, these are intended only to be an example and more or less dummy gates may be used in region 100.

Figure 8A:
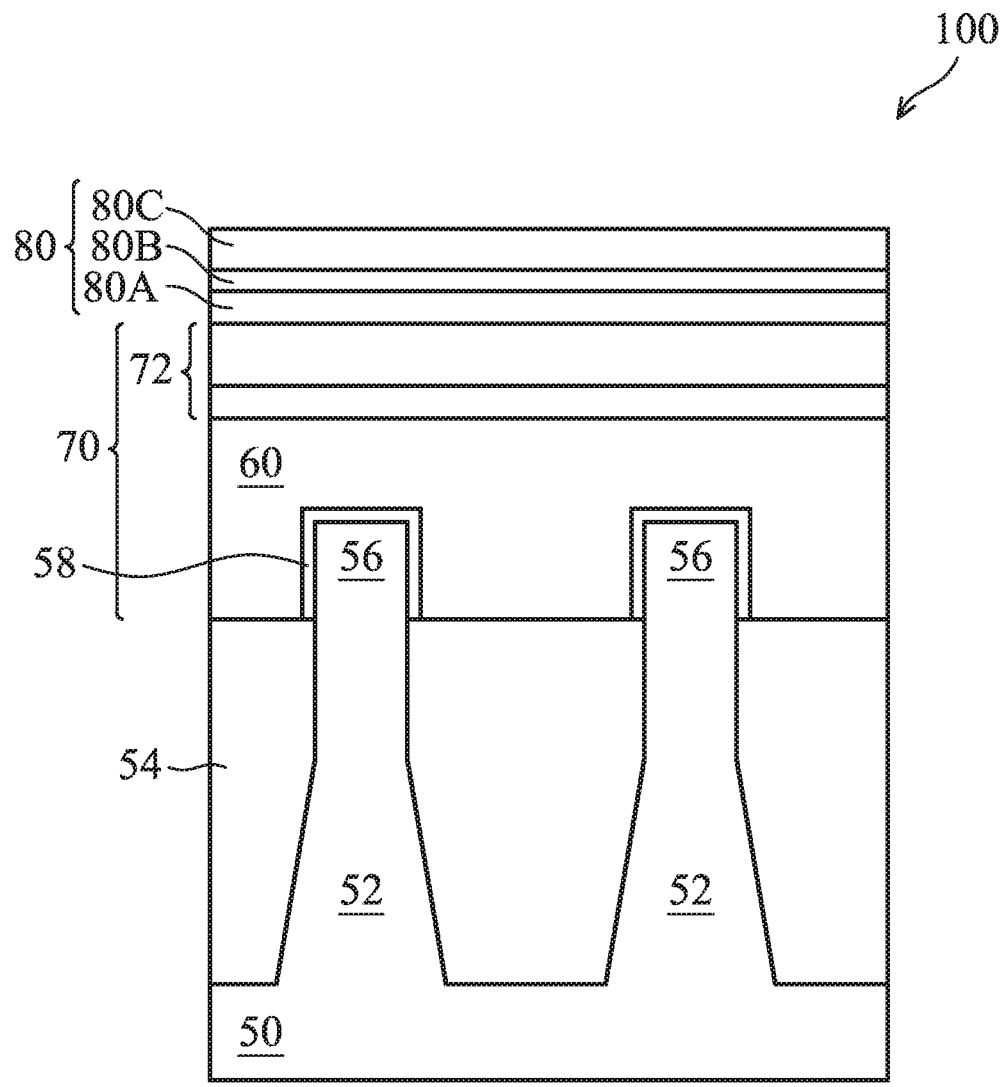
Figure 8B:
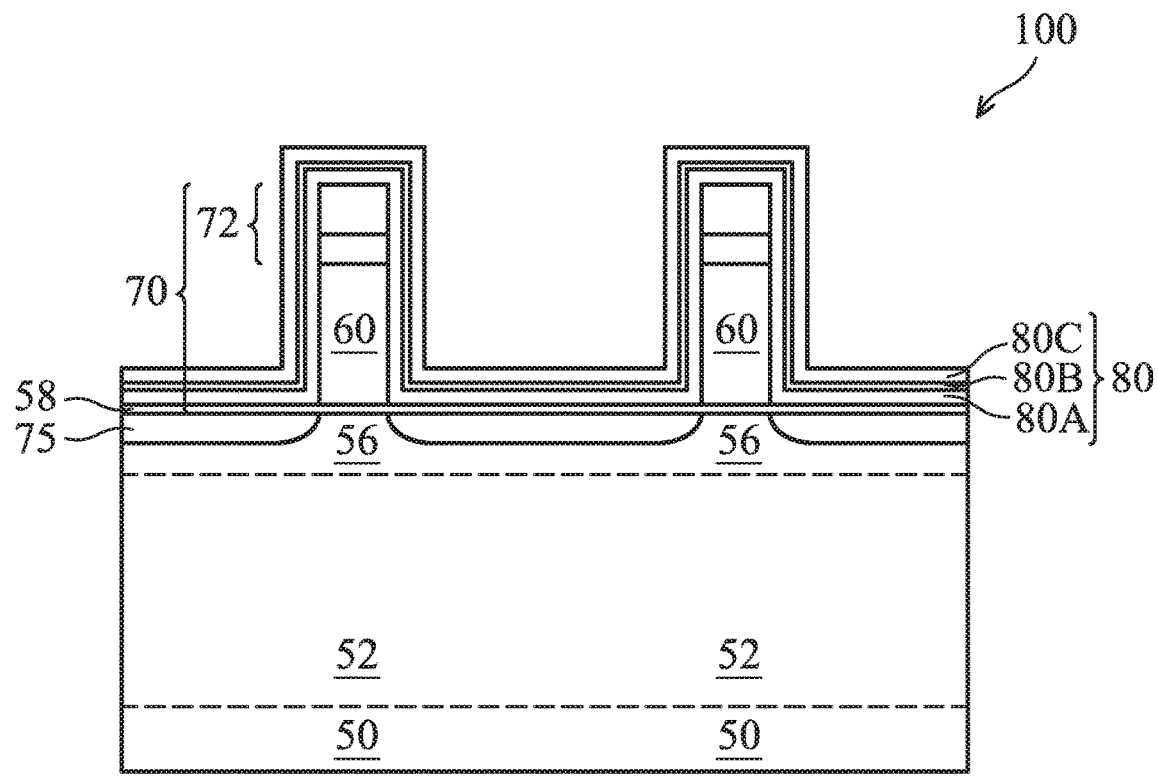
Figure 8C:
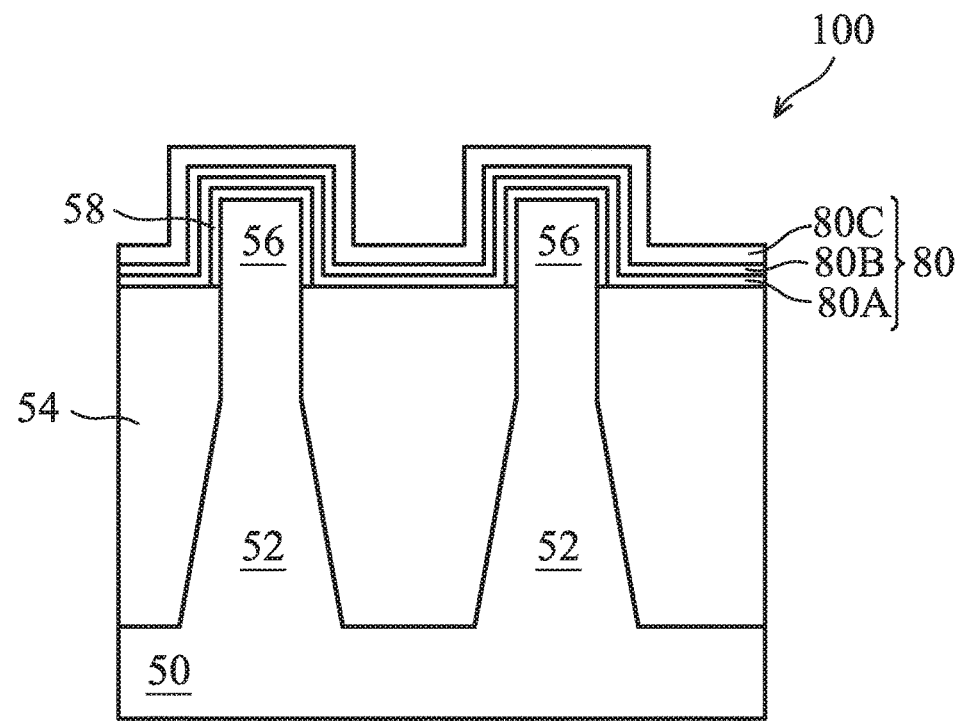

In FIGS. 8A, 8B, and 8C, a gate spacer layer 80 is formed on exposed surfaces of the dummy gates 70 (see FIGS. 8A and 8B) and/or over the fins 56 (see FIG. 8C). Any suitable methods of forming the gate spacer layer 80 may be used. In some embodiments, a deposition (such as CVD, ALD, or the like) may be used form the gate spacer layer 80. In some embodiments, the gate spacer layer 80 may include one or more layers of, for example, silicon nitride (SiN), silicon oxynitride, silicon carbonitride, silicon oxycarbonitride (SiOCN), a combination thereof, or the like. In some embodiments, the gate spacer layer 80 may comprise a first gate spacer layer 80A, a second gate spacer layer 80B over the first gate spacer layer 80A, and a third gate spacer layer 80C over the second gate spacer layer 80B.

Still referring further to FIGS. 8A, 8B, and 8C, after forming the first spacer layer 80A, lightly doped source/drain (LDD) regions 75 may be formed in region 100 by a masking and implantation technique using processes and materials similar to that described above with respect to FIGS. 6A and 6B. The resulting LDD regions 75 may have a concentration of impurities from about $10^{15}$ cm$^{-3}$ to about $10^{16}$ cm$^{-3}$. An annealing process may be performed to activate the implanted impurities.

Figure 9A:
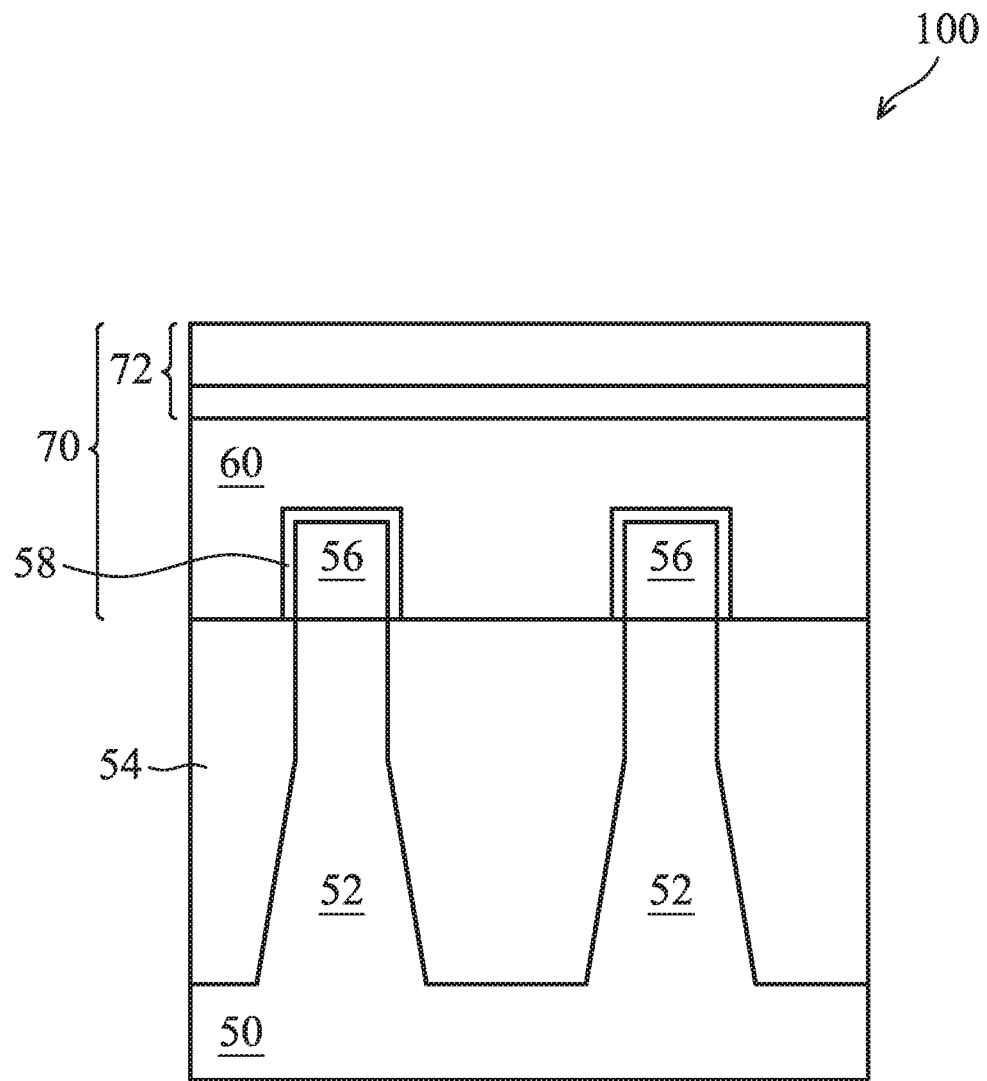
Figure 9B:
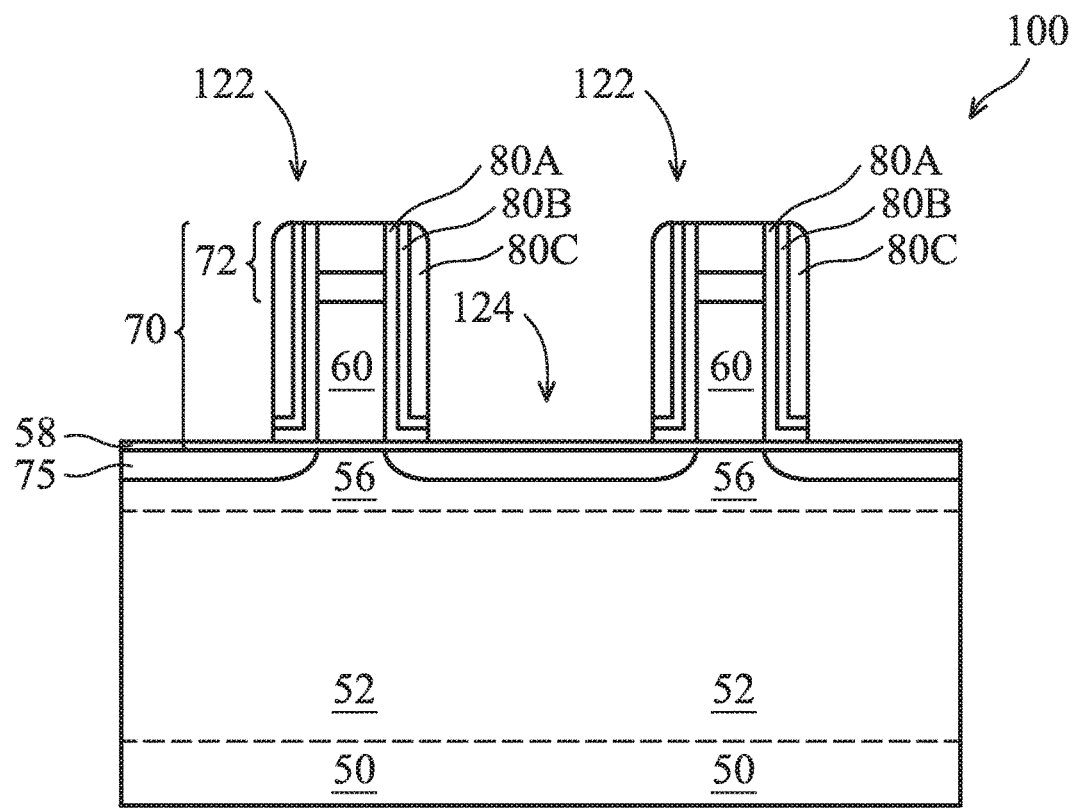
Figure 9C:
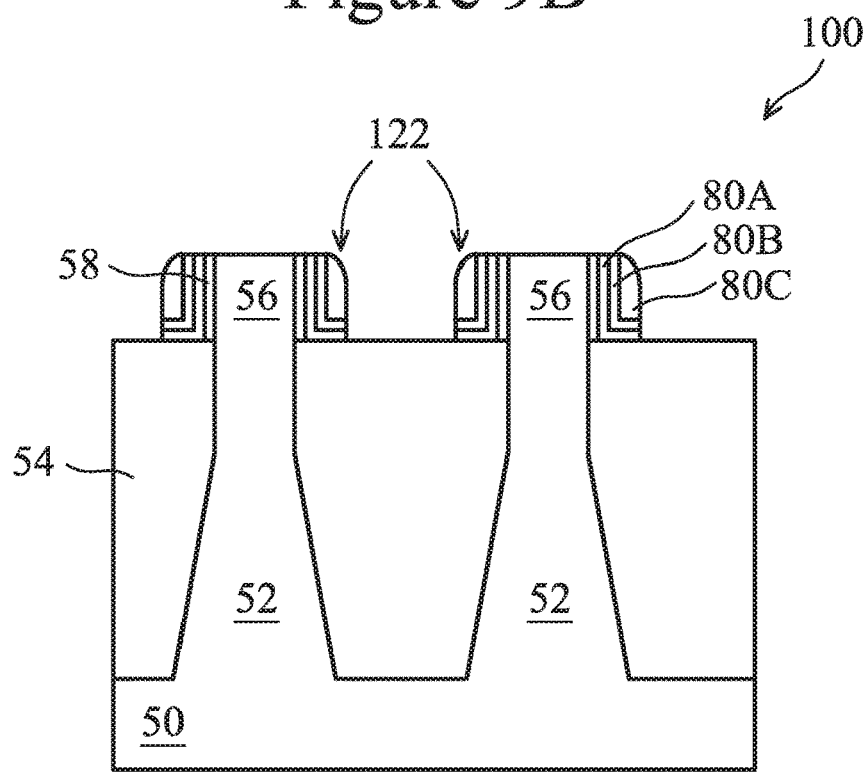

Referring to FIGS. 9A, 9B, and 9C, an etching process is performed to remove portions of the spacer layer 80. Some embodiments may use a mask to protect portions from the etching process. The etching process may be anisotropic. After performing the etching process, lateral portions of the first spacer layer 80A, the second spacer layer 80B, and the third spacer layer 80C over the LDD regions 75 and over the isolation regions 54 may be removed to expose top surfaces of the fins 56 and the masks 72 for the dummy gate stacks 70. Portions of the first spacer layer 80A, the second spacer layer 80B, and the third spacer layer 80C along sidewalls of the dummy gate stacks 70 and the fins 56 may remain and form spacers 122. In other embodiments, the spacer layer 80 may also be removed from the sidewalls of the fins 56.

Figure 10A:
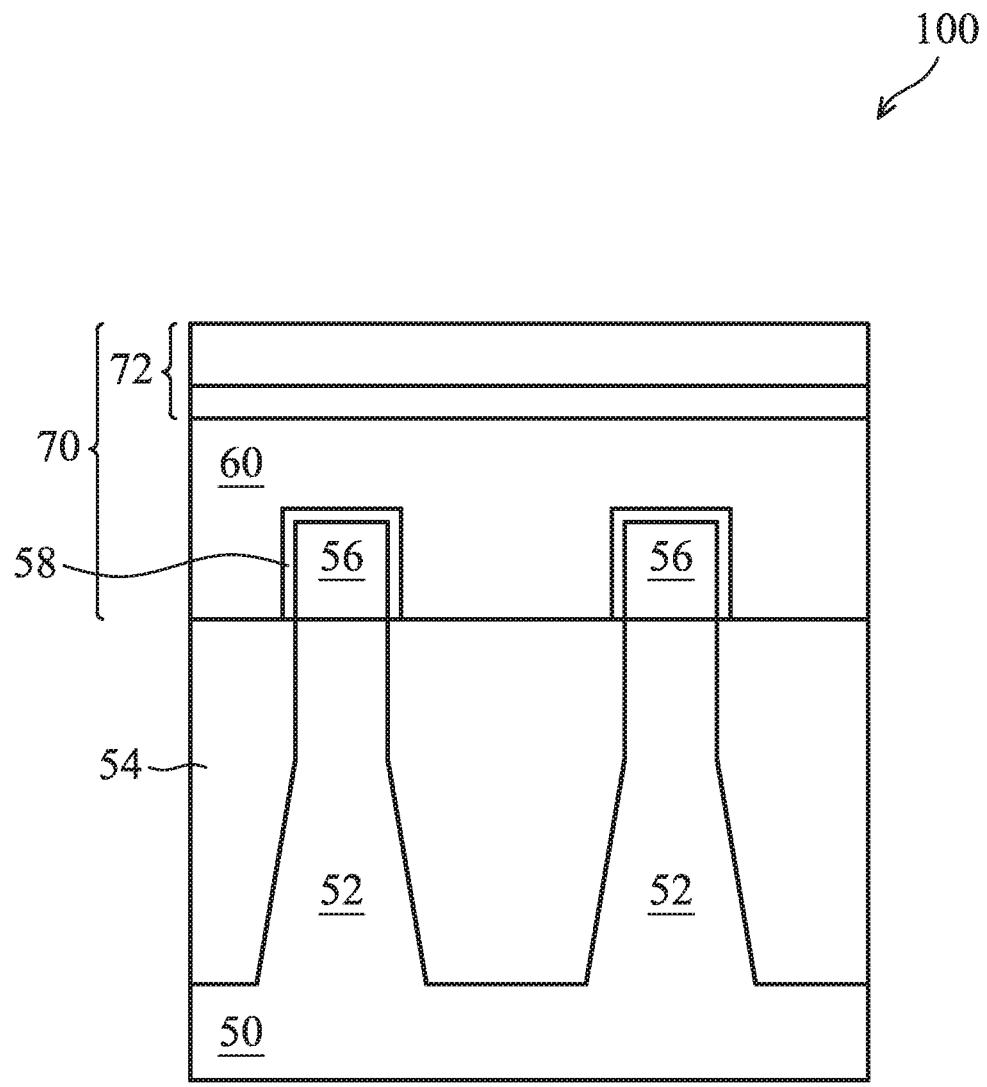
Figure 10B:
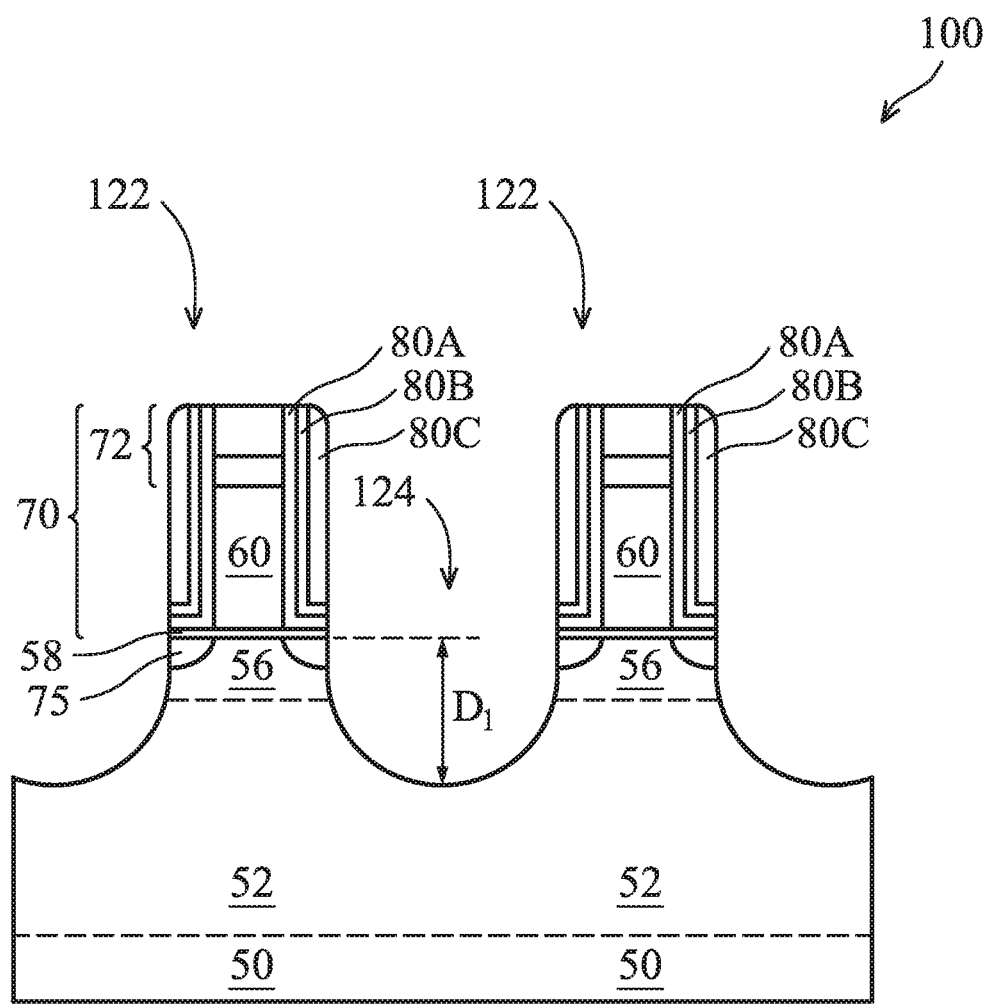
Figure 10C:
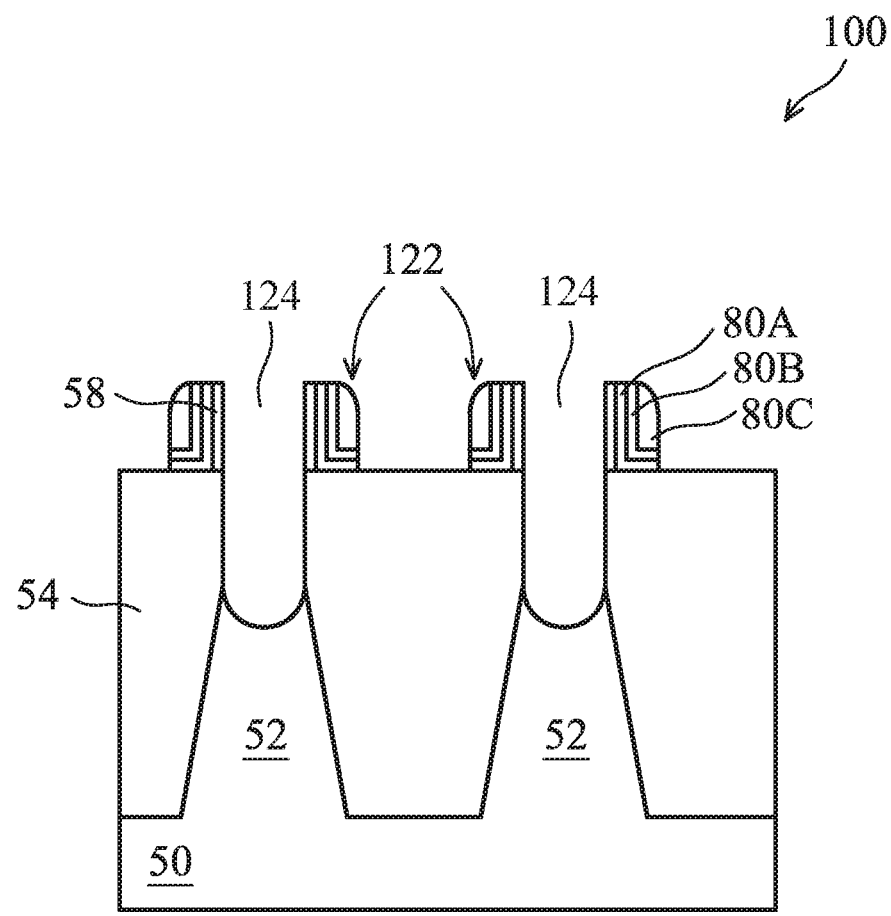

FIGS. 10A, 10B, 10C, 11A, 11B, and 11C illustrate the formation of epitaxial source/drain regions 82 in region 100. In subsequent steps which are described in greater detail below, an $N_2/H_2$ plasma treatment process may be used to improve adhesion for a contact to the epitaxial source/drain regions 82. Referring to FIGS. 10A, 10B, and 10C, a patterning process is performed on the fins 56 to form recesses 124 in source/drain regions of the fins 56 (and semiconductor strips 52 in some embodiments). The patterning process may be performed in a manner such that the recesses 124 are formed between neighboring dummy gates 70 or between an end of the fins 56 a dummy gate 70. In some embodiments, the patterning process may include an etching process, while using the dummy gates 70, the spacers 122 and/or isolation regions 54 as a combined mask. The etching process may be, for example, an anisotropic dry etching process such as a reactive ion etch (RIE), neutral beam etch (NBE), the like, or a combination thereof. In some embodiments, the anisotropic etching process may be performed using a process gas mixture including $CH_3F$, $CH_4$, HBr, $O_2$, Ar, a combination thereof, or the like. In some embodiments, recesses 124 have a depth $D_1$, as measured from a top surface of the fins 56, between about 45 nm and about 65 nm, though other dimensions are contemplated and may be used.

Figure 11A:
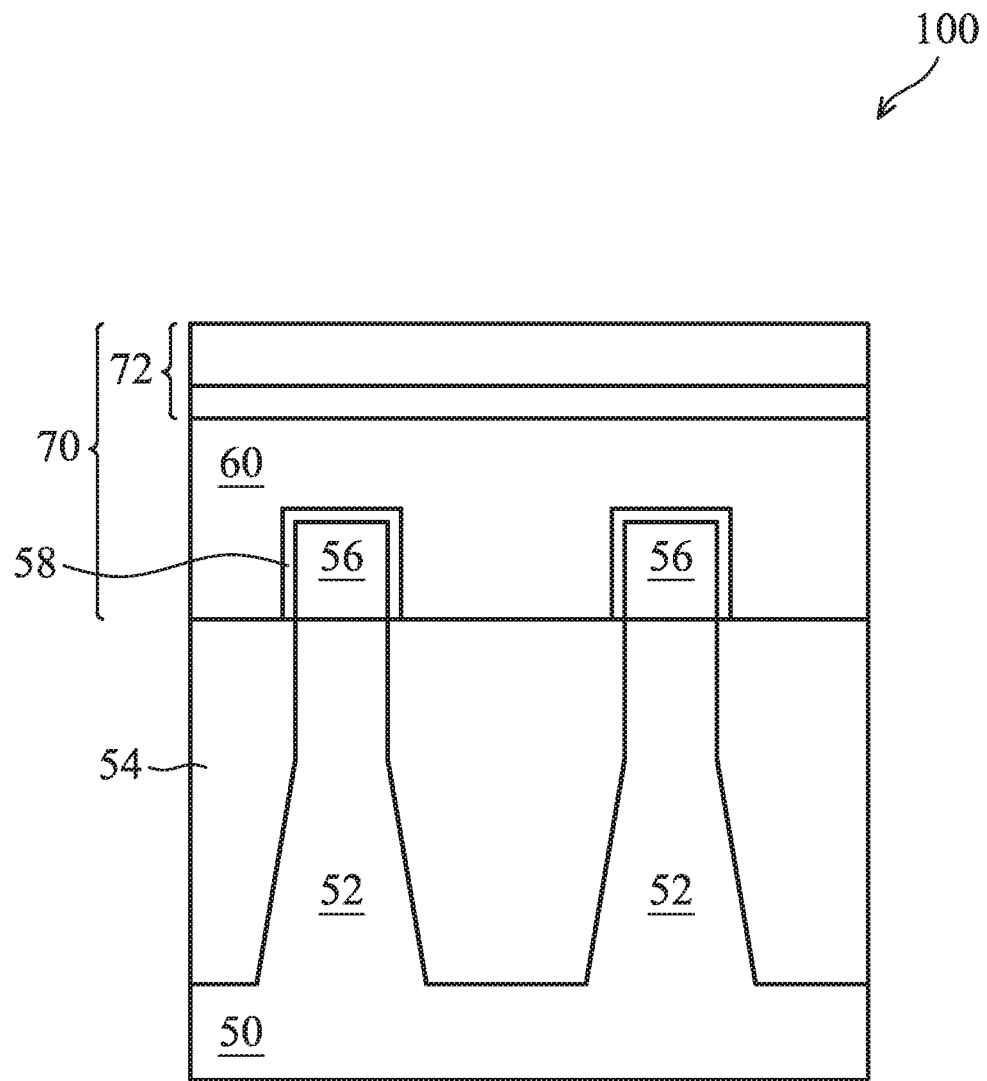
Figure 11B:
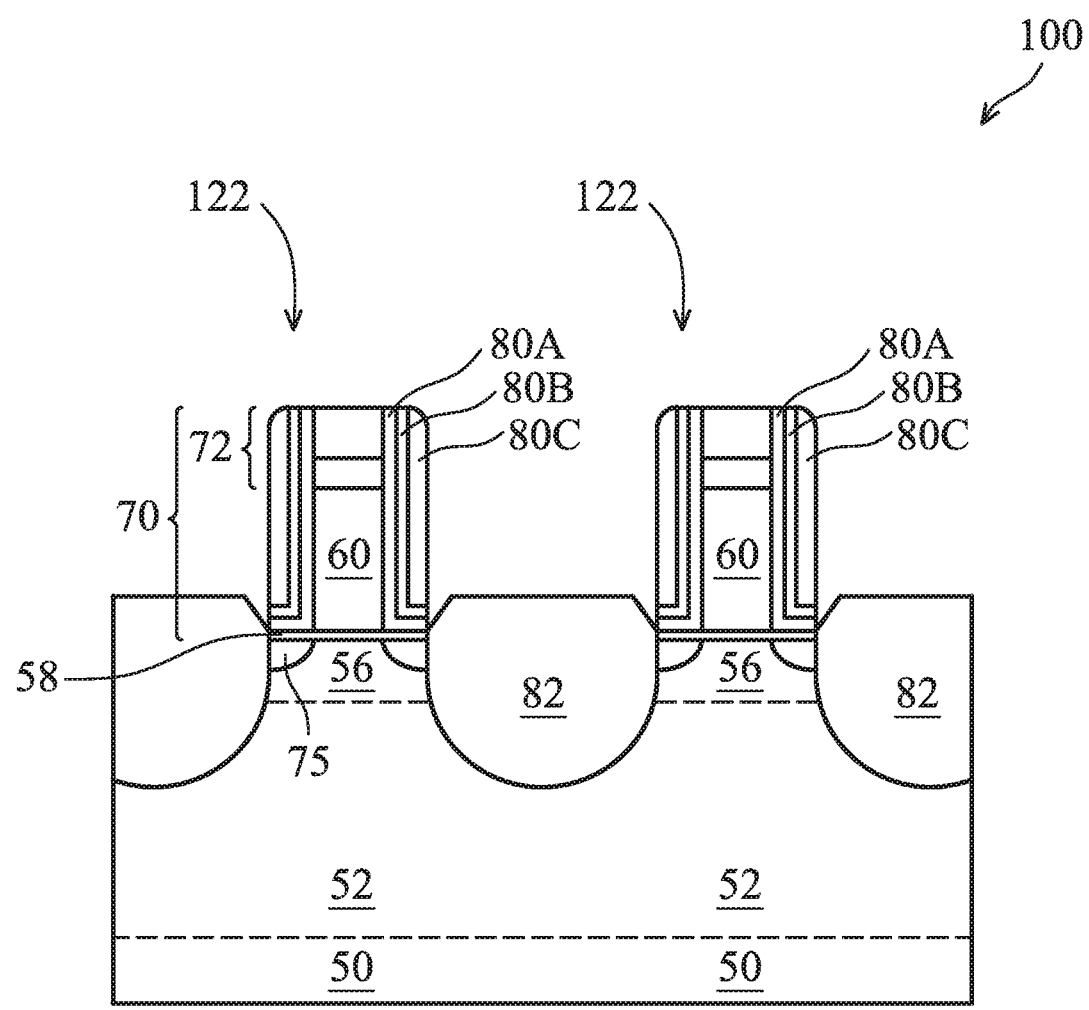
Figure 11C:
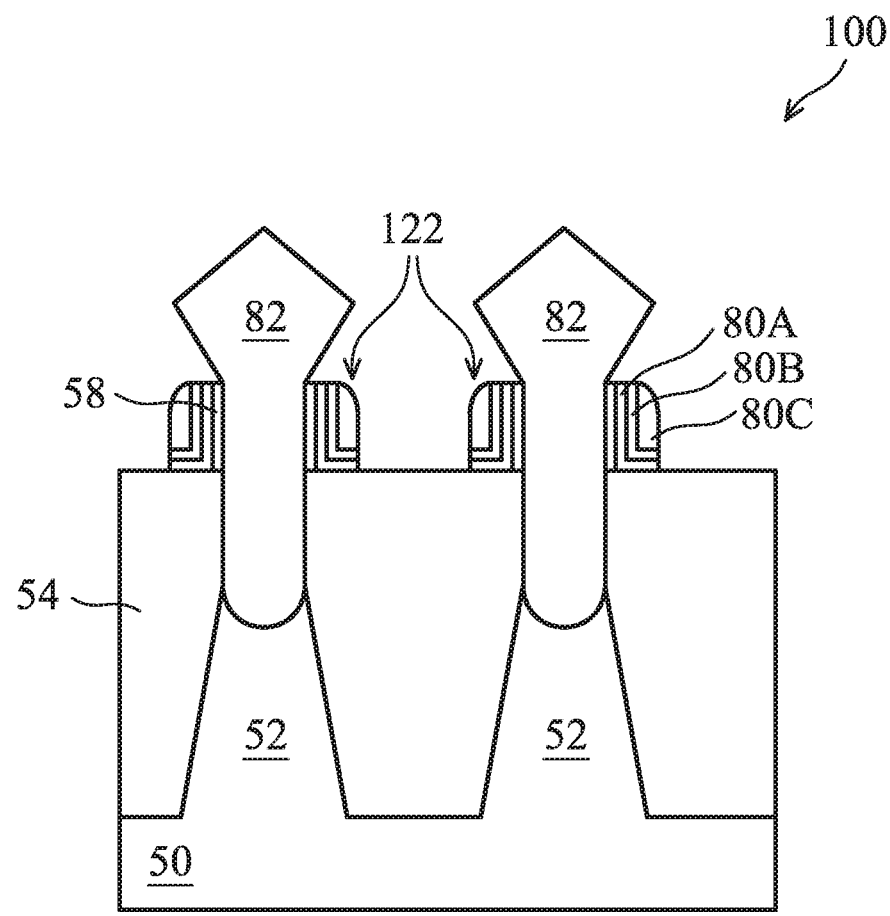

FIGS. 11A, 11B, and 11C illustrate the formation of epitaxial source/drain regions 82 in recesses 124 of region 100. In some embodiments, the epitaxial source/drain regions 82 are epitaxially grown using metal-organic CVD (MOCVD), molecular beam epitaxy (MBE), liquid phase epitaxy (LPE), vapor phase epitaxy (VPE), selective epitaxial growth (SEG), a combination thereof, or the like. The epitaxial source/drain regions 82 may include any acceptable material, such as any material that is appropriate for n-type FinFETs or for p-type FinFETs, depending on the type of FinFET being formed. For example, if the fin 56 is silicon, the epitaxial source/drain regions 82 may include silicon, SiC, SiCP, SiP, or the like for an n-type FinFET or SiGe, SiGeB, Ge, GeSn, or the like for a p-type FinFET. The epitaxial source/drain regions 82 may have surfaces raised from respective surfaces of the fins 56 and may have facets. The epitaxial source/drain regions 82 are formed in the fins 56 such that each dummy gate 70 is disposed between respective neighboring pairs of the epitaxial source/drain regions 82. In some embodiments the epitaxial source/drain regions 82 may extend past the fins 56 and into the semiconductor strips 52, such as illustrated in FIG. 11B.

The material of the epitaxial source/drain regions 82 may be implanted with dopants similar to the process previously discussed for forming the LDD regions 75, followed by an anneal (see FIGS. 8A, 8B, and 8C and its associated description). The epitaxial source/drain regions 82 may have an impurity concentration of in a range from about $10^{19}$ cm$^{-3}$ to about $10^{21}$ cm$^{-3}$. The impurities for source/drain regions 82 may be any of the n-type dopant impurities or p-type dopant impurities previously discussed, depending on the transistor type. In other embodiments, the material of the epitaxial source/drain regions 82 may be in situ doped during growth. In the illustrated embodiments, each of the source/drain regions 82 is physically separate from other source/drain regions 82. In other embodiments, two or more adjacent source/drain regions 82 may be merged. In some embodiments, more than two or three adjacent source/drain regions 82 may be merged.

FIGS. 12A through 15C illustrate the replacement of the dummy gates 70 with a replacement gate structure, including a replacement gate electrode. In subsequent steps which are described in greater detail below, an $N_2/H_2$ plasma treatment process may be used to improve adhesion for a contact to the replacement gate electrode. In some embodiments, the replacement gate structure may be a metal gate, such as described below. As referenced above, although a gate-last process is illustrated and discussed, one of skill will understand that a gate-first process may also be used.

Figure 12A:
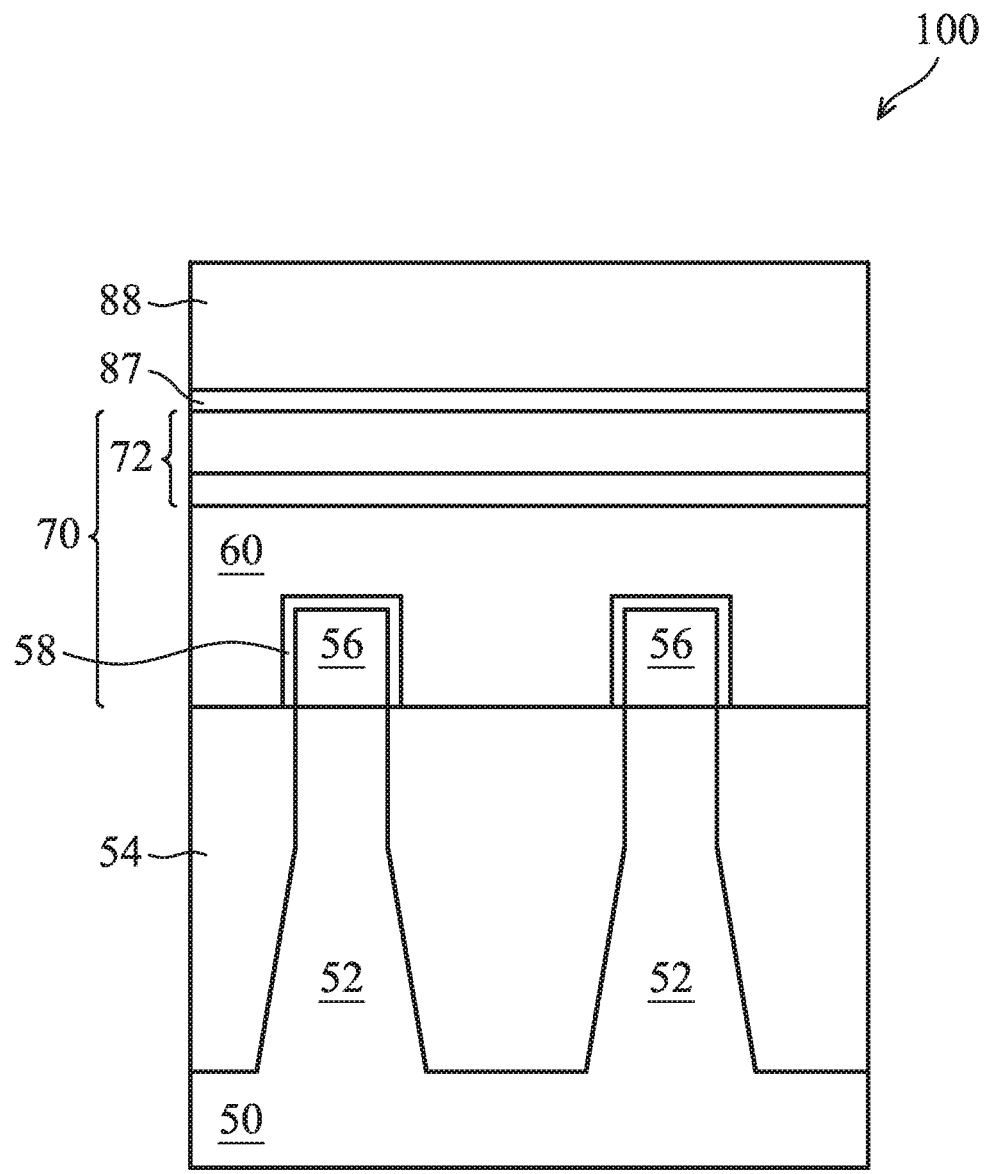
Figure 12B:
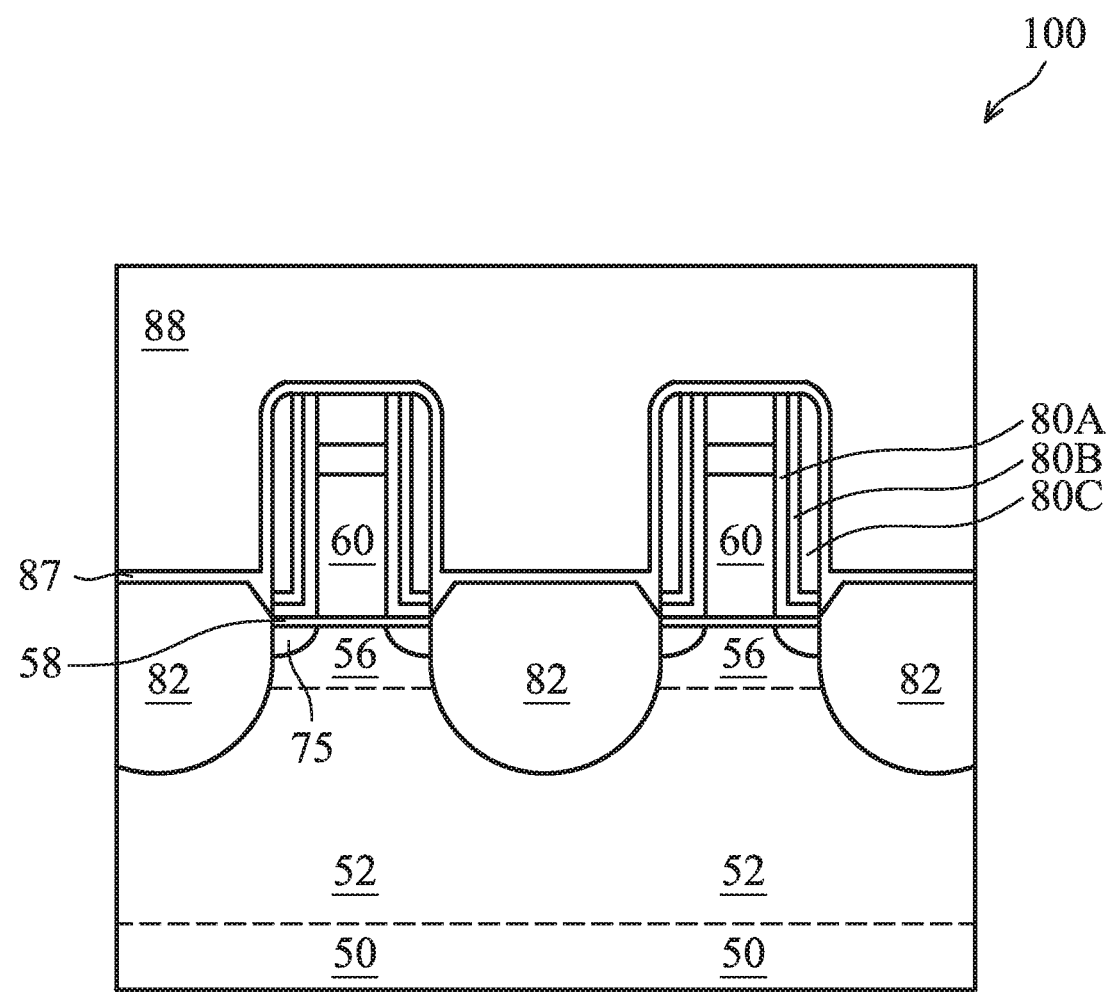
Figure 12C:
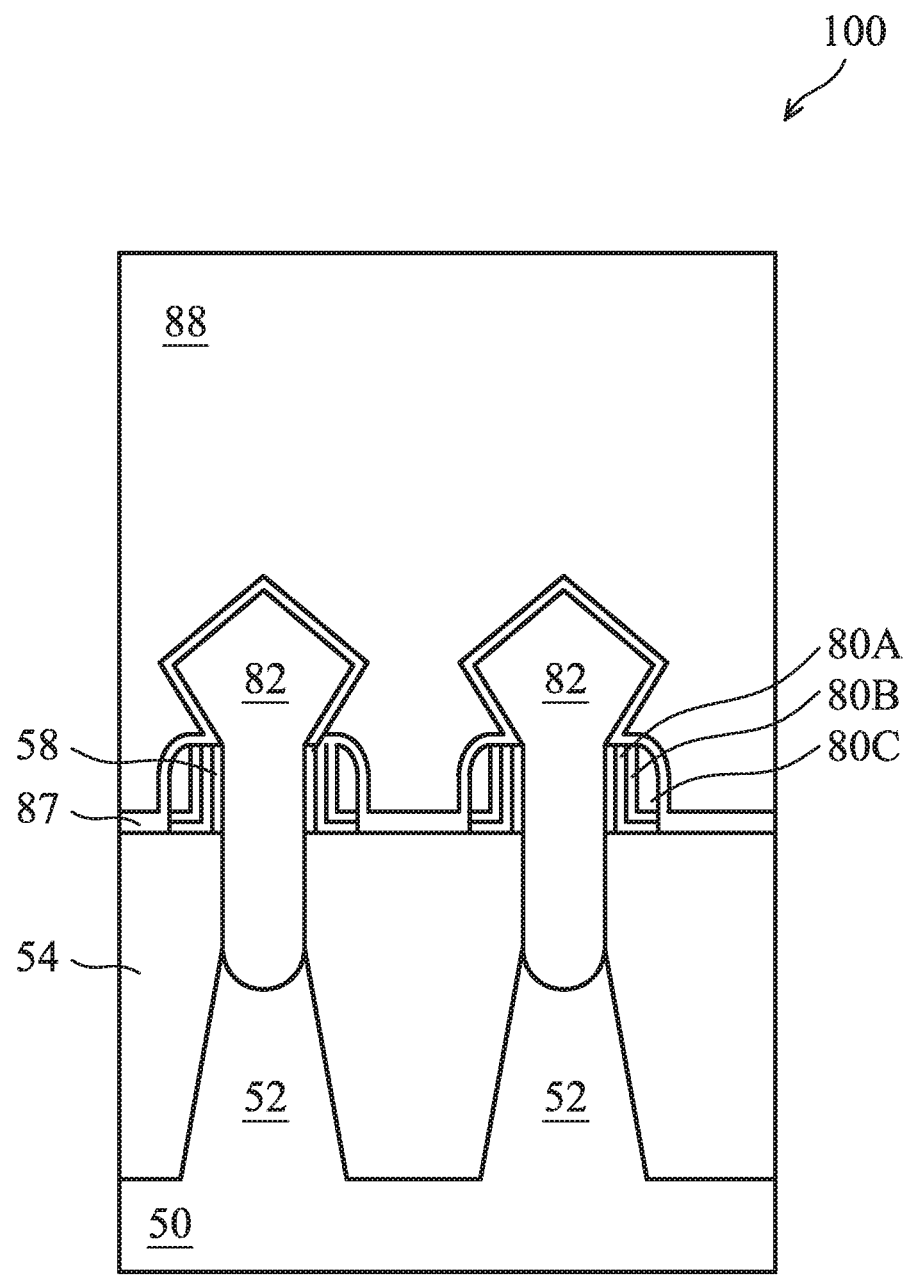

Referring to FIGS. 12A, 12B, and 12C, an etch stop layer 87 and an interlayer dielectric (ILD) 88 are deposited over the dummy gates 70, and over the source/drain regions 82. In an embodiment, the ILD 88 is a flowable film formed by a flowable CVD. In some embodiments, the ILD 88 is formed of a dielectric material such as Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, PECVD, a combination thereof, or the like. In some embodiments, the etch stop layer 87 is used as a stop layer while patterning the ILD 88 to form openings for subsequently formed contacts. Accordingly, a material for the etch stop layer 87 may be chosen such that the material of the etch stop layer 87 has a lower etch rate than the material of ILD 88.

Figure 13A:
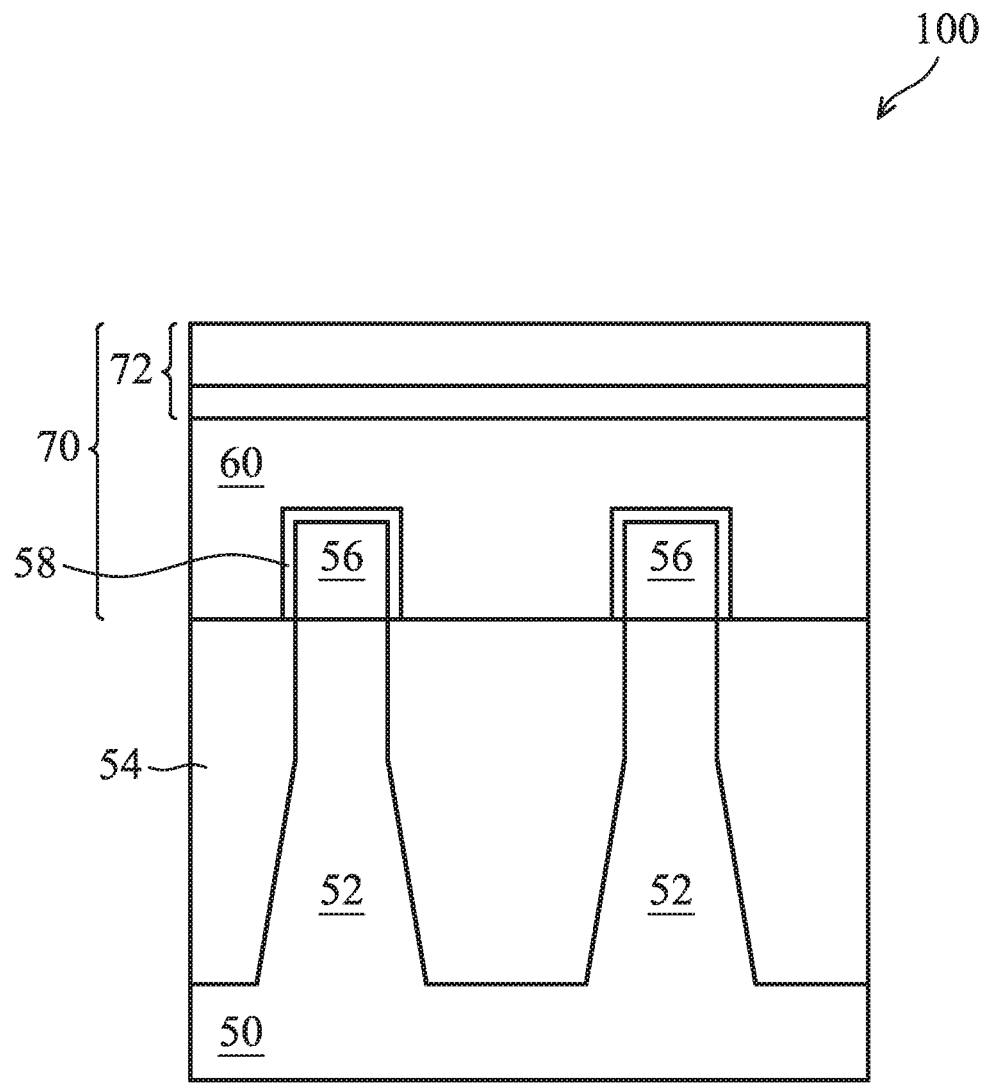
Figure 13B:
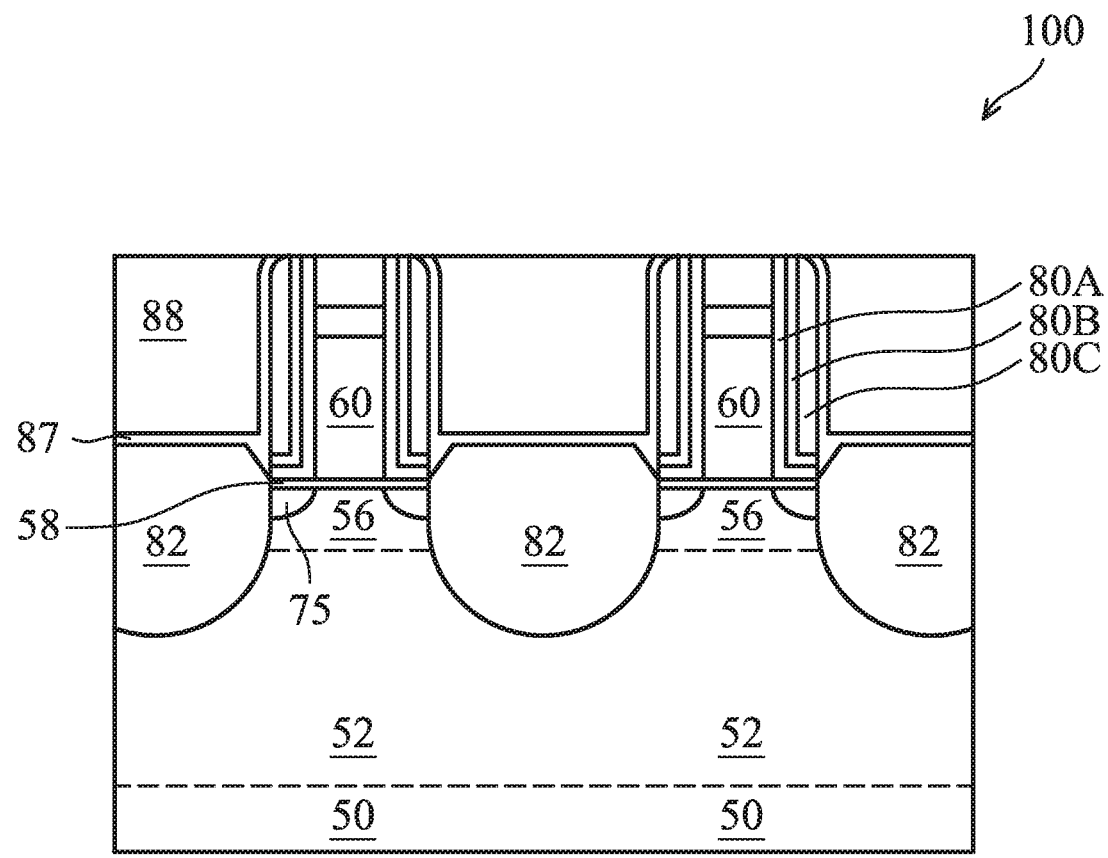
Figure 13C:
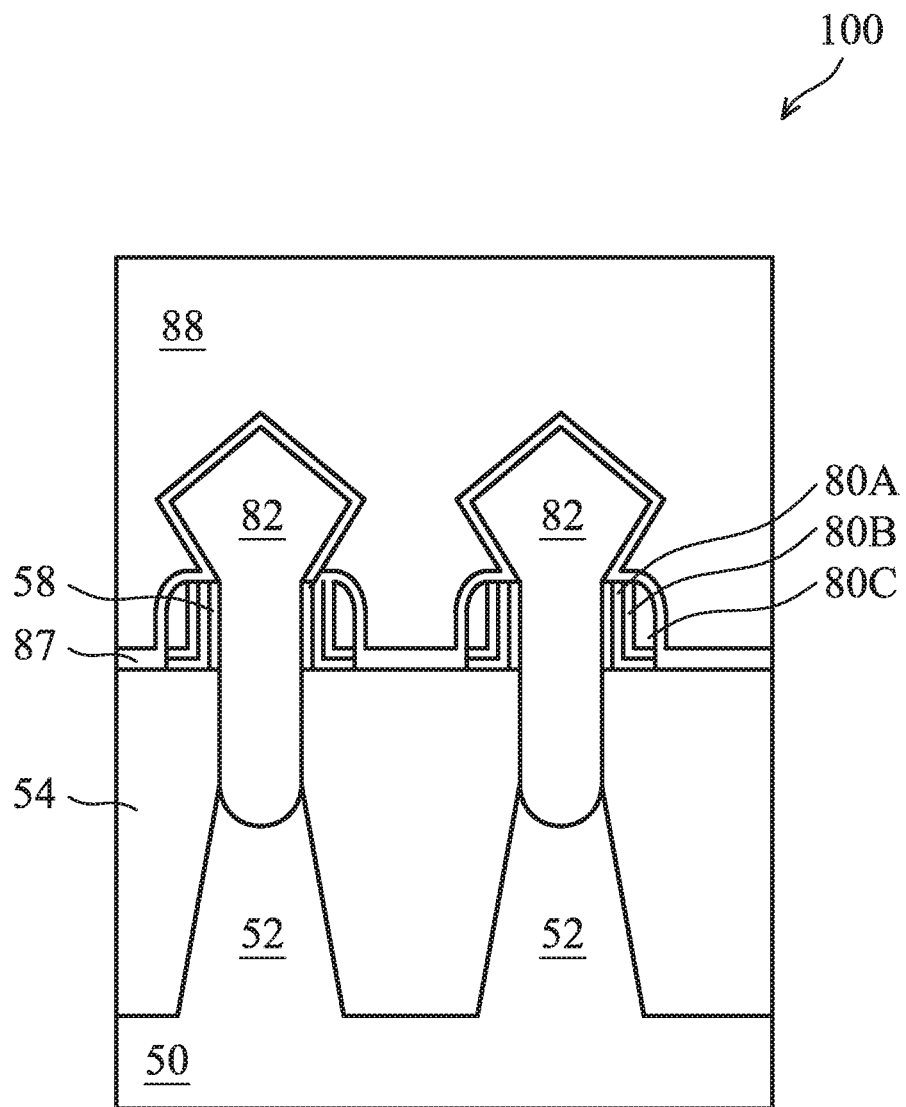

Referring to FIGS. 13A, 13B, and 13C, a planarization process, such as a CMP, may be performed to level the top surface of ILD 88 with the top surfaces of the dummy gates 70. After the planarization process, top surfaces of the dummy gates 70 are exposed through the ILD 88. In some embodiments, the CMP may also remove the masks 72, or portions thereof, on the dummy gates 70.

Figure 14A:
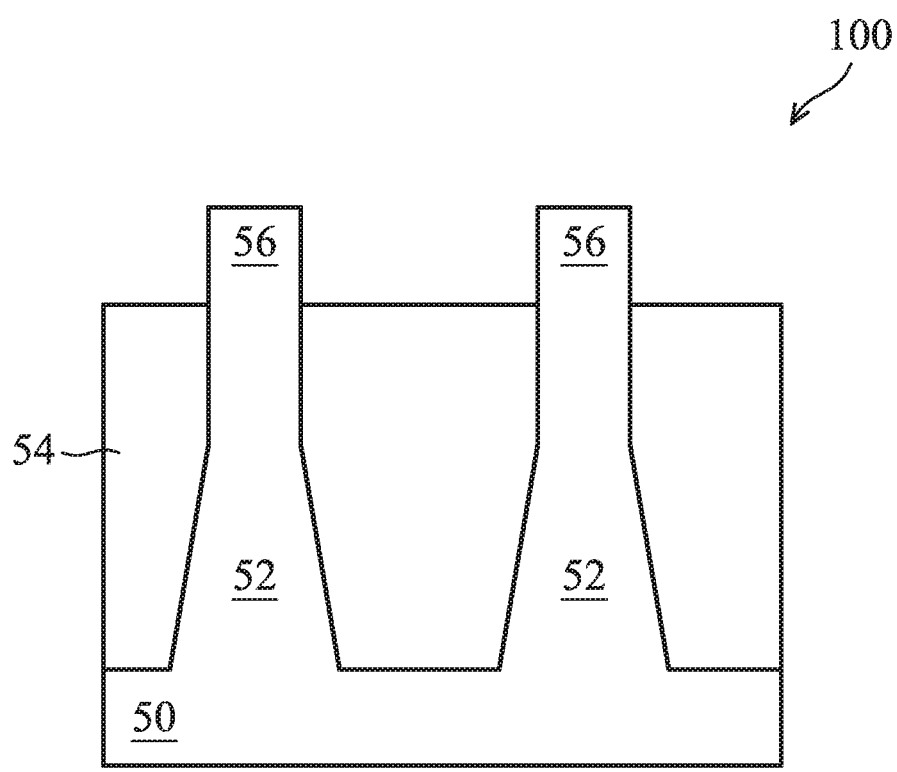
Figure 14B:
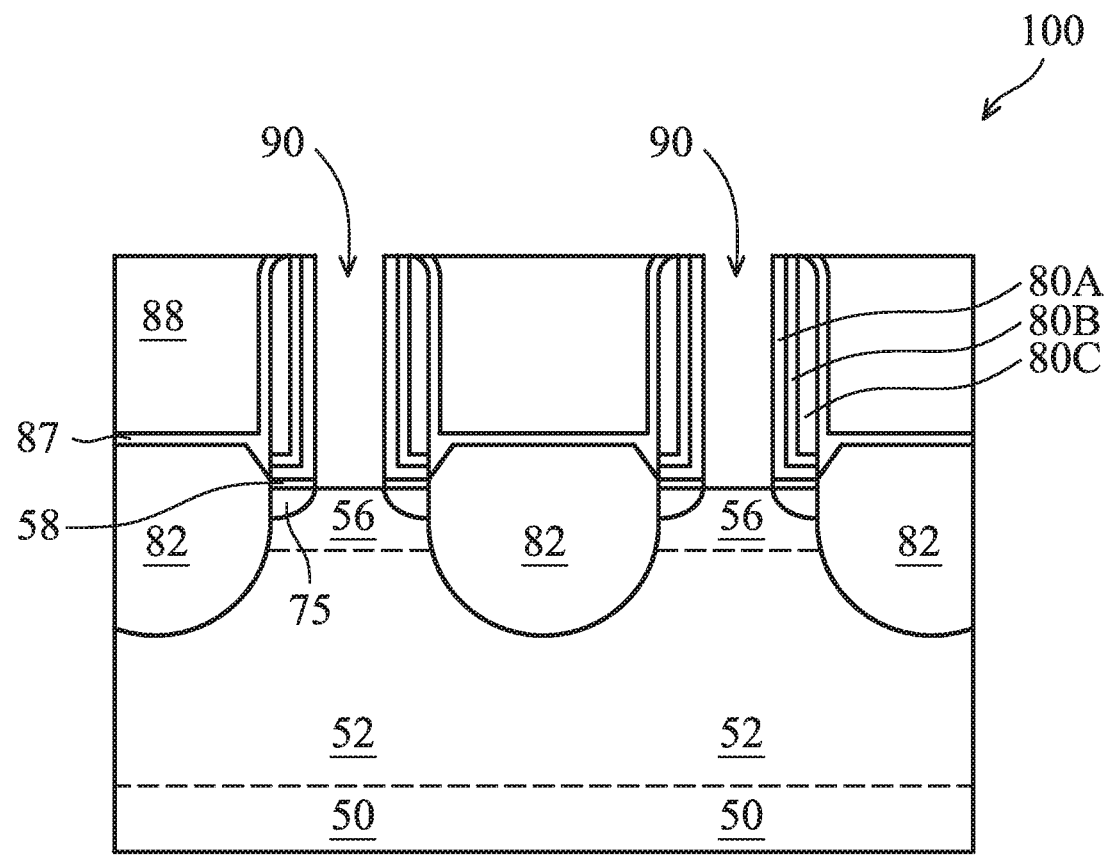
Figure 14C:
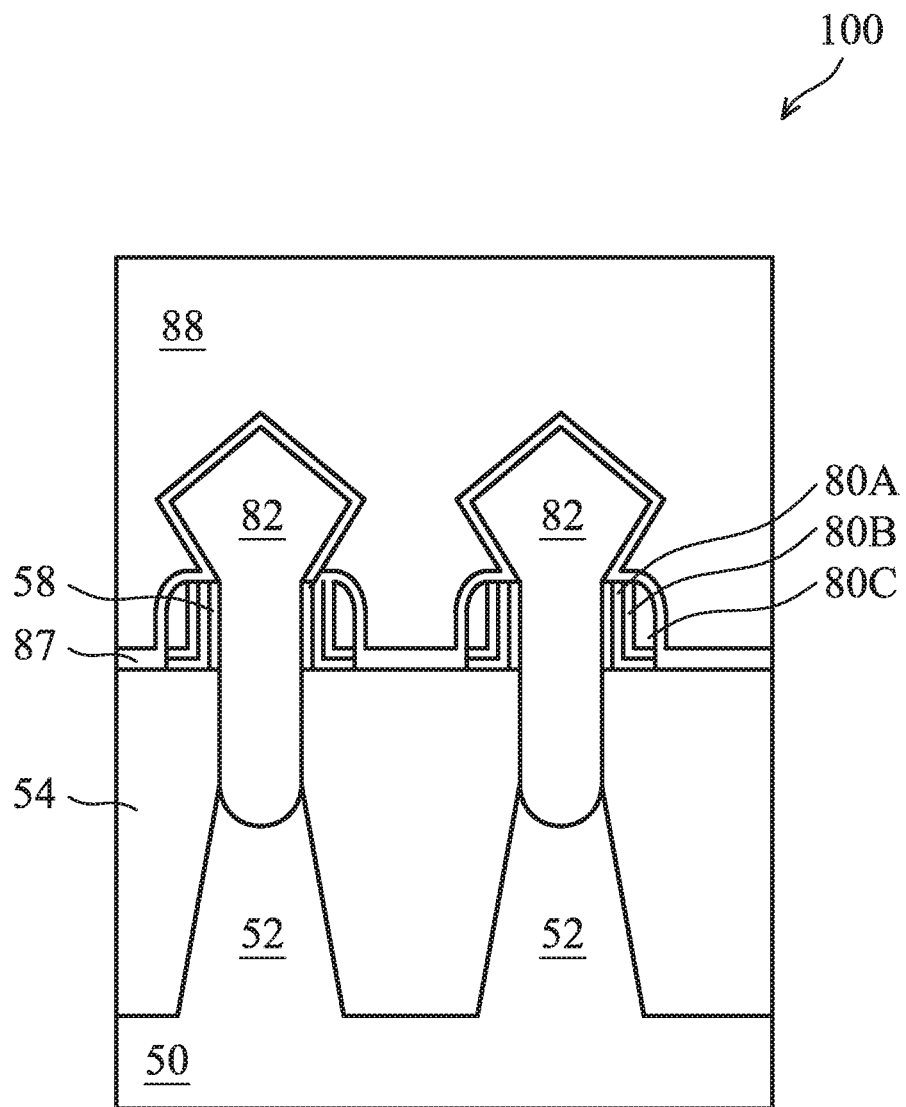

Referring to FIGS. 14A, 14B, and 14C, remaining portions of masks 72 and the dummy gates 70 are removed in an etching step(s), so that recesses 90 are formed. Each of the recesses 90 exposes a channel region of a respective fin 56. Each channel region is disposed between neighboring pairs of the epitaxial source/drain regions 82 in region 100. In some embodiments, during the removal the dummy dielectric layer 58 may be used as an etch stop layer and exposed when the dummy gates 70 are etched. The exposed dummy dielectric layer 58 may then be removed after the removal of the dummy gates 70. In some embodiments, portions of the dummy dielectric layer 58 which were not exposed by the process of removing the dummy gates 70 may remain, such as illustrated in FIG. 14B.

Figure 15A:
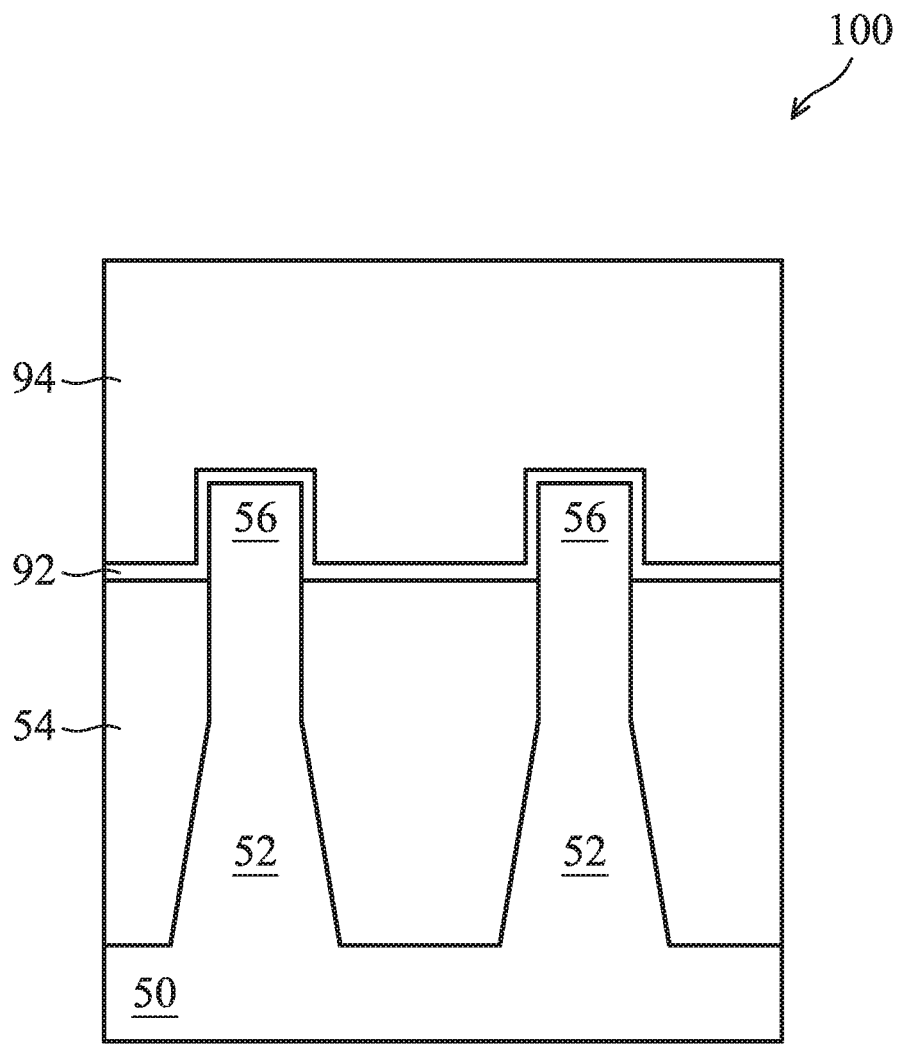
Figure 15B:
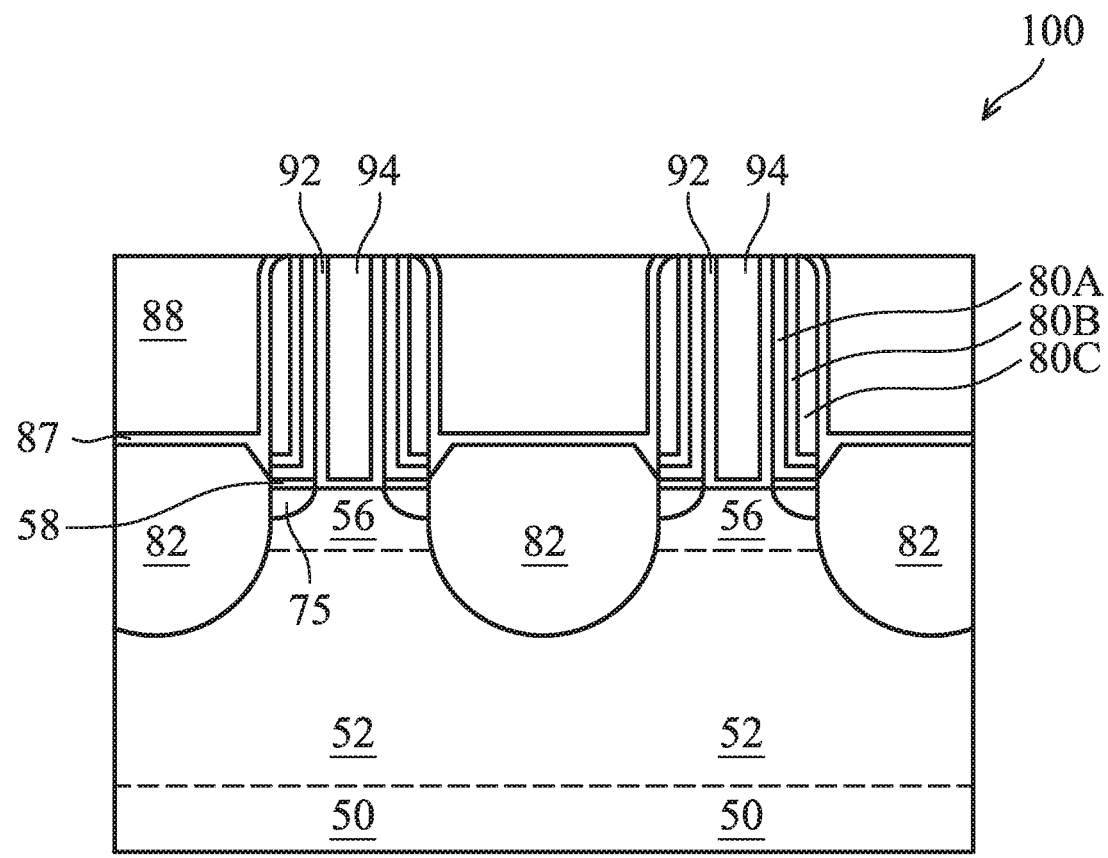
Figure 15C:
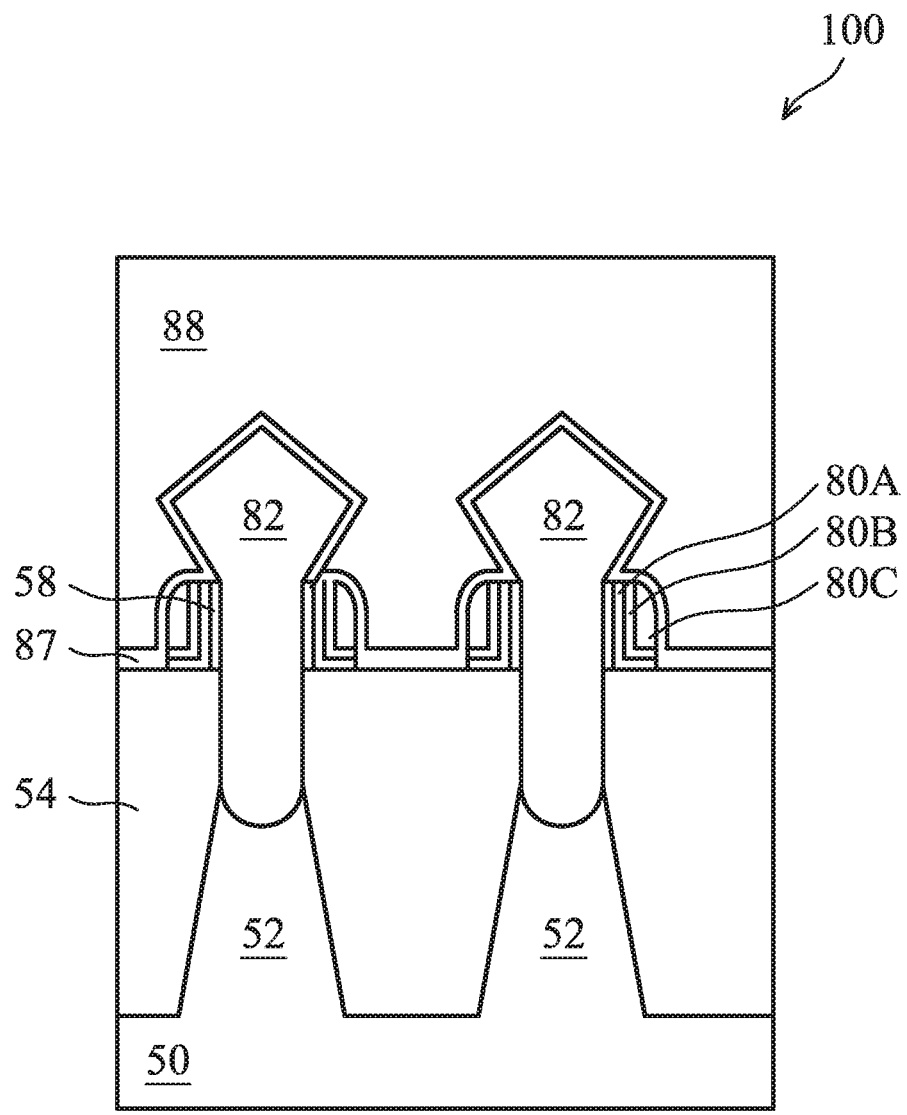

Referring to FIGS. 15A, 15B, and 15C, gate dielectric layers 92 and gate electrodes 94 are formed as replacement gates. The gate dielectric layers 92 are formed in the recesses 90, such as on the top surfaces and the sidewalls of the fins 56, on inner sidewalls of the gate spacers 122 (spacer 80A), and on a top surface of the ILD 88. In some embodiments, the gate dielectric layers 92 are deposited in a blanket-deposited layer. In some embodiments, the gate dielectric layers 92 comprise silicon oxide, silicon nitride, or multi-layers thereof. In other embodiments, the gate dielectric layers 92 include a high-k dielectric material, and in such embodiments, the gate dielectric layers 92 may have a k value greater than about 7.0, and may include a metal oxide or a silicate of Hf, Al, Zr, La, Mg, Ba, Ti, Pb, and combinations thereof. The formation methods of the gate dielectric layers 92 may include Molecular-Beam Deposition (MBD), ALD, CVD, PECVD, a combination thereof, or the like. In some embodiments, the formation may result in a conformally deposited layer with horizontal portions and vertical (or non-horizontal) portions having substantially the same thickness, for example, with the vertical thickness of the vertical portions of the dielectric layers 92 and the horizontal thickness of the horizontal portions of the dielectric layers 92 having a difference smaller than 20 percent. In some embodiments, the gate dielectric layers 92 may be thermally grown, such as described above with respect to the dummy dielectric layer 58

Next, the materials for gate electrodes 94 are deposited over the gate dielectric layers 92, respectively, and fill the remaining portions of the recesses 90. The gate electrodes 94 may be made of a metal-containing material such as TiN, TaN, TaC, TiC, TiO, Co, Ru, Al, Ag, Au, W, Ni, Ti, Cu, combinations thereof, or multi-layers thereof. After the filling of the gate electrodes 94, a planarization process, such as a CMP, may be performed to remove the excess portions of the gate dielectric layers 92 and the gate electrodes 94 that are over the top surface of ILD 88. The resulting remaining portions of material of the gate electrodes 94 and the gate dielectric layers 92 thus form replacement gates of the resulting FinFETs.

Although not illustrated, the gate electrodes 94 may include a series of one or more stacked layers (not shown). The stacked layers may be deposited in the recesses 90 over sidewalls and bottoms of the gate dielectric layers 92 and over the top surface of the ILD 88. Stacked layers may be formed by a blanket-deposition method such as ALD or CVD and have a substantially uniform thickness within process variations. In some embodiments, the formation of the gate electrodes 94 may result in a conformally deposited layers having horizontal portions and vertical (or non-horizontal) portions which have substantially the same thickness, for example, with the vertical thickness of the vertical portions of the layers and the horizontal thickness of the horizontal portions having a difference smaller than 20 percent. The stacked layers may include a diffusion barrier layer and one or more work function layers over the diffusion barrier layer. The diffusion barrier layer may be formed of titanium nitride (TiN) or thallium nitride. The work function layer(s) determine the work function of the gate, and may include at least one layer, or a plurality of layers formed of different materials. The specific material of the work function layer may be selected according to whether the respective FinFET is an n-type FinFET or a p-type FinFET. For example, when the FinFET is an n-type FinFET, the work function layer may include an AlTiC layer. When the FinFET is a p-type FinFET, the work function layer may include an AlTiN and/or AlTiC layer. After the deposition of the work function layer(s), a barrier layer (not shown), which may be another TiN layer, may be formed.

Figure 16A:
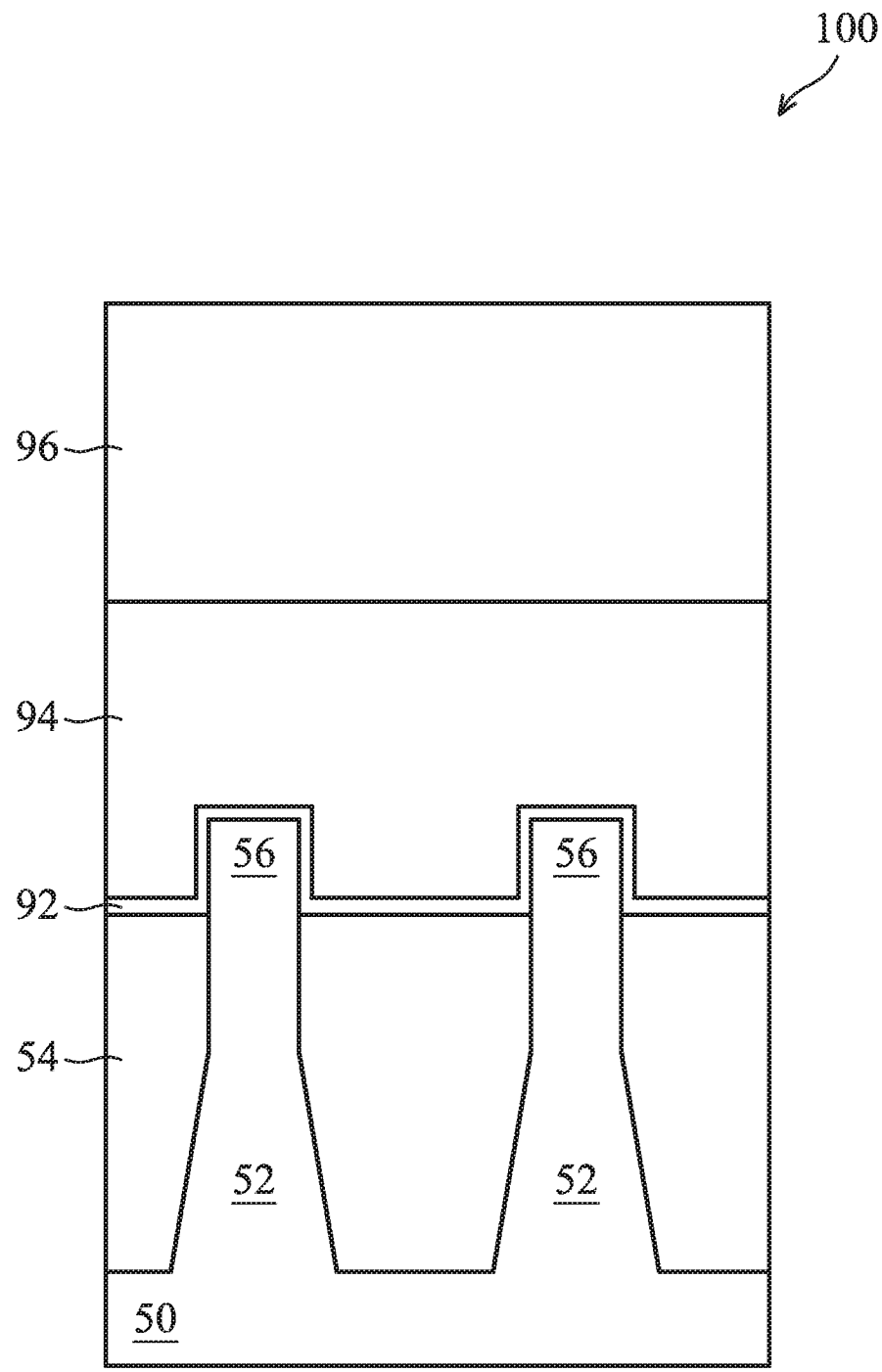
Figure 16B:
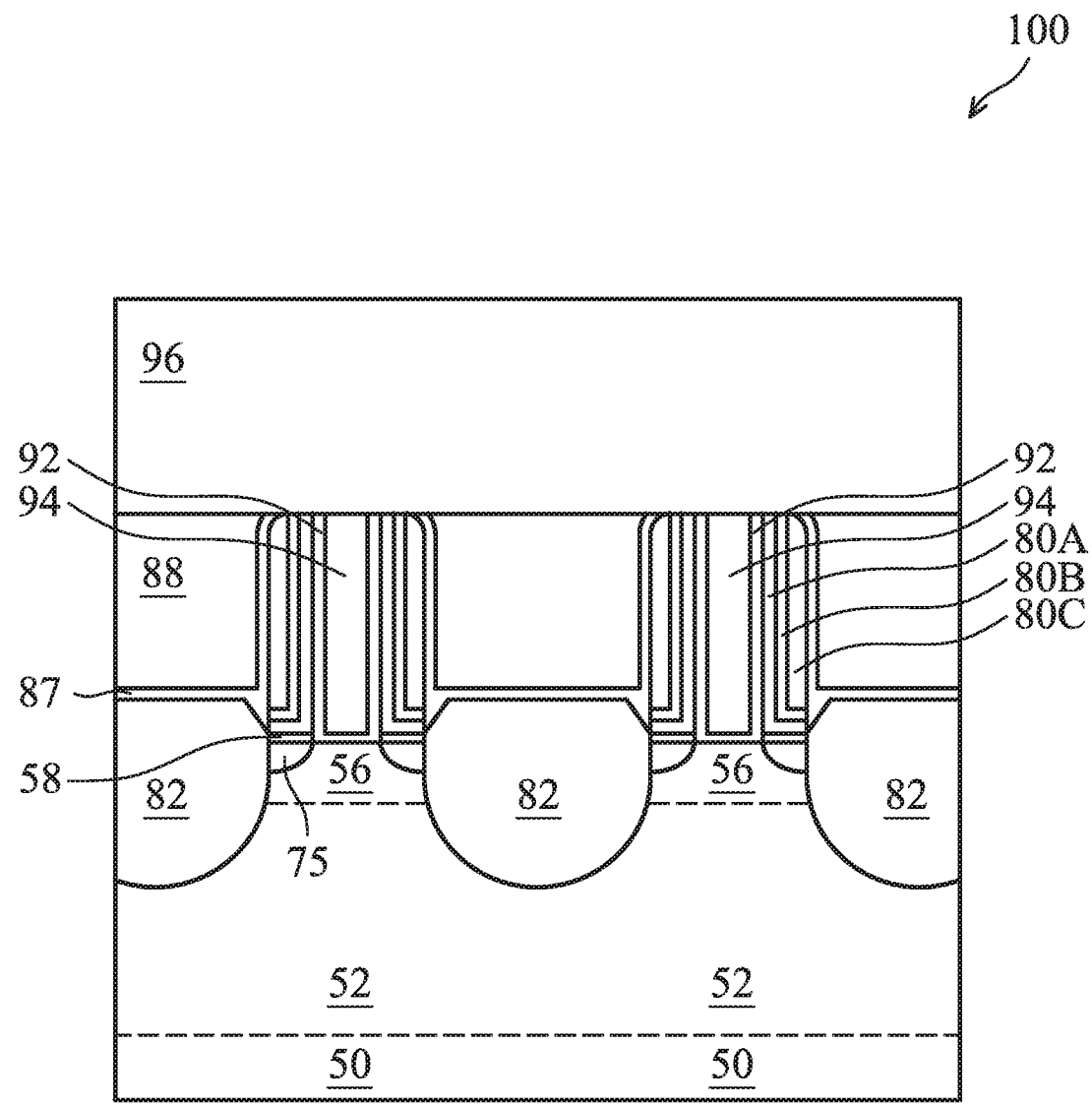
Figure 16C:
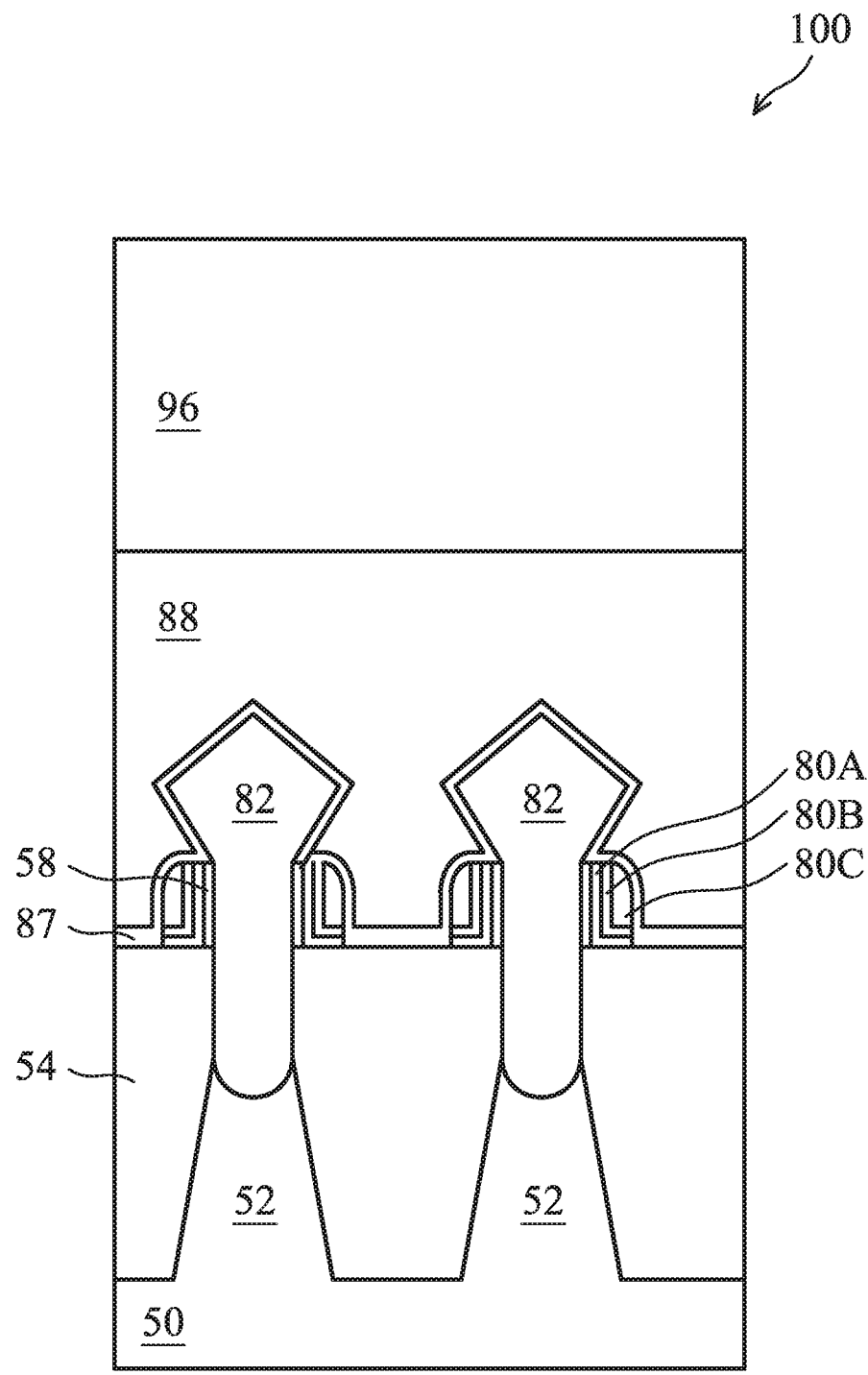

FIGS. 16A, 16B, and 16C illustrate the formation of a second ILD 96 deposited over the ILD 88 and over the replacement gates. ILD 96 may be formed is formed using similar materials and methods used to form ILD 88, described above with reference to FIGS. 12A, 12B, and 12C, and the description is not repeated. In some embodiments, ILD 88 and ILD 96 may be formed of the same material. In other embodiments, ILD 88 and ILD 96 may be formed of different materials. In some embodiments, ILD 96 may be a thick layer (not shown), used following removal of ILD 88, which may have been used as a mask.

Figure 17A:
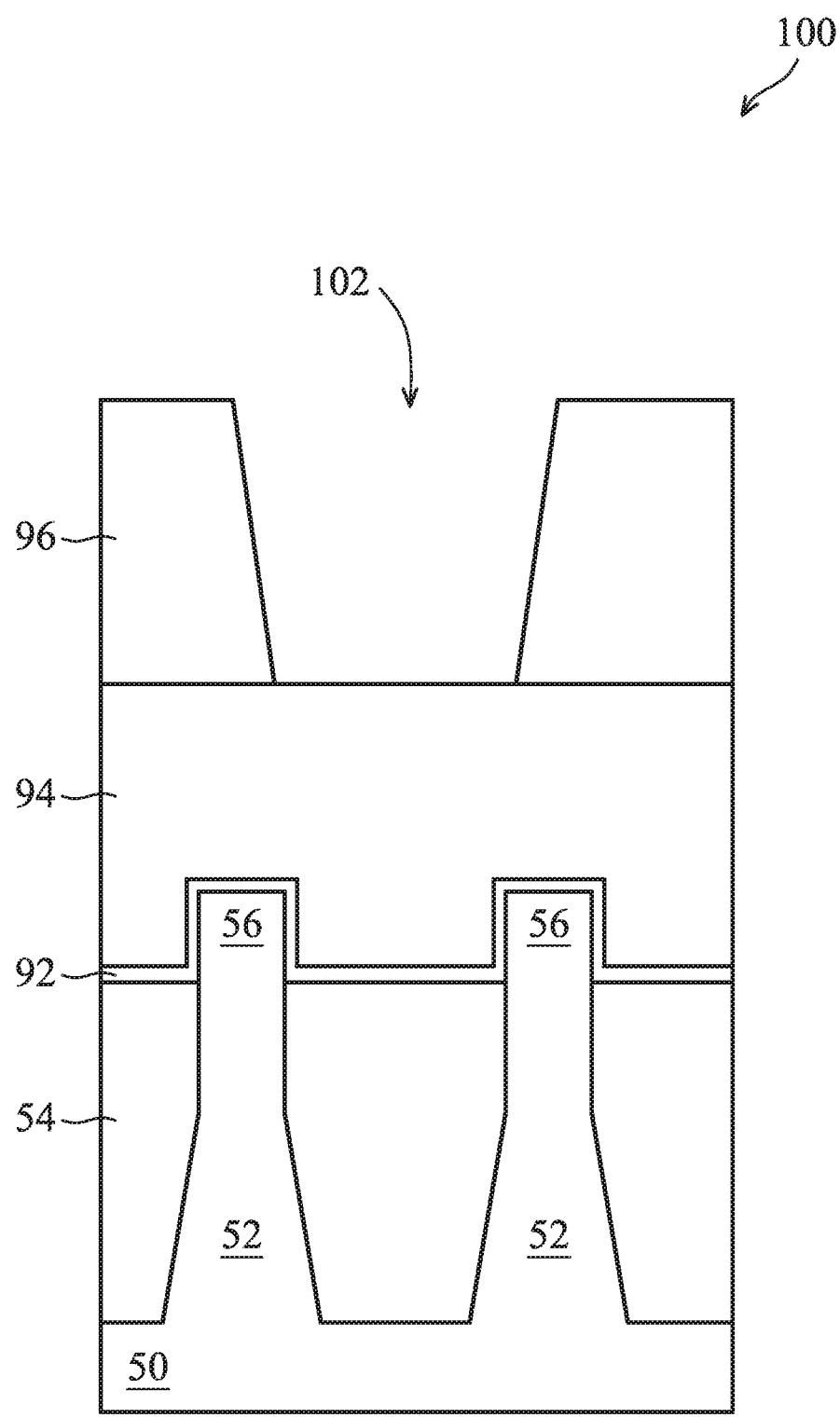
Figure 17B:
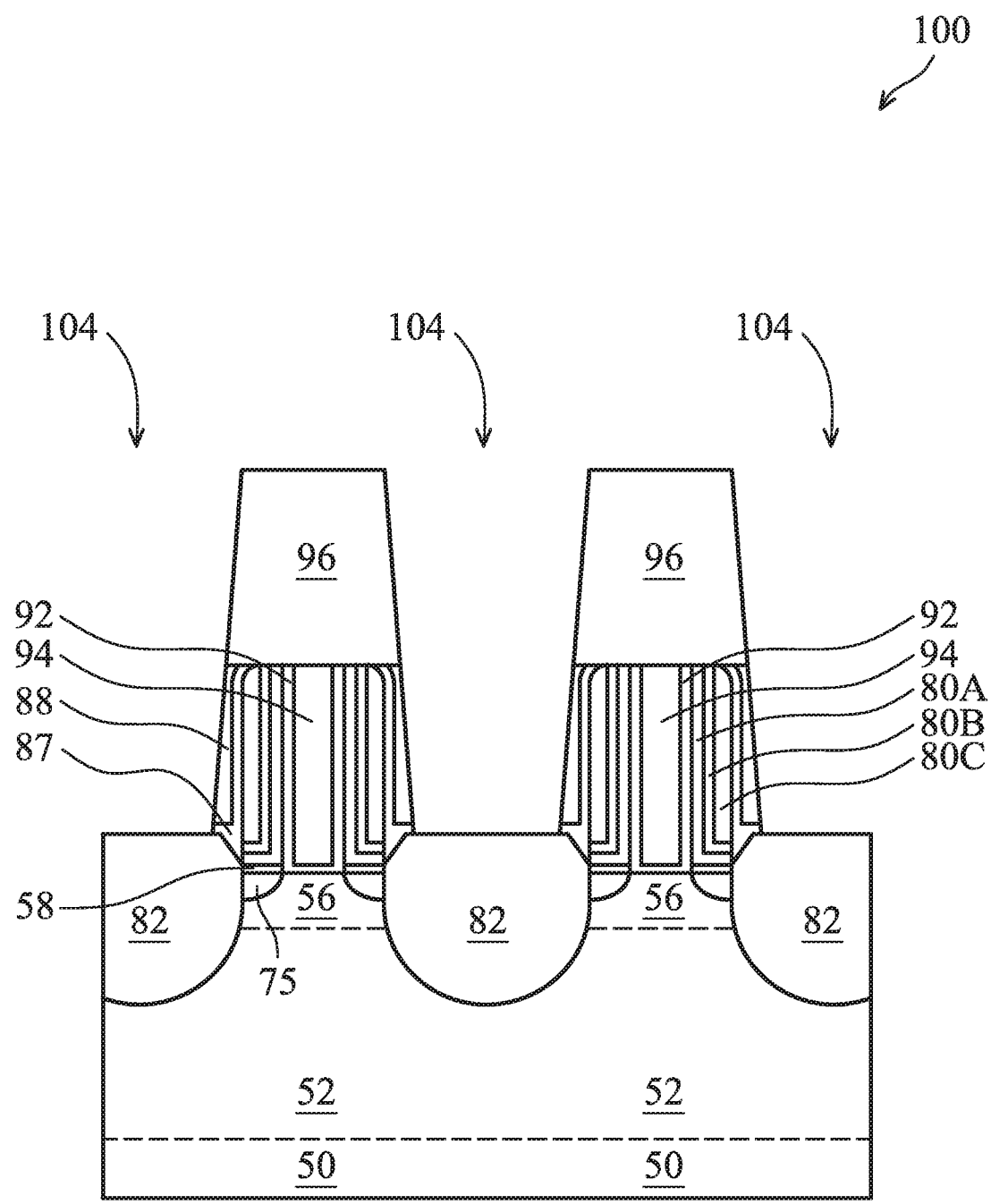
Figure 17C:
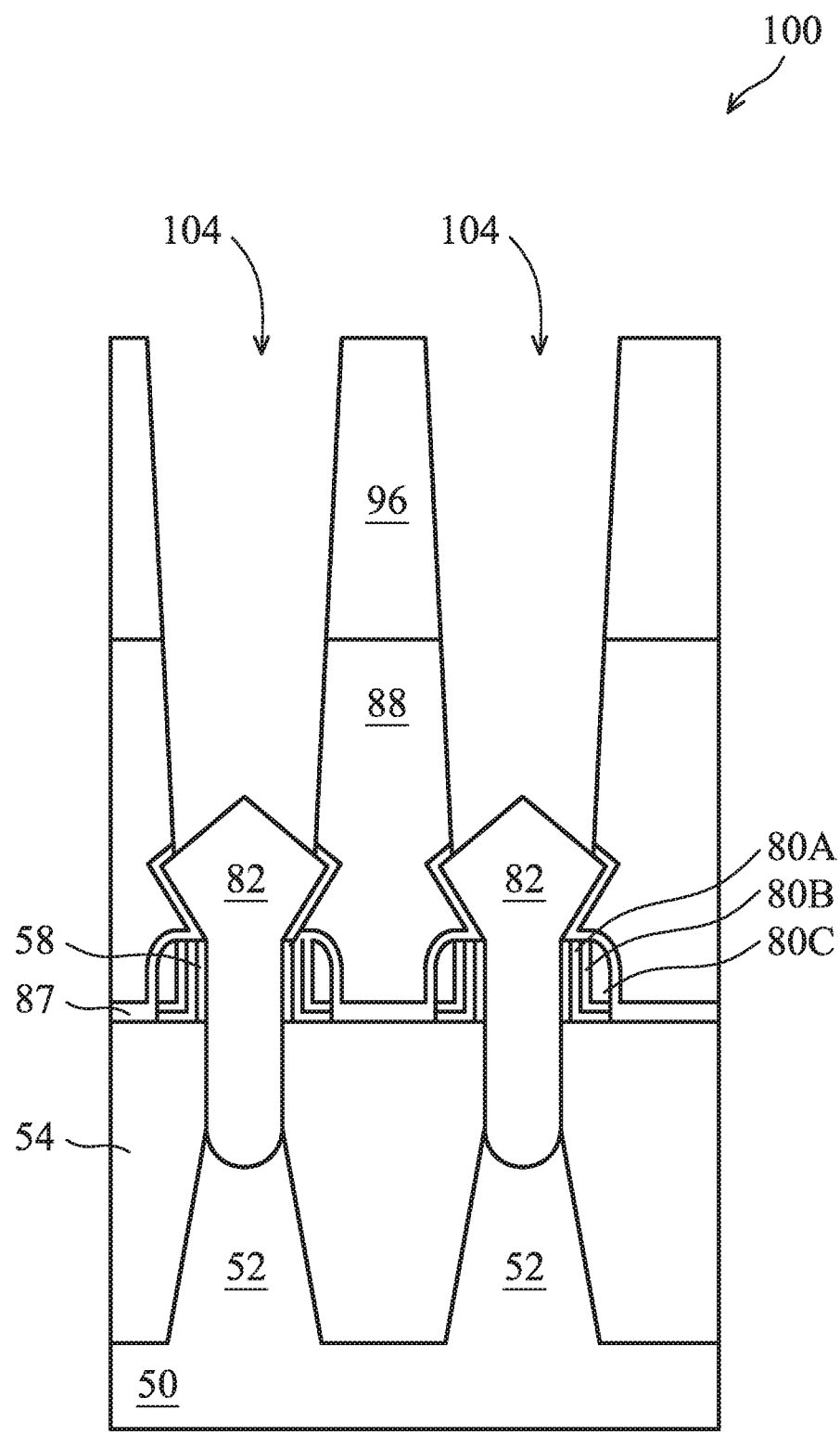

FIGS. 17A, 17B, and 17C illustrate the formation of contact openings 102 through ILD 96 to the gate electrode 94 and contact openings 104 through ILD 96 and ILD 88 to the source/drain regions 82. Contact openings 102 and 104 may be formed using any suitable patterning technique, such as a photolithography technique, to form a mask over ILD 96 and etch through ILD 96 to form contact openings 102 and etch through ILD 96 and ILD 88 to form contact openings 104. In some embodiments, the formation of contact openings 102 and 104 may be done in separate steps. In some embodiments, the formation of contact openings 102 and 104 may be done simultaneously, using the etch stop layer 87 to protect the underlying structures. Following the formation of the contact openings 102 and 104 through ILD 96 and through ILD 96 and ILD 88, respectively, the exposed portion of the etch stop layer 87 may be removed by a subsequent etch which is selective to the material of the etch stop layer 87.

Figure 18A:
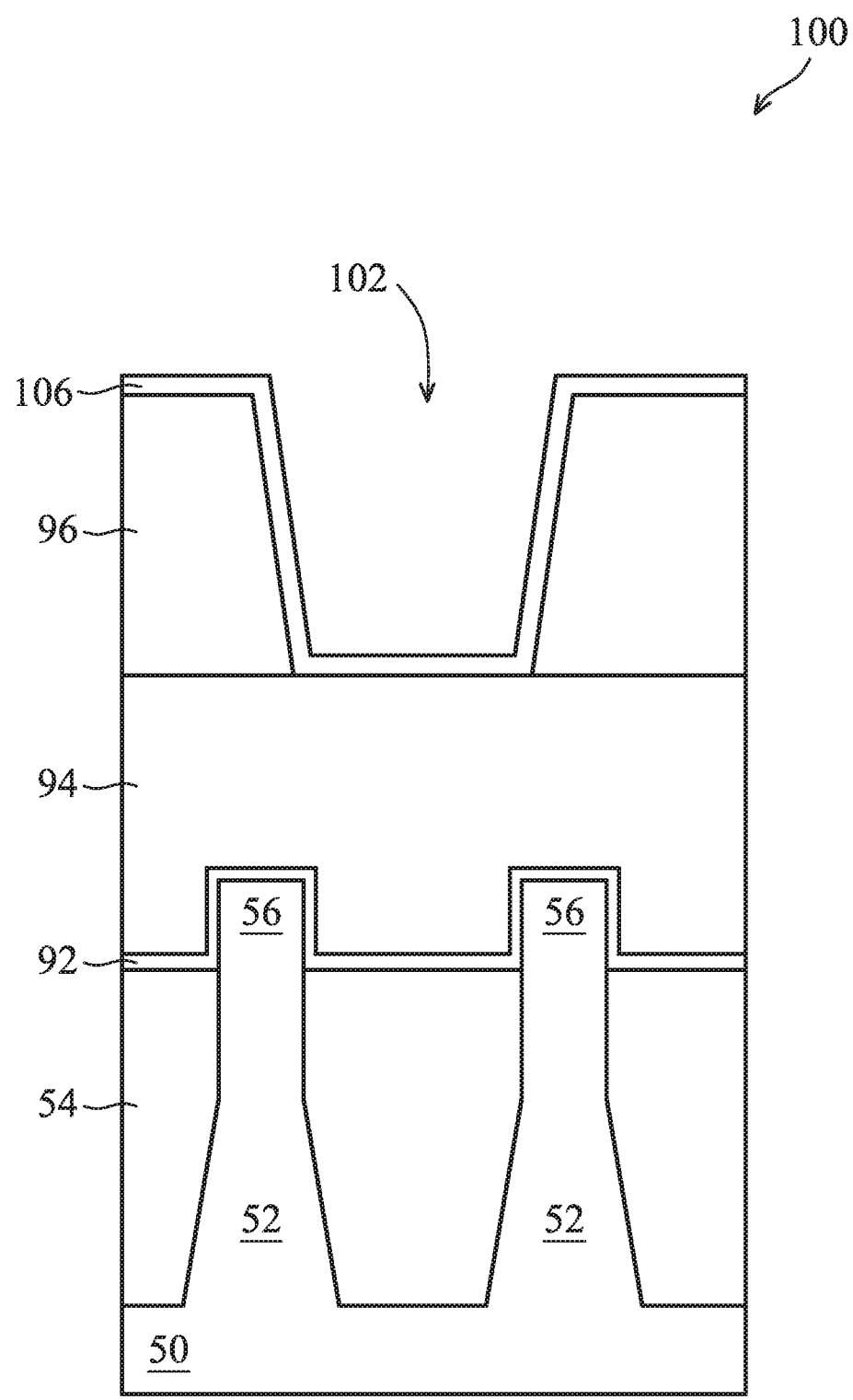

Referring to FIGS. 18A through 23C, a contact formation process is illustrated, in accordance with some embodiments. As part of the contact formation process, which is described in greater detail below, an $N_2/H_2$ plasma treatment process may be used to improve adhesion for the contact to the replacement gate electrode or to the source/drain region. FIGS. 18A, 18B, and 18C illustrate the formation of a metal layer 106 in the contact openings 102 and 104. The metal layer 106 may be formed of one or more layers of titanium, nickel, cobalt, tungsten, platinum, molybdenum, tantalum, the like, or a combination thereof. The metal layer 106 may be formed by PVD, CVD, ALD, sputter deposition, the like, or a combination thereof to a thickness from about 30 Å to about 200 Å, though the metal layer 106 may be thinner or thicker, as appropriate. In some embodiments the metal layer 106 may comprise titanium or other suitable metal formed by a CVD process or the like.

Figure 18B:
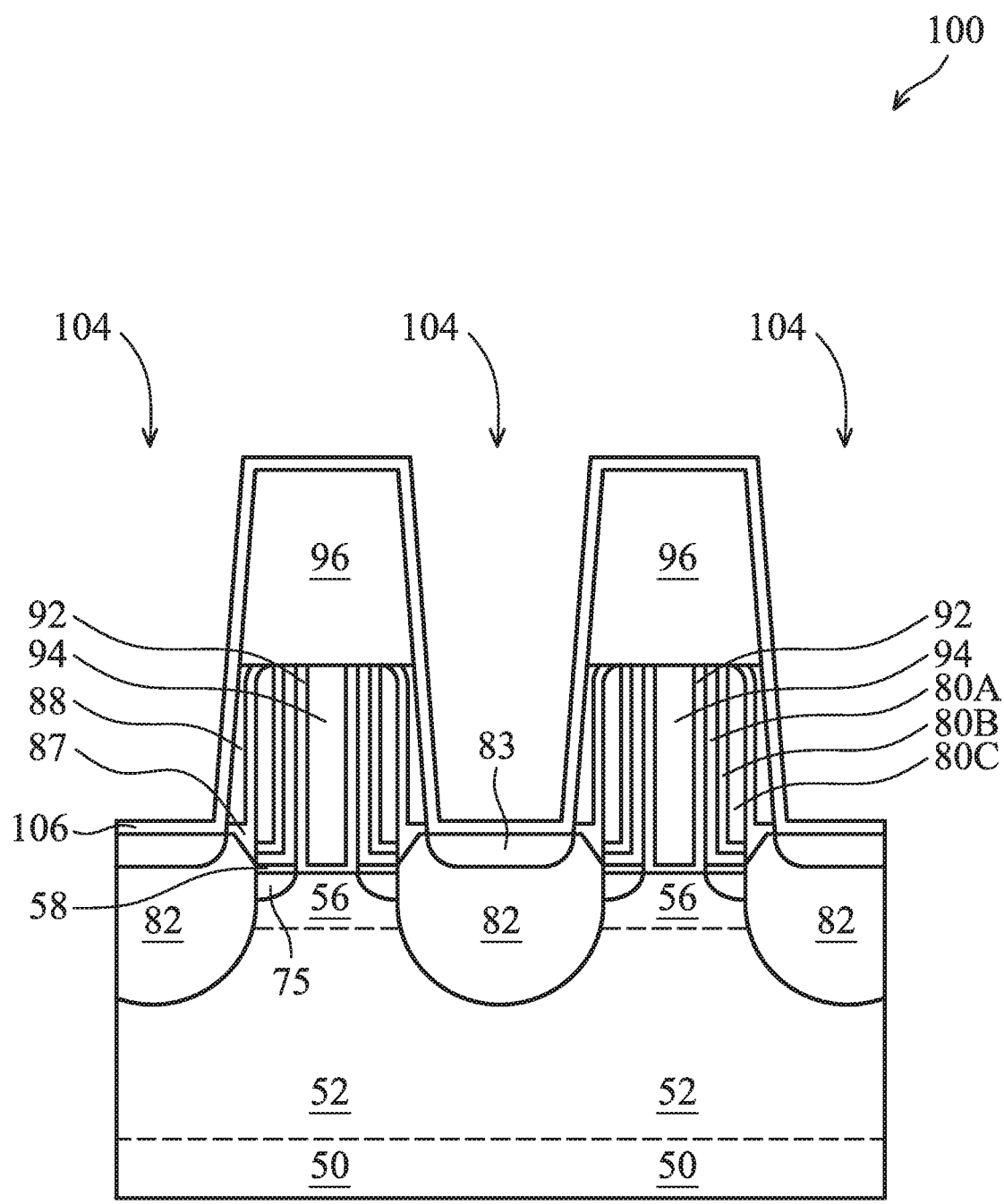
Figure 18C:
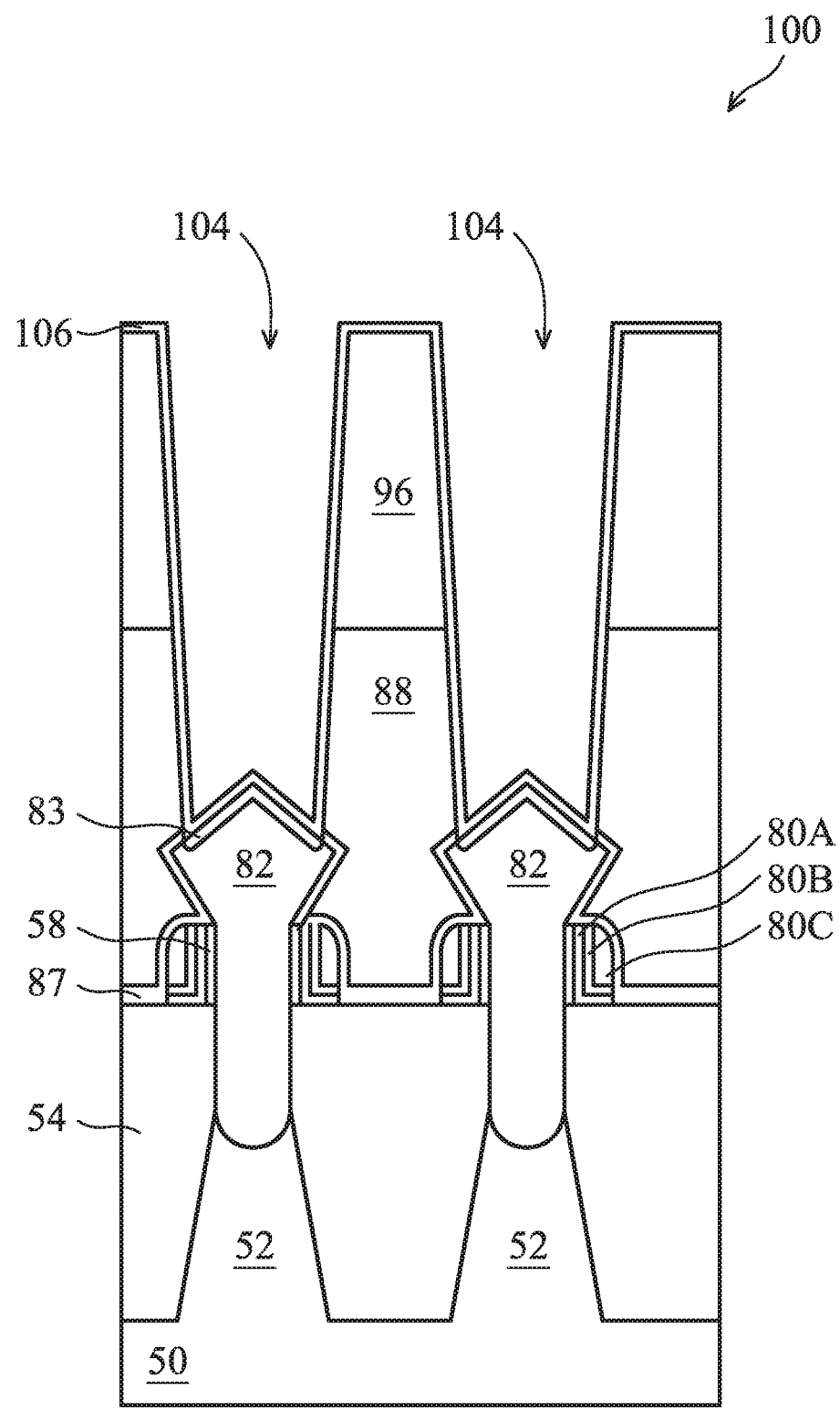
Figure 19A:
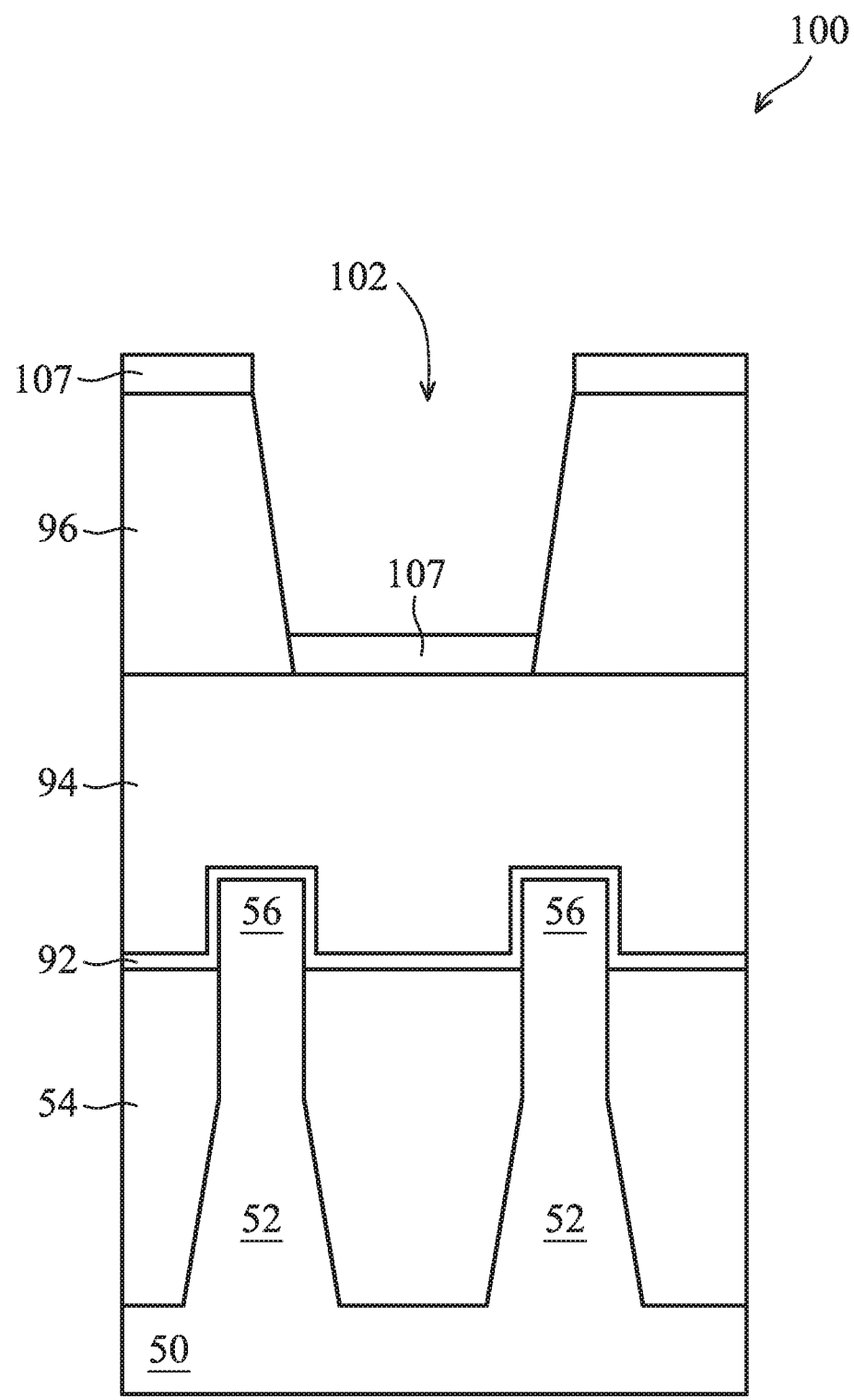
Figure 19B:
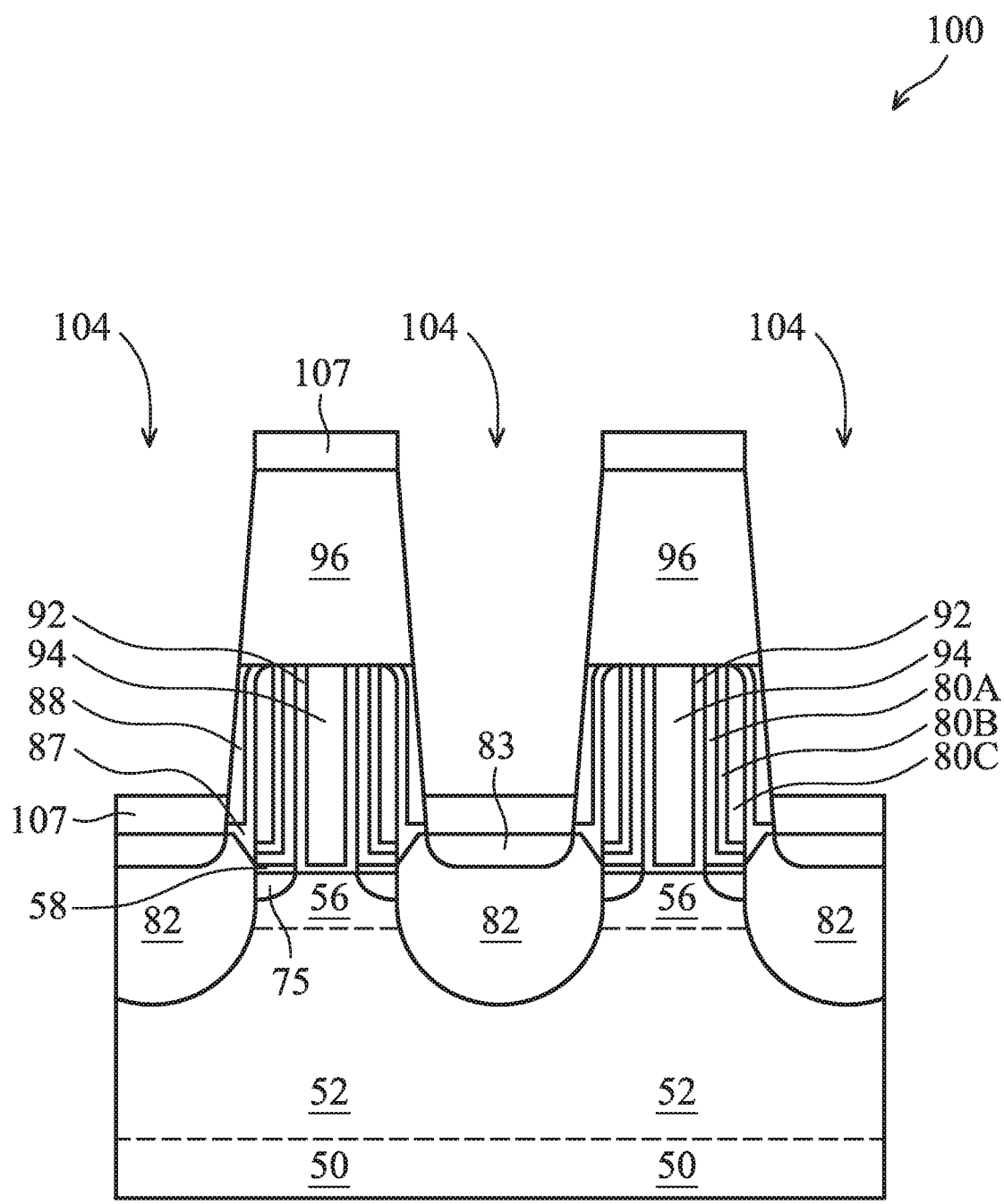
Figure 19C:
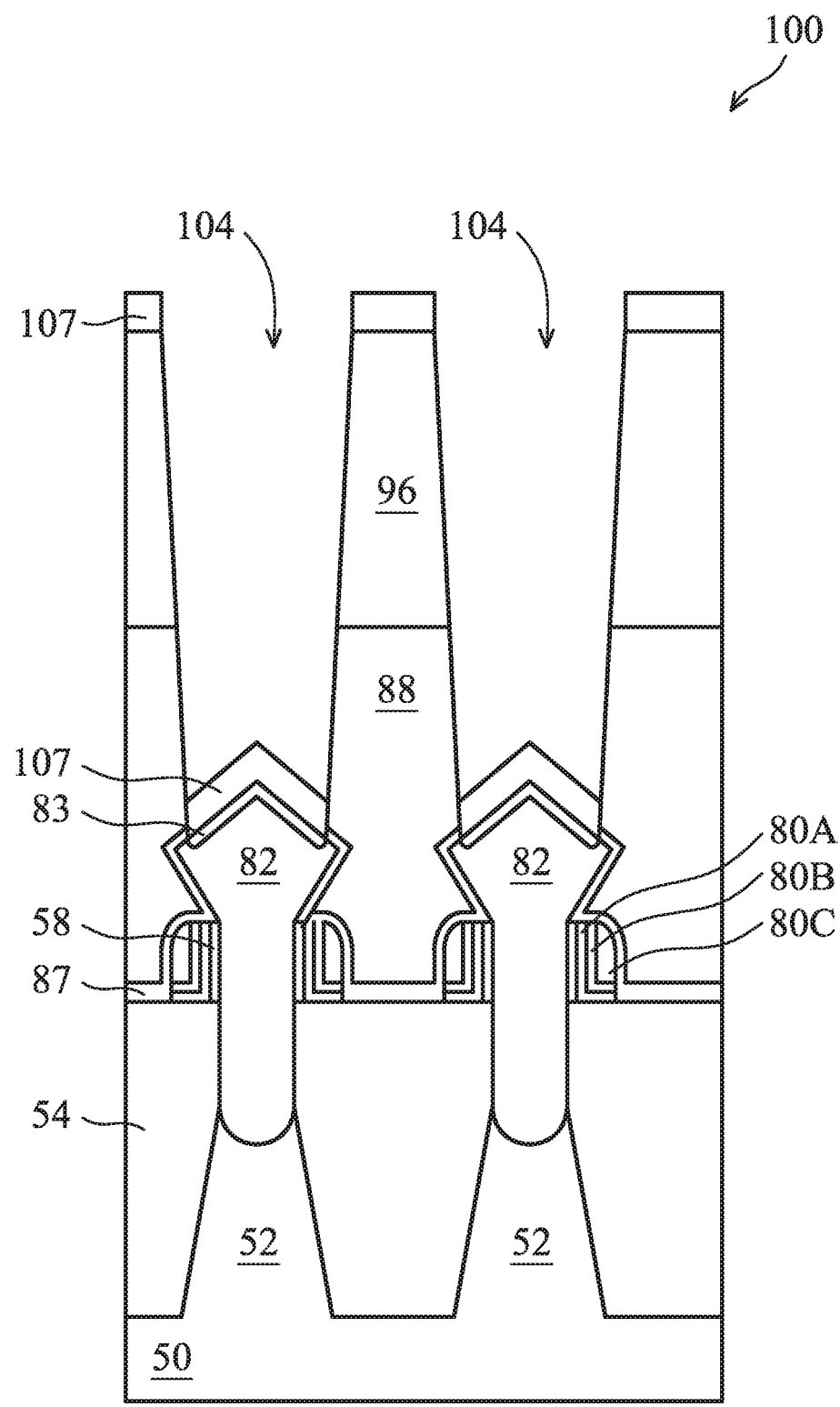

FIGS. 19A, 19B, and 19C illustrate the formation of metal layers 107 in the contact openings 102 and 104, in accordance with some embodiments. Processes corresponding to FIGS. 19A, 19B, and 19C are performed instead of the forming of metal layer 106 as illustrated with respect to FIGS. 18A, 18B, and 18C. Accordingly, FIGS. 19A, 19B, and 19C respectively proceed from the process flow with respect to FIGS. 17A, 17B, and 17C. In some technology nodes metal layers 107 may be formed on non-vertical surfaces of the insulating layers and of the source/drain region 82. In such embodiments, the metal layers 107 may be formed of one or more layers of titanium, nickel, cobalt, tungsten, platinum, molybdenum, tantalum, the like, or a combination thereof. The metal layer 107 may be formed by a suitable deposition process, such as by PVD, sputter deposition, the like, or a combination thereof to a thickness from about 30 Å to about 200 Å, though the metal layer 107 may be thinner or thicker, as appropriate. For example, in some embodiments the metal layer 107 may comprise titanium or other suitable metal formed by a PVD process or the like.

Following the formation of metal layer 106 of FIGS. 18A, 18B, and 18C or metal layers 107 of FIGS. 19A, 19B, and 19C, a silicide 83 may be formed in the source drain region 82. The silicide 83 may be formed from the metal layer 106 or metal layers 107. The formation of the silicide 83 includes performing an annealing process to cause the silicide 83 to form from a reaction between the metal layer 106 or metal layers 107 and the material of the source/drain region 82. In some embodiments, the annealing process is performed using a rapid thermal anneal, thermal soaking, spike annealing, flash annealing, laser annealing, microwave annealing, the like, or a combination thereof. In some embodiments, the annealing process may be performed at a temperature greater than about 500° C. to about 950° C., though other temperatures are contemplated and may be used as appropriate.

In some embodiments, the metal layer 106 or metal layers 107 may be consumed in the silicidation process. In some embodiments, if any metal remains unreacted the remaining metal layer 106 or metal layers 107 may be removed. In other embodiments, the metal layer may be restored by the deposition of another metal layer using processes and materials similar to the metal layer 106 or metal layers 107 (see FIGS. 18A, 18B, and 18C and FIGS. 19A, 19B, and 19C), while in other embodiments the unreacted portions of the metal layer 106 or metal layers 107 may remain.

The description below with respect to FIGS. 20A through 23C illustrates embodiments using metal layer 106, described above with respect to FIGS. 18A, 18B, and 18C, however, one should understand that metal layer 107 of FIGS. 19A, 19B, and 19C may be substituted for metal layer 106 in the discussion below with respect to FIGS. 20A through 23C.

Figure 20A:
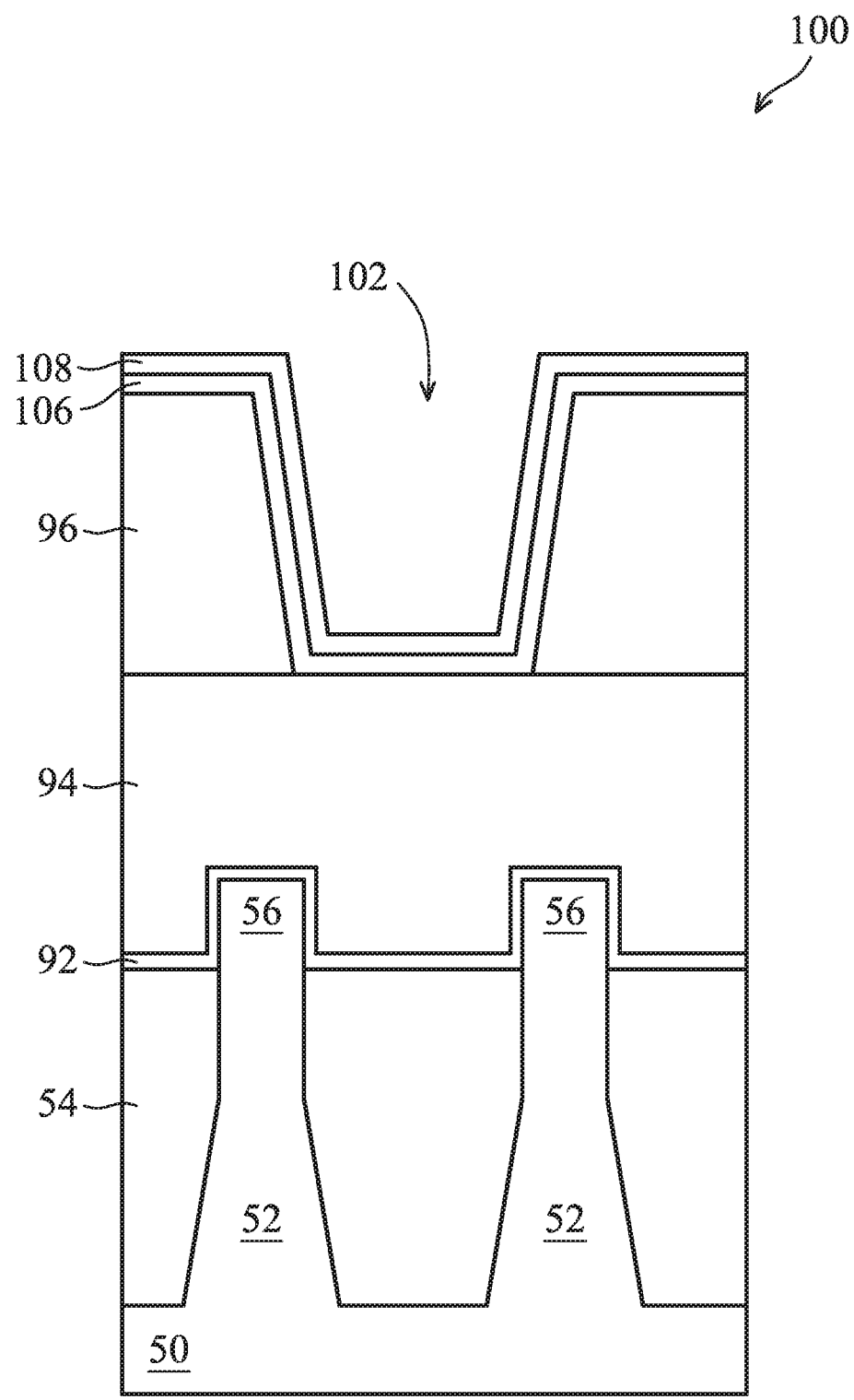
Figure 20B:
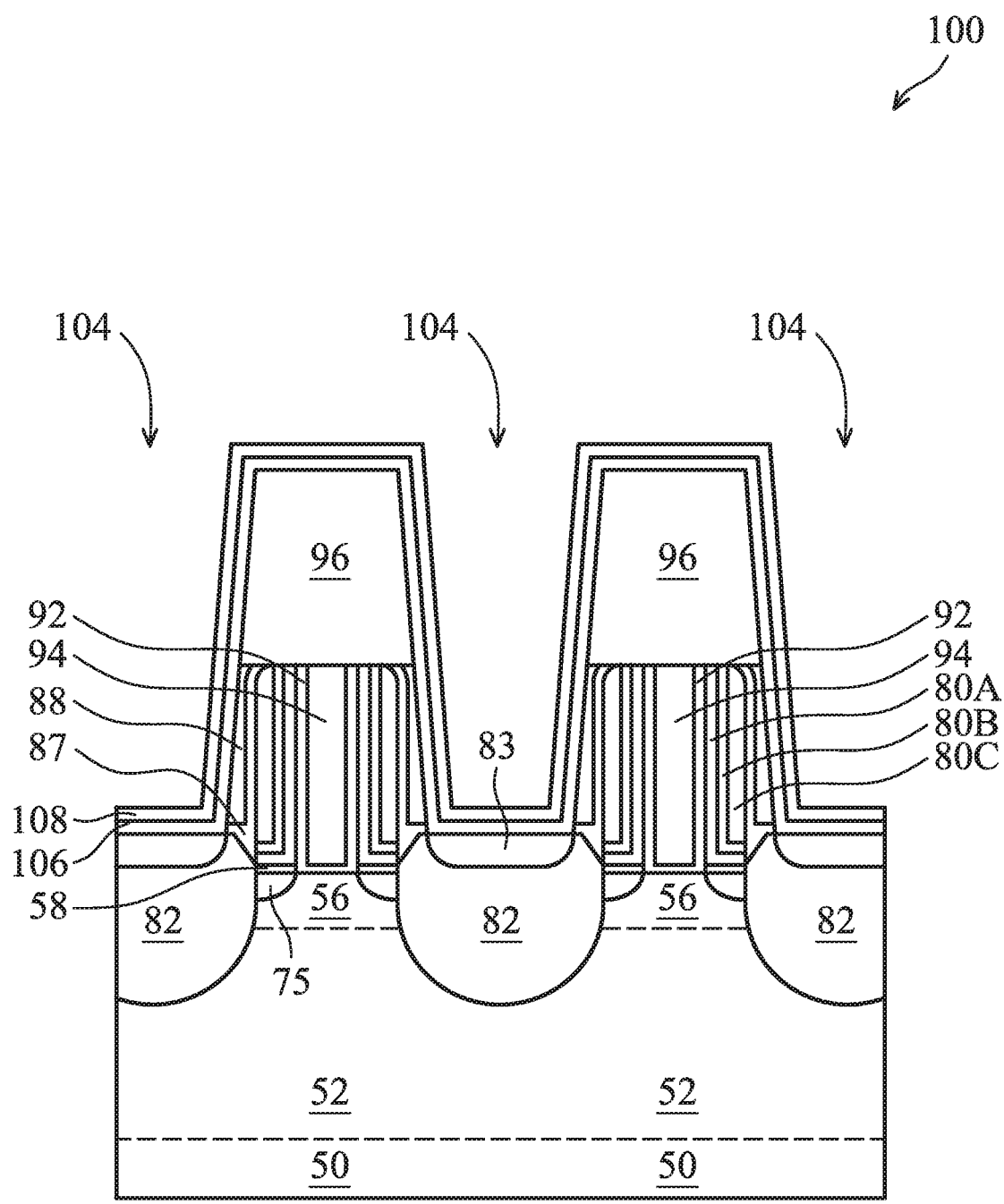
Figure 20C:
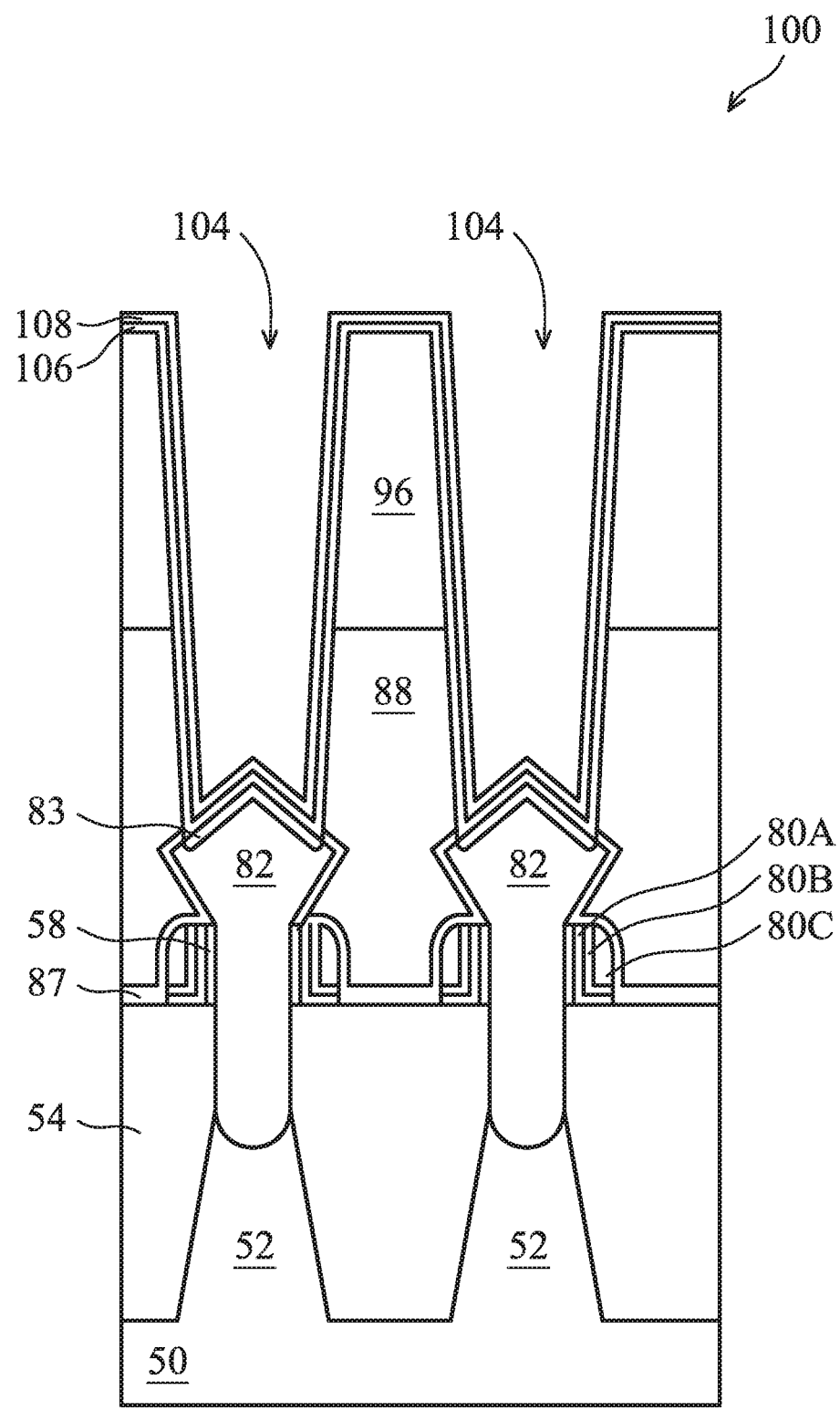

Referring to FIGS. 20A, 20B, and 20C, the formation of a metal nitride layer 108 in the contact openings 102 and 104 is illustrated, in accordance with some embodiments. The metal nitride layer 108 may comprise titanium nitride, tantalum nitride, the like, or a combination thereof. The metal nitride layer 108 may be a metal nitride of the metal used in the metal layer 106. The metal nitride layer 108 may be formed by PVD, CVD, ALD, the like, or a combination thereof to a thickness from about 5 Å to about 50 Å, though other thicknesses are contemplated and may be used. In some embodiments the metal nitride layer 108 may comprise titanium nitride formed by a CVD process or the like. The metal nitride layer 108 may be formed such that it does not have a crystalline structure, or in other words, the metal nitride layer 108 may be amorphous. In such embodiments, a subsequently deposited contact plug would have poor adhesion to the metal nitride layer 108 at least in part because the metal nitride layer 108 is non-crystalline.

In some embodiments, the silicide formation may be performed after formation of the metal nitride layer 108. In such embodiments, the metal nitride layer 108 may act as a capping layer to reduce the loss of the metal layer 106 or metal layers 107 in the anneal process of the silicide formation.

Figure 21A:
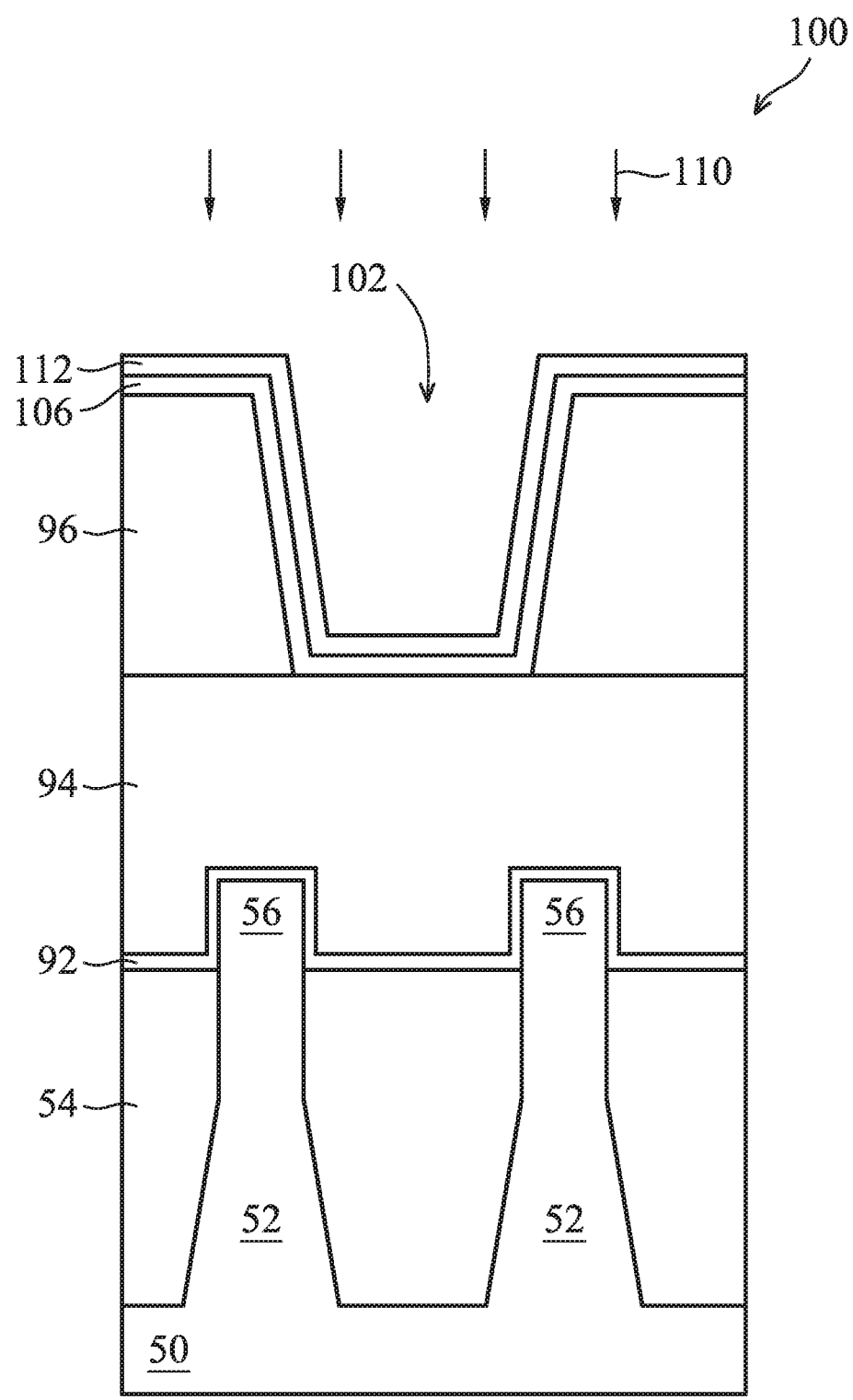
Figure 21B:
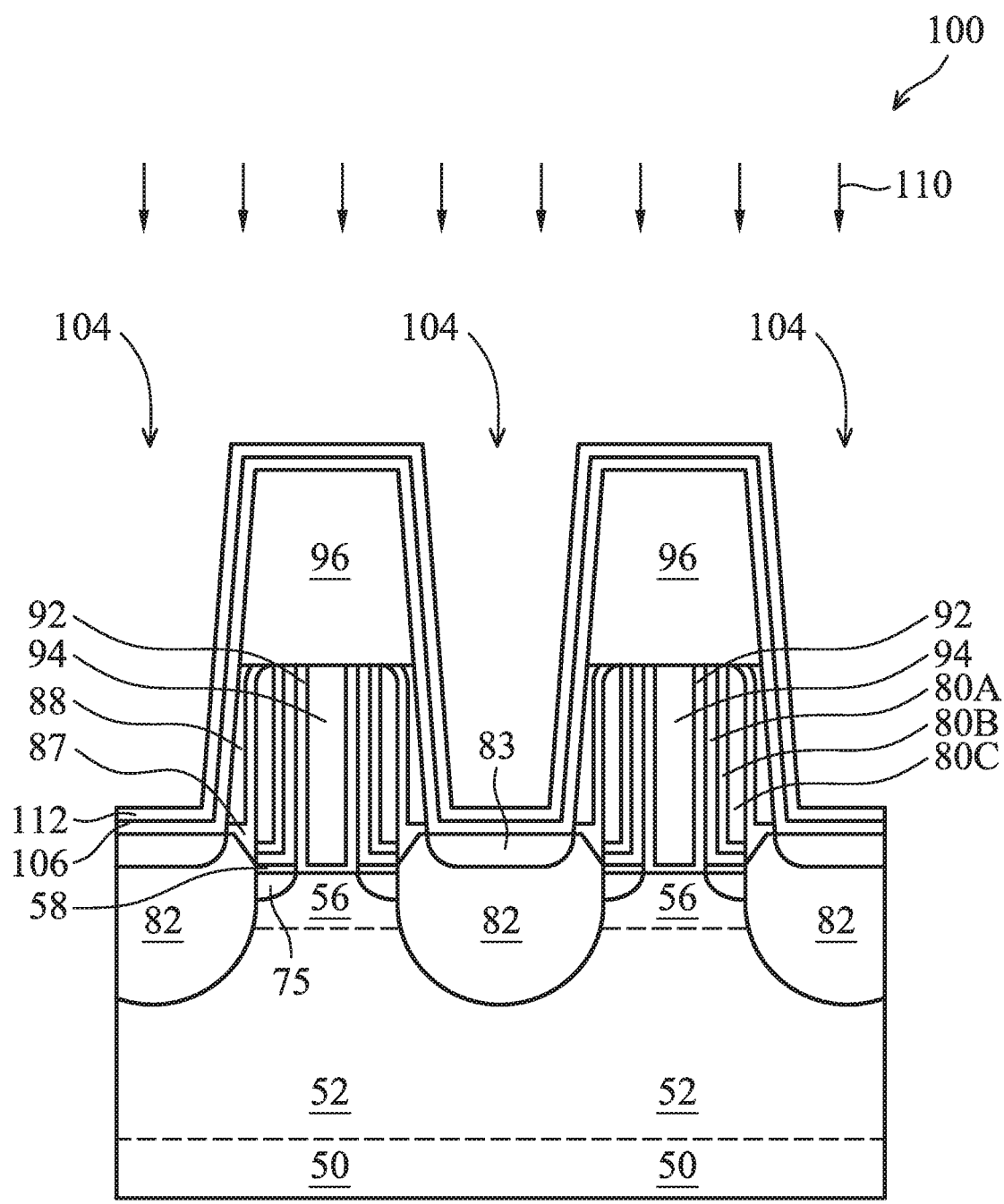
Figure 21C:
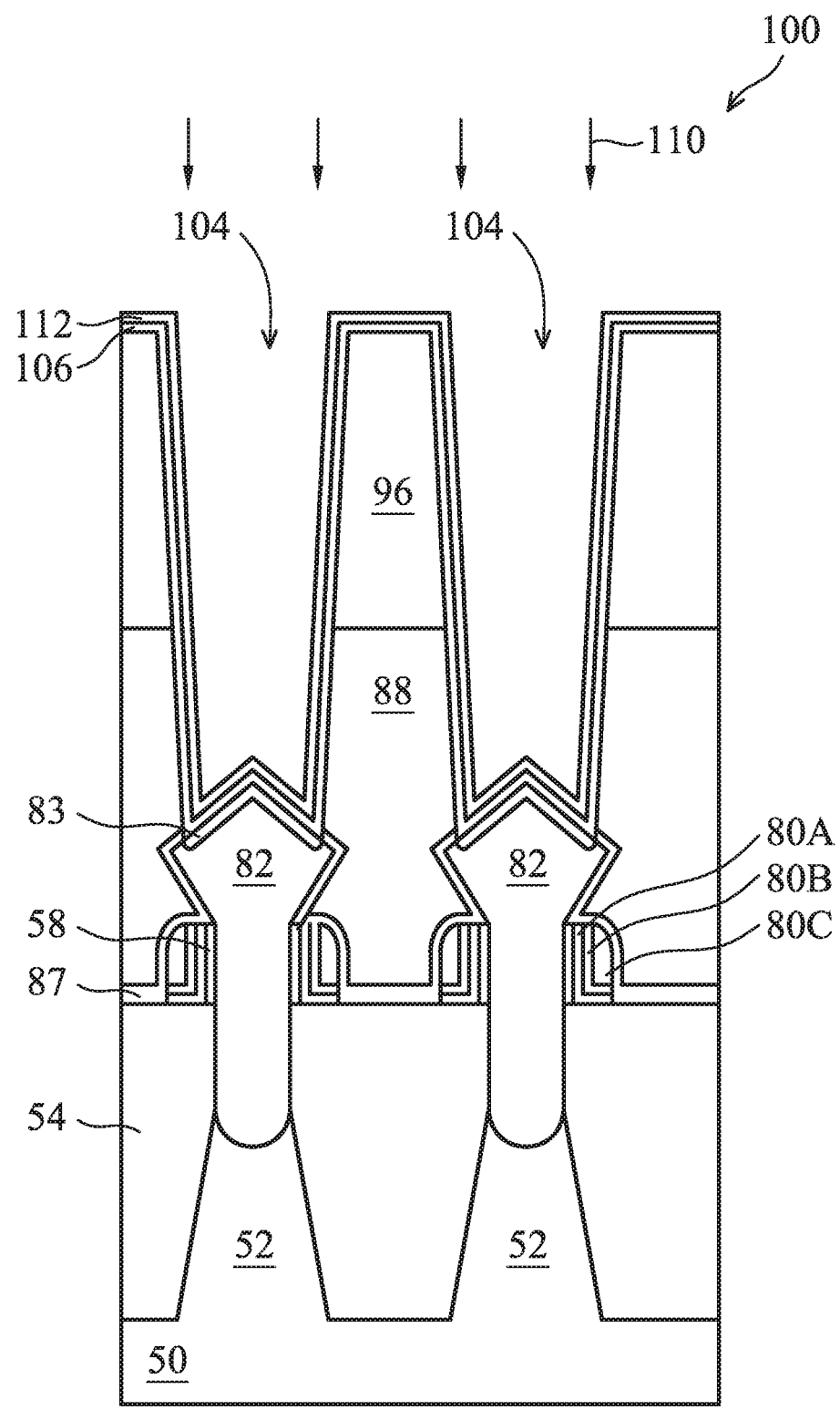

FIGS. 21A, 21B, and 21C illustrate a plasma treatment process no applied to the region 100. The plasma treatment process no may be performed in a processing chamber using a $N_2/H_2$ plasma treatment process, whereby nitrogen atoms are introduced to the metal nitride layer 108 to alter the metal nitride layer 108 to a nitrogen rich metal nitride layer 112, leaving free (unbonded) nitrogen atoms available for combination with subsequently deposited contact plug materials. A concentration of free nitrogen atoms may be greatest at the surface of the metal nitride layer 112 and may decrease deeper into the metal nitride layer 112. The plasma treatment process no may be performed using $N_2$ and $H_2$ as process gasses. Other process gasses may be used as appropriate. The $N_2/H_2$ plasma treatment process no may be performed at a temperature between about 250° C. and about 800° C., such as about 300° C., with a bias of 0 W for conformal treatment, and under a pressure between about 1 torr and about 100 torr, such as about 3 torr. Other process conditions are contemplated and may be used as appropriate. The plasma treatment process may also serve as a pre-clean for the subsequent formation of a contact plug by removing oxide that may have formed in previous processes.

In some embodiments, a silane ($SiH_4$) soak may be performed before and/or after one or more $N_2/H_2$ plasma treatments. The silane soak may enhance the effectiveness of the $N_2/H_2$ plasma treatments by also providing free silicon atoms at the surface of the nitrogen rich metal nitride layer 112, which may be used in the subsequent formation of an interlayer between a contact plug and the metal nitride layer 112. The silane soak may be performed in the same chamber as the plasma treatment process 110. In some embodiments, process gasses may include any silicon containing gas, such as silane ($SiH_4$), dichlorosilane (DCS), disilane (DS), trichlorosilane (TCS), combinations thereof, or the like. The silane soak may be performed at a temperature between about 250° C. and about 800° C., such as about 300° C., under a pressure between about 1 torr and about 100 torr, such as about 35 torr, at a flow rate between about 300 and 600 sccm, such as about 450 sccm, for about 60 sec to about 120 sec, such as about 100 sec. Other process conditions are contemplated and may be used as appropriate.

Figure 22A:
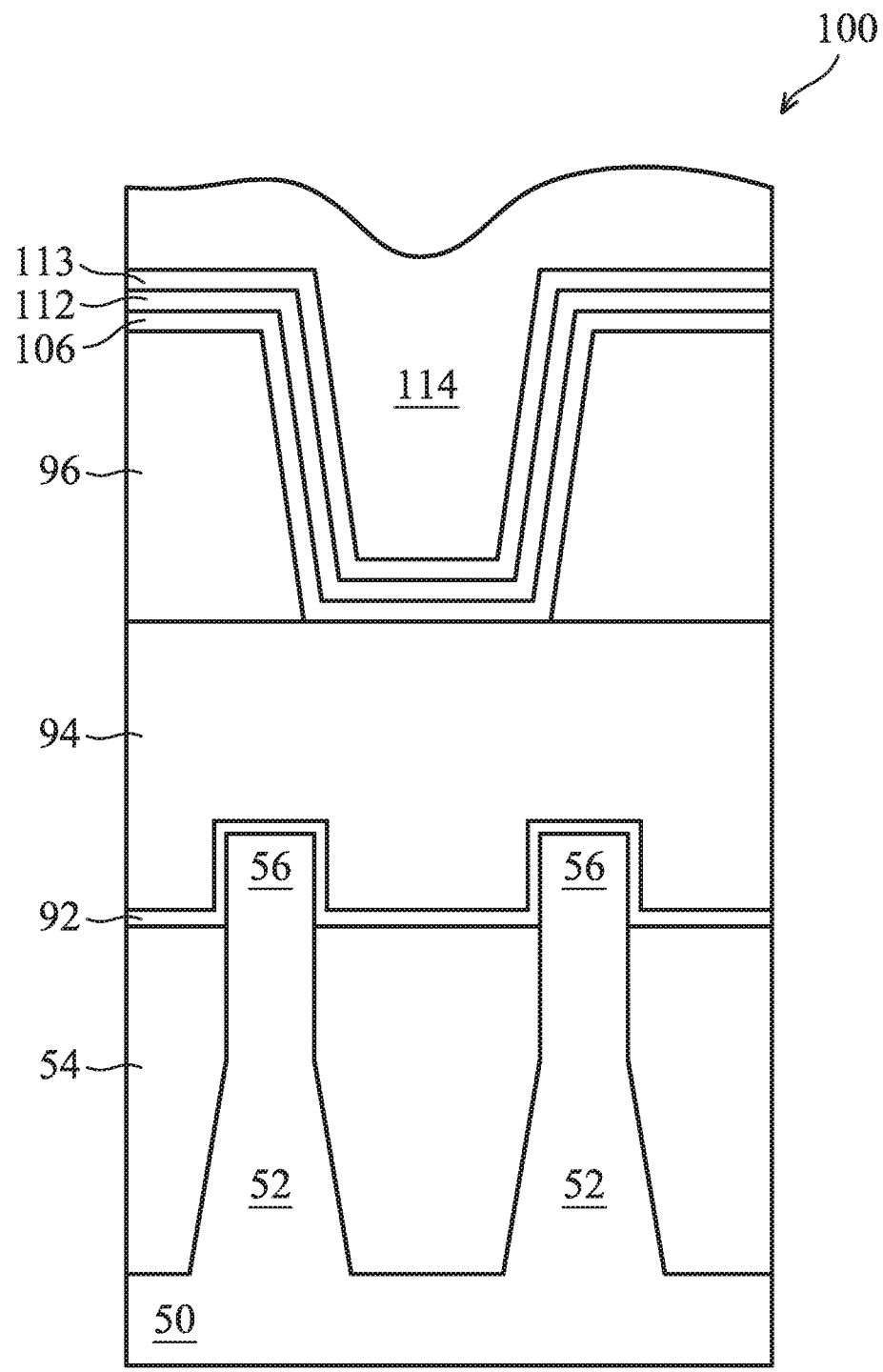
Figure 22B:
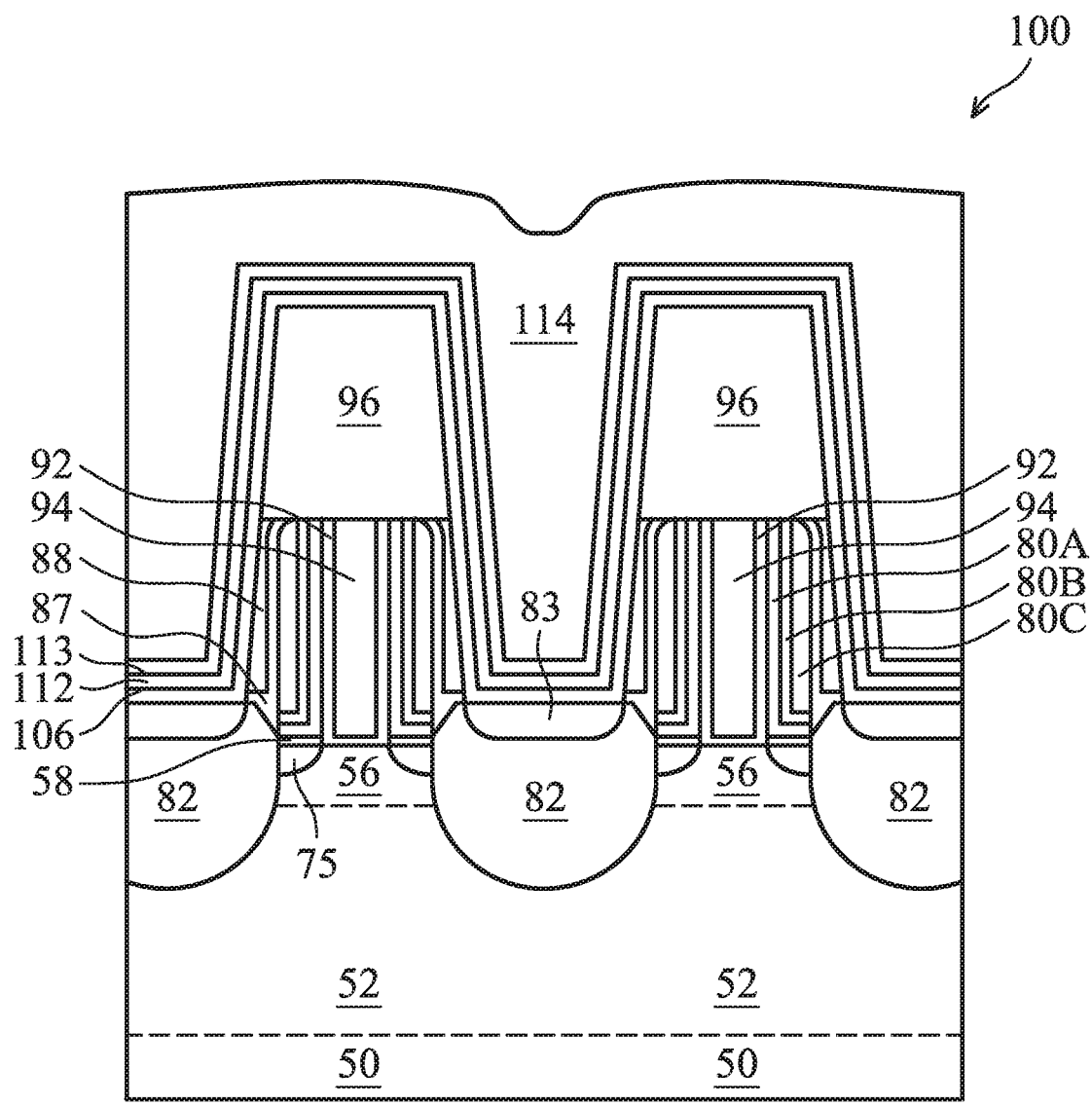
Figure 22C:
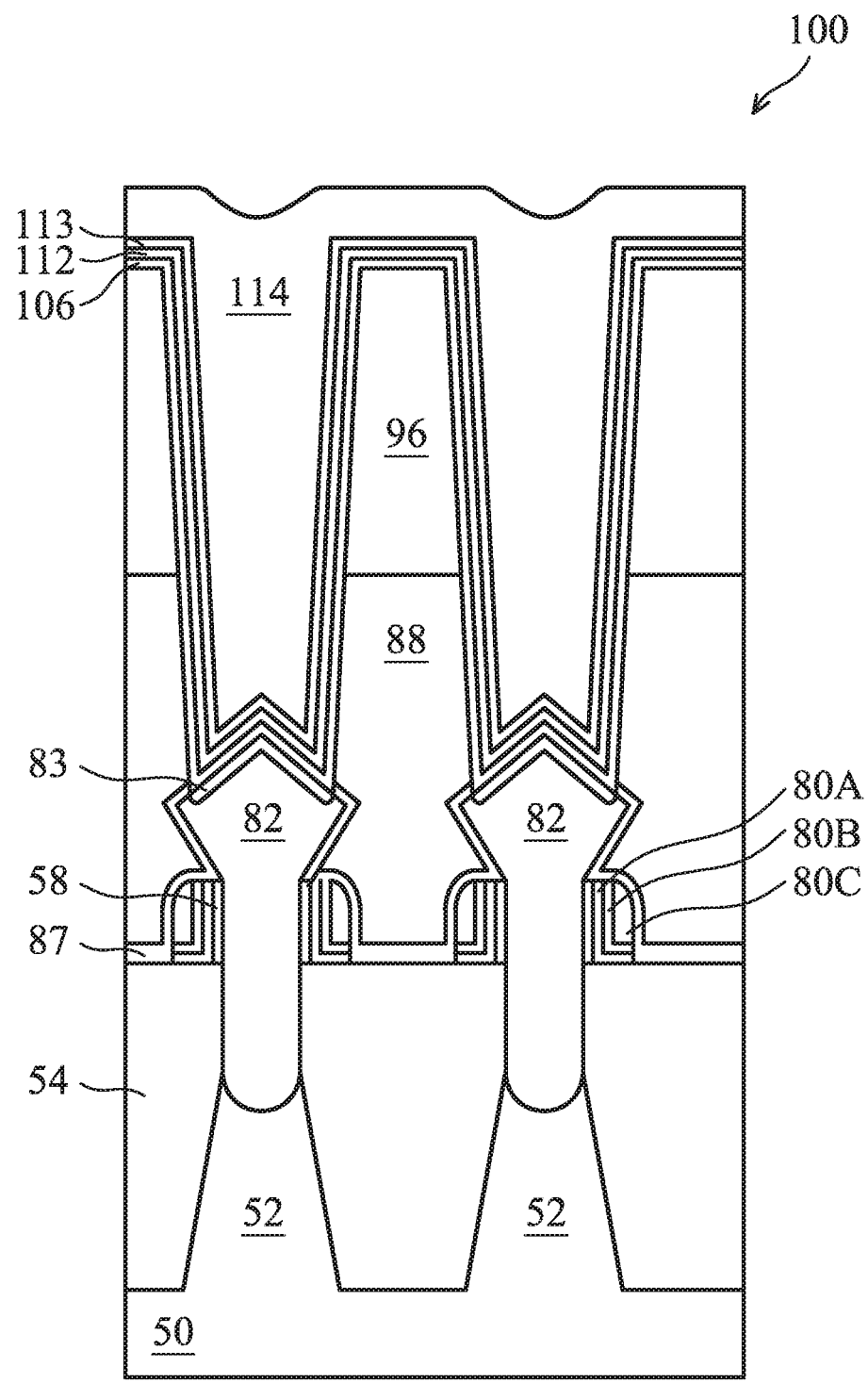

FIGS. 22A, 22B, and 22C illustrate the formation of contact plugs 114 in the contact openings 102 to the gate electrodes 94 and in the contact openings 104 to the source/drain regions 82, in accordance with some embodiments. The conductive material of the contact plugs 114 may comprise cobalt, copper, a copper alloy, silver, tungsten, aluminum, nickel, or the like. In some embodiments, the conductive material of the contact plugs 114 is cobalt. The contact plugs 114 may be formed in the contact openings 102 and 104 by any suitable technique, such as by PVD, ALD, CVD, plating and so forth. The contact plugs 114 may extend above the contact openings 102 and 104 and over upper surfaces of the insulating layer 96. In some embodiments, a separate pre-clean cycle may be performed prior to formation of the contact plugs 114, such as a separate $N_2/H_2$ plasma treatment which may further increase the free nitrogen atoms at the surface of the nitrogen rich metal nitride layer 112.

As the conductive material of the contact plugs 114 is formed within the contact openings 102 and 104, some of the free nitrogen available in the nitrogen rich metal nitride layer 112 will combine with the conductive material of the contact plugs 114 to form a thin film interlayer 113 (a monolayer) at the interface of the contact plugs 114 and the nitrogen rich metal nitride layer 112. In embodiments where silicon is available at the surface of the nitrogen rich metal nitride layer 112, the thin film interlayer 113 may include a compound which includes a metal, nitrogen, and silicon (M—N—Si) having covalent bonds, where the metal is the material of the contact plugs 114. Silicon may be available, for example, by diffusion from silicide 83 and/or source/drain regions 82 through the nitrogen rich metal nitride layer 112 and/or as a result from the silane soak described above (if performed). In some embodiments, where silicon is not available, such as when the underlying substrate is TiN and no silane soak is performed, the thin film interlayer 113 may include a compound of the metal of the contact plugs 114 and nitrogen ($M_xN$). Some of the nitrogen atoms and/or silicon atoms surrounding the contact plugs 114 may remain unbonded. Some embodiments may have both compounds including (M—N—Si) and compounds including ($M_xN$).

In some embodiments, the thin film interlayer 113 may be less than about 1 nm thick, such as between about 0.5 nm and about 1 nm thick, though the thin film interlayer may be thicker or thinner. Also, when the contact plugs 114 are formed using an epitaxial deposition process or other crystalline growth process, the thin film interlayer 113 will adopt a crystalline structure similar to the crystalline structure of the contact plugs 114, the thin film interlayer 113 having a first lattice constant. The conductive material of the contact plugs 114 will have a crystalline structure having a second lattice constant. However, the mismatch between the first lattice constant and second lattice constant is small (because they share the conductive material in common). Two materials have better adhesion when they have small lattice mismatch, i.e., less than about 2% or less than 1%. For example, where the material of contact plugs 114 is cobalt, the difference between the lattice constant of Co and $Co_xN$ is about 0.08%.

The resulting interface between the contact plugs 114 and nitrogen rich metal nitride layer 112 (by way of the thin film interlayer 113) provides a strong adhesion between layers, even when the nitrogen rich metal nitride layer 112 is non-crystalline. Thin film interlayer 113 may be formed, in part, from the underlying nitrogen rich metal nitride layer 112, where some of the metal of the contact plugs 114 is embedded within the underlying layer. Thin film interlayer 113 may also be formed, in part, from the nitrogen atoms available at or near the surface of the underlying nitrogen rich metal nitride layer 112 combining with the metal of the contact plugs 114 over the underlying layer. Thin film interlayer 113 may also be formed, in part, from the silicon atoms available at or near the surface of the underlying nitrogen rich metal nitride layer 112 or from the silicide 83 or source/drain region 82 combining with the metal of the contact plugs 114.

In cases of poor adhesion, after two films are subjected to a subsequent process which uses a thermal process, such as an anneal, the two films will show de-wetting (separation). The higher the de-wetting the poorer the adhesion. In embodiment processes, the adhesion de-wetting may be between about 0% and about 20%, such as about 1%. The crystal structure of M (and of the $M_xN$ or M—N—Si thin film interlayer 113) depends on the metal selected to form the contact plugs 114. Some metals may form a body-centered cubic (bcc) structure, while others will form an fcc structure or a hexagonal close packed (hcp) structure. The metal should be selected such that the nitride of the selected metal has the same crystalline structure (except for a small lattice mismatch as noted above).

Following formation of the contact plugs 114, some of the free nitrogen atoms are used to form the thin film interlayer 113, while some of the free nitrogen atoms may not have bonded with the material of the contact plugs 114 and may still surround the contact plugs 114, for example, in the nitrogen rich metal nitride layer 112.

In one embodiment, the metal layer 106 may be Ti, the metal nitride layer 108 may be TiN, and the conductive material of the contact plugs 114 may be Co. After plasma treatment of $N_2/H_2$, deposition of the Co forms a crystalline layer of $Co_xN$ and/or Co—N—Si between the Co contact plugs 114 and the TiN nitrogen rich metal nitride layer 112. The layer of $Co_xN$ and/or Co—N—Si may be less than 1 nm thick, such as between about 0.5 nm and about 1 nm thick, though other thicknesses may be used and are contemplated. Both the Co contact plug 114 deposition and $Co_xN$ layer and/or Co—N—Si layer are fcc oriented crystalline structures. And although there is a lattice mismatch due to inclusion of the N atoms and/or Si atoms of the $Co_xN$ structure and/or Co—N—Si structure, the similarity in the lattice structures provides improved adhesion than without the $N_2/H_2$ plasma treatment. The thin film interlayer 113 also has shown good thermal stability, providing for less potential issues which may be introduced in subsequent processing. For example, the thin film interlayer 113 has been shown to survive after a 30 minute anneal at 400° C.

FIGS. 23A, 23B, and 23C illustrate that a planarization process, such as a CMP, may be performed to remove excess materials from a top surface of the ILD 96, in accordance with some embodiments. The planarization process may also remove remaining portions of the nitrogen rich metal nitride layer 112 and metal layer 106. The remaining metal nitride layer 112 and conductive material form contacts 116 to the gate electrodes 94 contacts 118 to the source/drain regions 82.

Figure 24:
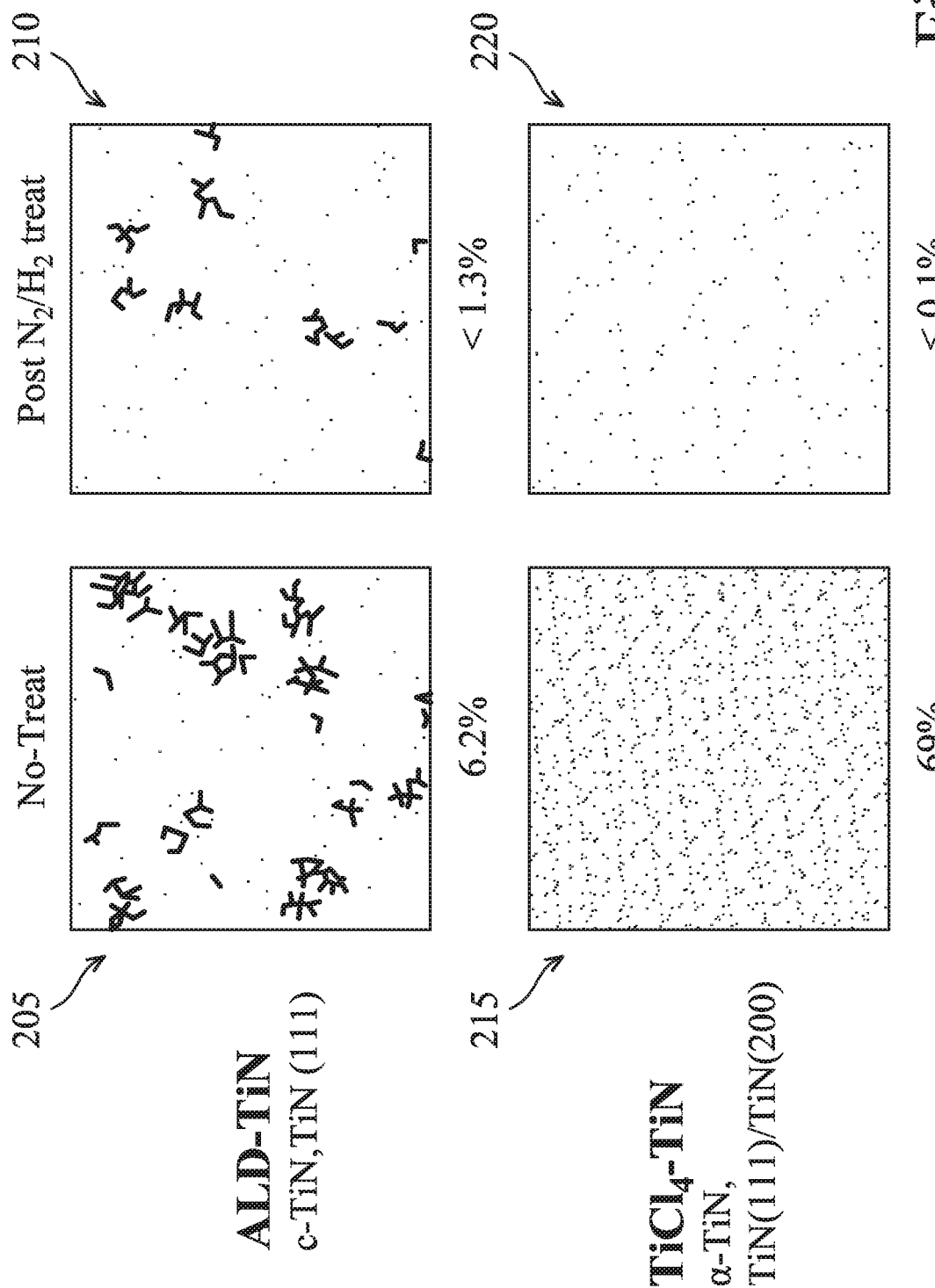
FIG. 24 illustrates wetting of some example materials which are treated in accordance with some embodiments.

FIG. 24 illustrates wetting of some example materials, comparing an adhesion layer which is not treated with an adhesion layer which is treated using embodiment processes. A film stack for this example includes a silicon substrate, thermal oxide layer of the silicon substrate (SiO), and a TiN layer at 50 Å. In examples where an $N_2/H_2$ plasma treatment was performed, the $N_2/H_2$ plasma treatment is performed on the TiN layer. Following the $N_2/H_2$ plasma treatment, a Co layer is deposited by CVD at 80 Å. An anneal is performed at 420° C. for 480 s in an $H_2$ ambient environment. Following this process, a de-wet test may be performed on each of the examples.

Element 205 is an illustration of an interface including an adhesion layer comprising an ALD formed TiN layer with a Miller index of (111) which is not treated using embodiment treatment processes. De-wetting is measured at 6.2%. In other words, about 6.2% of the interface is not wetted. Element 210 is an illustration of an interface including an adhesion layer comprising an ALD formed TiN layer with a Miller index of (111) which is treated using embodiment treatment processes. De-wetting is measured at 1.3%. In other words, about 1.3% of the interface is not wetted. Element 215 is an illustration of an interface including an adhesion layer comprising a CVD formed TiN layer (formed using $TiCl_4$ precursor for Ti source and an N-based precursor such as $NH_3$ for N source) with Miller indices of the TiN including (111) and (200) which is not treated using embodiment treatment processes. De-wetting is measured at 69%. In other words, about 69% of the interface is not wetted. Element 220 is an illustration of an interface including an adhesion layer comprising CVD formed TiN layer (formed using $TiCl_4$ precursor for Ti source and an N-based precursor such as $NH_3$ for N source) with Miller indices of the TiN including (111) and (200) which is treated using embodiment treatment processes. De-wetting is measured at less than 0.1%. In other words, less than about 0.1% of the interface is not wetted.

As illustrated by this example, where the adhesive layer is formed by an ALD process the $N_2/H_2$ plasma treatment process can improve de-wetting by about 4 times. Where the adhesive layer is formed by a CVD process the $N_2/H_2$ plasma treatment process can improve de-wetting by about 700 times, resulting in substantially full wetting (or substantially no de-wetting). Embodiment treatment processes may improve wetting by about 4 to 700 times.

FIGS. 25 through 32 illustrate the use of an $N_2/H_2$ plasma treatment process on other materials, in accordance with some embodiments. Rather than deposit a metal nitride layer in an opening formed within a dielectric material, such as metal nitride layer 108 of FIGS. 20A, 20B, and 20C, in some embodiments a treatment process may be applied directly to a layer, such as an insulating layer or substrate comprising TiN, SiO, SiN, or another suitable material.

Figure 25:
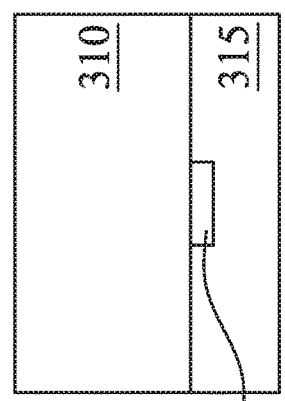

FIG. 25 illustrates a film layer 310 of a film stack 300, in accordance with some embodiments. Film layer 310 may comprise one or more layers of TiN, SiO, SiN, or another suitable material. A film layer 315 may be a substrate or dielectric material having a contact 320 formed therein. Contact 320 may be electrically coupled to a device. In some embodiments, film stack 300 may be part of an interconnect, such as a redistribution structure. In some embodiments, film stack 300 may be part of a structure having embedded devices formed therein.

Figure 26:
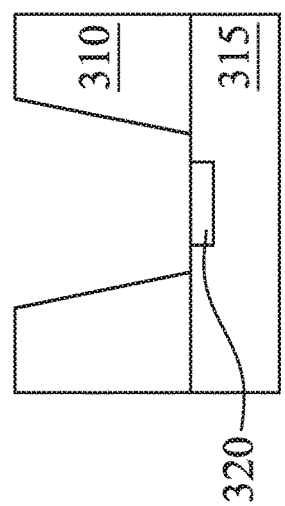

FIG. 26 illustrates the formation of an opening 325 in the film layer 310, the opening 325 exposing the contact 320. The opening 325 may be made by any suitable process, such as by a photolithographic technique.

Figure 27:
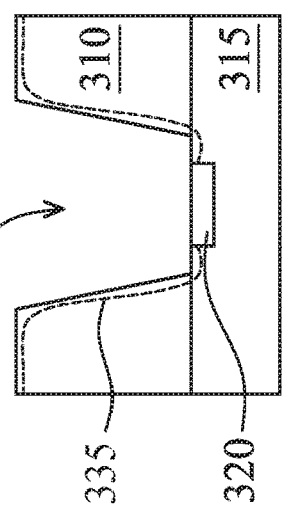

FIG. 27 illustrates the application of an $N_2/H_2$ plasma treatment process 330, in accordance with some embodiments. Plasma treatment process 330 may be performed using processes and materials similar to those discussed above with respect to plasma treatment process 110 of FIGS. 21A, 21B, and 21C, which is not repeated. The exposed portions of the film layer 310 are treated, resulting in a treatment area 335 where unbonded nitrogen atoms are incorporated into the material of film layer 310, resulting in a concentration of free nitrogen atoms in the treatment area 335. The concentration of nitrogen atoms may be greatest at a surface of the film layer 310 and may extend up to about 2 nm into the underlying material; the concentration of nitrogen atoms may have a uniform concentration gradient through the treatment area 335. An $N_2/H_2$ plasma treatment process using zero bias may provide uniform nitrogen distribution.

Figure 28:
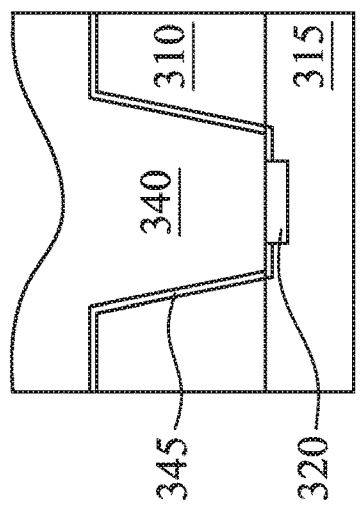
FIGS. 25 through 29 illustrate various intermediate stages of the formation of a metal on an insulating layer, in accordance with some embodiments.

FIG. 28 illustrates the deposition of a contact plug 340 in the opening 325. The contact plug 340 may be formed using materials and processes similar to those described above with respect to contact plugs 114 of FIGS. 22A, 22B, and 22C, which are not repeated.

As the conductive material of the contact plug 340 is formed within the opening 325, some of the unbonded nitrogen in the treatment area 335 may combine with the conductive material of the contact plug 340 to form a thin film interlayer 345 at the interface of the contact plug 340 and the treatment area 335. The thin film interlayer 345 may include a layer including a compound of $M_xN$ and/or a compound of M—N—Si where M is the conductive material of the contact plug 340. The resulting thin film interlayer 345 provides a strong adhesion to the contact plug 340 in a process similar to that described above with respect to FIGS. 22A, 22B, and 22C. Some of the nitrogen atoms surrounding the contact plug 340 may remain unbonded.

Figure 29:
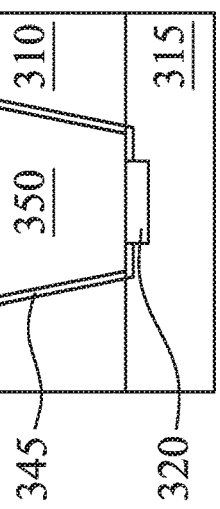

FIG. 29 illustrates the formation of contact 350 by planarizing contact plug 340, in accordance with some embodiments. A planarization process, such as a CMP process, may be used to planarize the top surface of the contact 350 with a top surface of the film layer 310.

FIG. 30 illustrates a film layer 410 of a film stack 400, in accordance with some embodiments. Film layer 410 may comprise one or more layers of TiN, SiO, SiN, or another suitable material. An $N_2/H_2$ plasma treatment process 420 may be performed. Plasma treatment process 420 may be performed using processes and materials similar to those discussed above with respect to plasma treatment process 110 of FIGS. 21A, 21B, and 21C, which is not repeated. Film layer 410 is treated, resulting in a treatment area 425 where unbonded nitrogen atoms are concentrated. Treatment area 425 may be similar to the treatment area of 335 of FIG. 27.

FIG. 31 illustrates the deposition of a metal layer 430 of the film stack over the treatment area 425. The metal layer 430 may be formed using materials and processes similar to those described above with respect to contact plugs 114 of FIGS. 22A, 22B, and 22C, which are not repeated.

As the conductive material of the metal layer 430 is formed, some of the unbonded nitrogen in the treatment area 425 may combine with the conductive material of the metal layer 43 to form a thin film interlayer 435 at the interface of the metal layer 430 and the treatment area 425. The thin film interlayer 435 may include a layer including a compound of $M_xN$ and/or a compound of M—N—Si where M is the conductive material of the metal layer 430. The resulting thin film 435 provides a strong adhesion with the metal layer 430 in a process similar to that described above with respect to FIGS. 22A, 22B, and 22C. Some of the nitrogen atoms below the metal layer 430 may remain unbonded.

FIG. 32 illustrates the planarizing of the metal layer 430 to form a metal layer 440 with a planar top surface, in accordance with some embodiments. A planarization process, such as a CMP process, may be used to planarize the top surface of the metal layer 430. The top surface of the metal layer 440 may be co-planar with surrounding structures (not shown) following the planarization process.

Figure 33:
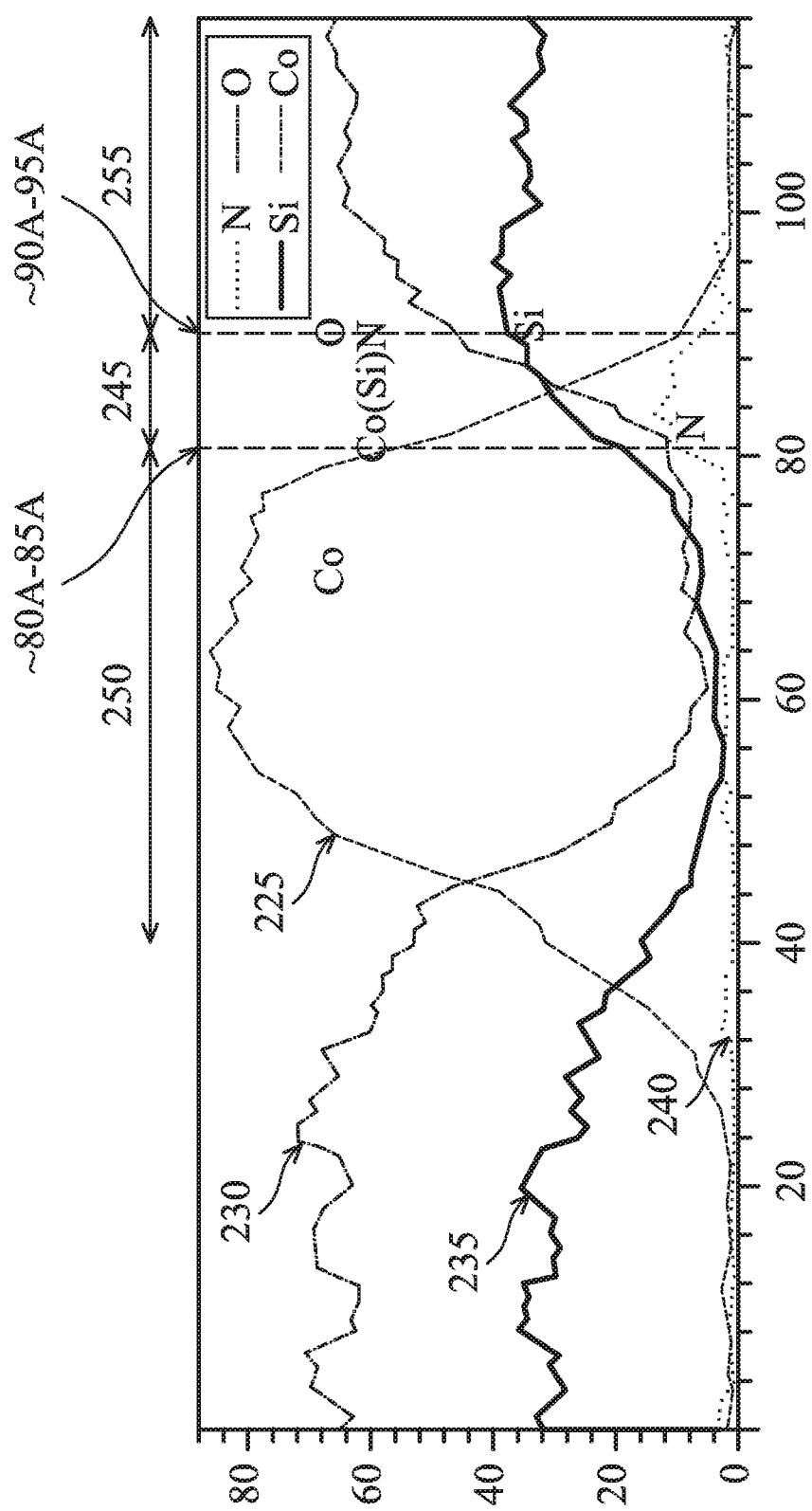
FIG. 33 includes a graph of material properties of a contact, in accordance with some embodiments.

FIG. 33 includes a graph of material properties of a contact, in accordance with some embodiments. The concentration of various materials is provided at various depths of a contact using a Co contact in a SiO substrate, in one example embodiment. An interlayer including $Co_xN$ and/or Co—N—Si is formed between the substrate and the Co contact as a result of an $N_2/H_2$ plasma treatment process. Line 225 represents a concentration of Co at various depths in angstroms. Line 230 represents a concentration of oxygen at various depths in angstroms. Line 235 represents a concentration of silicon at various depths in angstroms. Line 240 represents a concentration of nitrogen at various depths in angstroms. A band 245 is highlighted by dashed lines which represents the approximate depth of the interlayer. A band 250 represents the approximate depth of the Co contact. A band 255 represents the underlying SiO substrate. As illustrated in FIG. 33, the concentration of Co in the interlayer decreases through the interlayer from the Co contact to the underlying SiO substrate. In some cases Si will also be present, forming Co(Si)N materials. The depth of the interlayer may vary depending on the thickness of the metal of the contact. For a Co contact, the interlayer may be less than 1 nm thick, such as between about 0.5 nm and about 1 nm. Other dimensions are contemplated and may be used.

In another example, the substrate may be TiN. De-wetting of a Co contact may be between about 40% and 50% at the edge of the contact and substantially 0% at the center of the contact. Following a silane soak and an $N_2/H_2$ plasma treatment, de-wetting of a Co contact may be substantially 0% at the edge of the contact and at the center of the contact. In another example, the substrate may be SiO. De-wetting of a Co contact may be substantially 0% at the edge of the contact and substantially 0% at the center of the contact. In another example, the substrate may be SiN. De-wetting of a Co contact may be substantially 0% at the edge of the contact and substantially 0% at the center of the contact. One of skill in the art will understand that these are merely examples and are not limiting to all embodiments. It can be observed, however, that embodiment processes provide improved wetting of contacts, as disclosed herein.

Embodiments provide improved wetting of contacts formed in a substrate. Rather than de-wetting occurring between a contact, such as a contact plug, and the substrate in which it is formed, embodiment processes may provide improved wetting of the contact such that the contact is substantially fully wetted. In some embodiments, the contact may be wetted 4 to 700 times more thoroughly than without embodiment processes, resulting in better adhesion. Embodiments use an $N_2/H_2$ plasma treatment to insert an excess of N atoms at a surface of the layer underlying a contact. When a contact is subsequently formed, a crosslink layer is formed between the contact material and the material underlying the contact due to the similar crystallinity between the contact material and a nitride of the contact material.

One embodiment is a method including forming an opening in an insulating layer of a structure. An adhesion layer is deposited in the opening. Nitrogen atoms are incorporated into the adhesion layer. Metal is deposited into the opening, the metal forming an interlayer interposed between a metal plug and the adhesion layer, the interlayer comprising a compound of the metal and nitrogen.

Another embodiment is a method including forming an opening in an insulating layer, the opening having sidewalls and a bottom. The sidewalls and the bottom of the opening are treated with a nitrogen-based plasma process, the nitrogen-based plasma process incorporating free nitrogen atoms into the sidewalls and the bottom of the opening. A metal plug is formed in the opening, the metal plug including a metal, the metal combining with the free nitrogen atoms to form an interlayer between the metal plug and the sidewalls and the bottom of the opening.

Another embodiment is a device including a target region and an insulating layer over the target region. A metal plug is disposed within the insulating layer, the metal plug extending from a top of the insulating layer to the target region, the metal plug including a first material. An interlayer is disposed between the metal plug and the insulating layer, the interlayer including a compound of the first material and nitrogen, where free nitrogen atoms surround the interlayer.

Another embodiment is a device including an insulating layer. The device also includes a metal plug structure disposed in the insulating layer, the metal plug structure coupled to a contact, the metal plug structure including: a metal plug including a first metal, an interlayer surrounding the metal plug, the interlayer including a compound of the first metal and nitrogen, and an adhesion layer surrounding the interlayer.

Another embodiment is a device including an insulating layer disposed over a contact of a transistor. The device also includes a metal plug disposed in the insulating layer, the metal plug electrically coupled to the contact, the metal plug including a first metal. The device also includes an adhesion layer surrounding the metal plug. The device also includes an interlayer interposed between the adhesion layer and the metal plug, the interlayer including a compound of the first metal and nitrogen.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A device comprising:
a target region;
an insulating layer over the target region;
a metal plug disposed within the insulating layer, the metal plug extending from a top of the insulating layer to the target region, the metal plug comprising a first material; and
an interlayer disposed between the metal plug and the insulating layer, the interlayer comprising a compound of the first material and nitrogen, wherein free nitrogen atoms surround the interlayer, the interlayer comprising a first crystalline structure having a first lattice constant, the metal plug comprising a second crystalline structure having a second lattice constant different from the first lattice constant, and wherein both the first crystalline structure and second crystalline structures are face-centered cubic lattices.

2. The device of claim 1, wherein the first material comprises Co.

3. The device of claim 1, wherein the insulating layer comprises SiO or SiN, and wherein the compound of the interlayer includes silicon.

4. The device of claim 1, further comprising an adhesion layer interposed between the interlayer and the insulating layer, wherein the adhesion layer comprises a metal nitride, and wherein the free nitrogen atoms are in the metal nitride.

5. The device of claim 4, further comprising:
a source/drain region of a fin field effect transistor, wherein the target region comprises the source/drain region; and
a metal layer interposed between the adhesion layer and the insulating layer, the metal layer comprising a metal material of the metal nitride of the adhesion layer.

6. The device of claim 1, wherein the free nitrogen atoms are disposed in the insulating layer.

7. A device comprising:
an insulating layer; and
a metal plug structure disposed in the insulating layer, the metal plug structure coupled to a contact, the metal plug structure comprising:
a metal plug comprising a first metal,
an interlayer surrounding the metal plug, the interlayer comprising a compound of the first metal and nitrogen, the interlayer comprising a first crystalline structure, the metal plug comprising a second crystalline structure, wherein the first crystalline structure and second crystalline structure have a lattice mismatch and the lattice mismatch is less than 2%, and
free nitrogen atoms surrounding the interlayer.

8. The device of claim 7, further comprising an adhesion layer surrounding the interlayer, the adhesion layer comprising non-crystalline TiN, the free nitrogen atoms disposed in the adhesion layer.

9. The device of claim 8, further comprising a silicide interposed between the adhesion layer and the contact.

10. The device of claim 8, wherein the adhesion layer is a nitride of the first metal of the metal plug.

11. The device of claim 7, wherein the first metal of the metal plug is Co.

12. The device of claim 7, wherein the free nitrogen atoms are disposed in the insulating layer.

13. The device of claim 7, wherein the contact is a source/drain contact or gate contact of a transistor.

14. A device comprising:
an insulating layer disposed over a contact of a transistor;
a metal plug disposed in the insulating layer, the metal plug electrically coupled to the contact, the metal plug comprising a first metal; and
an interlayer surrounding the metal plug, the interlayer comprising a compound of the first metal and nitrogen, the interlayer surrounded by free nitrogen atoms, the interlayer comprising a first crystalline structure, the metal plug comprising a second crystalline structure with the same crystalline orientation as the first crystalline structure, the first and second crystalline structures having different lattice constants.

15. The device of claim 14, wherein the contact is an epitaxial source/drain of the transistor, the epitaxial source/drain comprising a silicide region.

16. The device of claim 14, wherein the insulating layer comprises SiO or SiN.

17. The device of claim 14, wherein the free nitrogen atoms are disposed in the insulating layer.

18. The device of claim 14, wherein the first metal is Co.

19. The device of claim 14, further comprising an adhesion layer interposed between the interlayer and the insulating layer, the adhesion layer comprising a metal nitride and the free nitrogen atoms.

20. The device of claim 14, wherein the interlayer further comprises a compound of the first metal, nitrogen, and silicon.

* * * * *